(12) United States Patent
Cowdery-Corvan et al.

(10) Patent No.: US 8,207,063 B2
(45) Date of Patent: *Jun. 26, 2012

(54) PROCESS FOR ATOMIC LAYER DEPOSITION

(75) Inventors: Peter J. Cowdery-Corvan, Webster, NY (US); David H. Levy, Rochester, NY (US); Shelby F. Nelson, Pittsford, NY (US); Diane C. Freeman, Pittsford, NY (US); Thomas D. Pawlik, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 870 days.

This patent is subject to a terminal disclaimer.

(21) Appl. No.: 11/627,525

(22) Filed: Jan. 26, 2007

(65) Prior Publication Data

US 2008/0182358 A1    Jul. 31, 2008

(51) Int. Cl.
 *H01L 21/20* (2006.01)
(52) U.S. Cl. ........ 438/680; 438/149; 438/150; 438/151; 438/152; 438/153; 438/154; 438/765
(58) Field of Classification Search .................. 438/765, 438/680, 149–154, 104
See application file for complete search history.

(56) References Cited

U.S. PATENT DOCUMENTS

| | | | |
|---|---|---|---|
| 4,413,022 A | 11/1983 | Suntola et al. | |
| 6,821,563 B2 | 11/2004 | Yudovsky | |
| 7,413,982 B2* | 8/2008 | Levy | 438/680 |
| 2004/0201027 A1 | 10/2004 | Ghosh | |
| 2005/0084610 A1 | 4/2005 | Selitser | |
| 2006/0244107 A1 | 11/2006 | Sugihara et al. | |
| 2007/0224348 A1* | 9/2007 | Dickey et al. | 427/248.1 |
| 2008/0166884 A1* | 7/2008 | Nelson et al. | 438/765 |
| 2009/0232983 A1* | 9/2009 | Ammerlaan et al. | 427/248.1 |

FOREIGN PATENT DOCUMENTS

| | | |
|---|---|---|
| EP | 1 313 134 | 5/2003 |
| WO | 2007/126582 | 11/2007 |
| WO | 2007/126585 | 11/2007 |

OTHER PUBLICATIONS

Chongmu Lee, et al., "dependence of the electrical properties of the ZnO thin films grown by atomic layer epitaxy on the reactant feed sequence," J. Vac. Sci. Technol. A 24(4), Jul./Aug. 2006, pp. 1031-1035.

Chongmu Lee, et al., Dependence of the electrical properties of the ZnO thin films grown by atomic layer epitaxy on the reactant feed sequence, Journal of Vacuum Science and Technology, Part A, Jun. 12, 2006, pp. 1031-1035.

* cited by examiner

*Primary Examiner* — Anh D. Mai
*Assistant Examiner* — Suberr Chi
(74) *Attorney, Agent, or Firm* — J. Lanny Tucker

(57) ABSTRACT

The present invention relates to a process of making a zinc-oxide-based thin film semiconductor, for use in a transistor, comprising thin film deposition onto a substrate comprising providing a plurality of gaseous materials comprising at least first, second, and third gaseous materials, wherein the first gaseous material is a zinc-containing volatile material and the second gaseous material is reactive therewith such that when one of the first or second gaseous materials are on the surface of the substrate the other of the first or second gaseous materials will react to deposit a layer of material on the substrate and wherein the third gaseous material is inert with respect to reacting with the first or second gaseous materials.

22 Claims, 27 Drawing Sheets

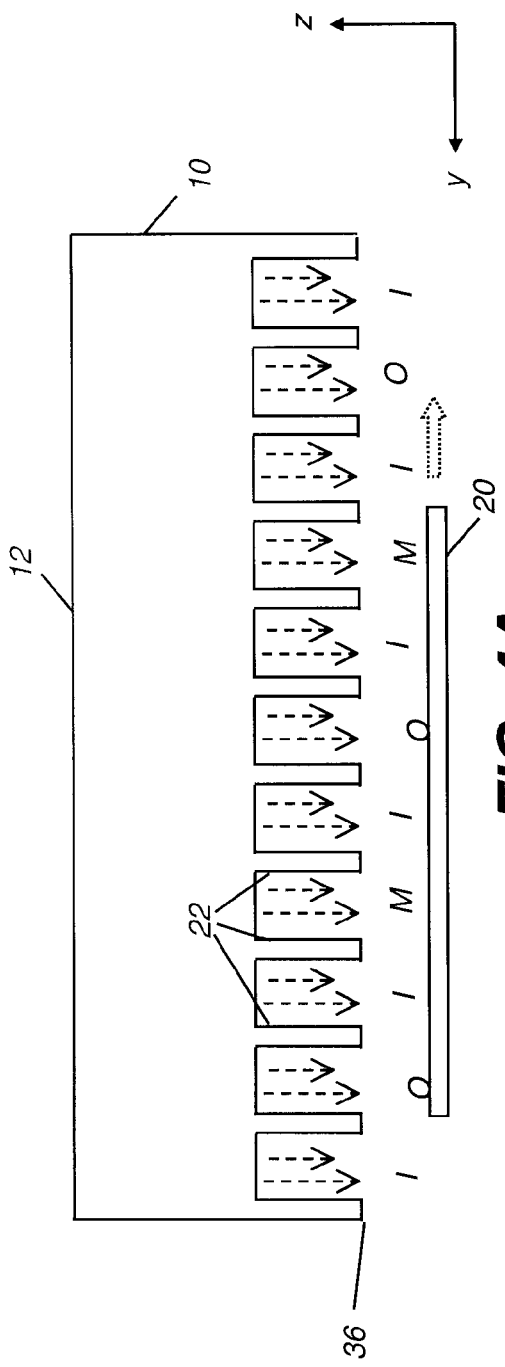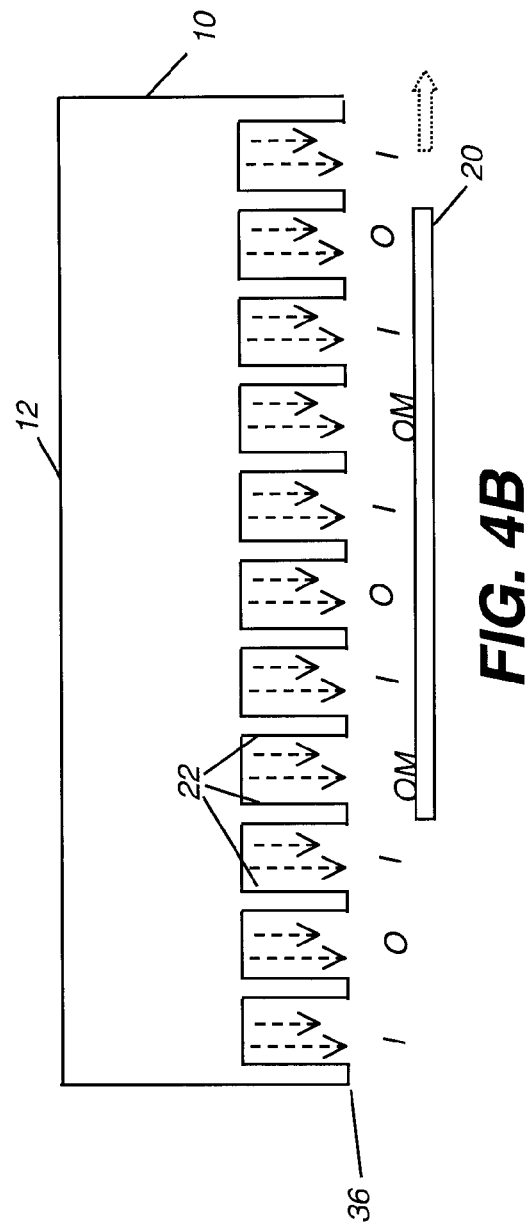

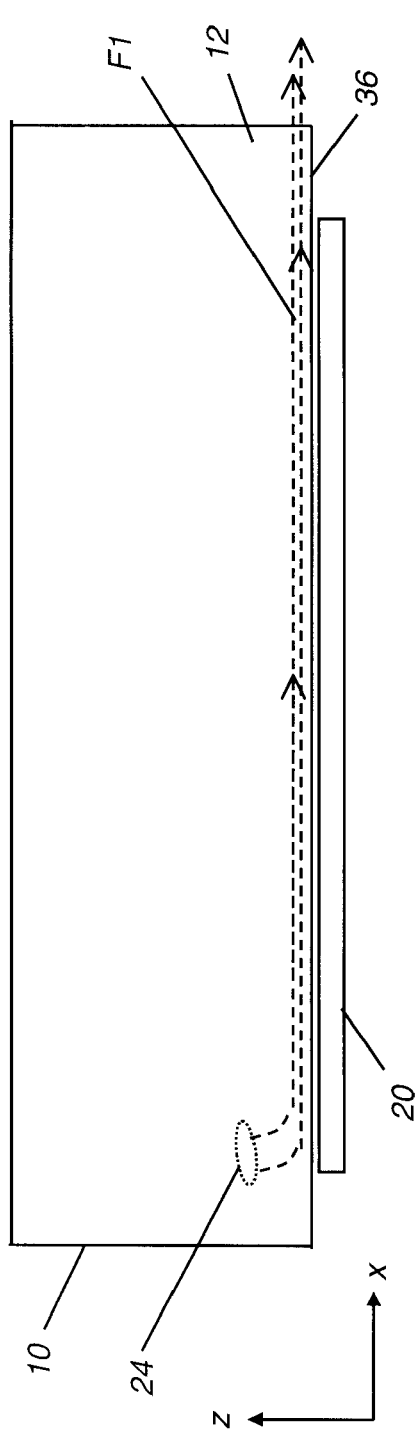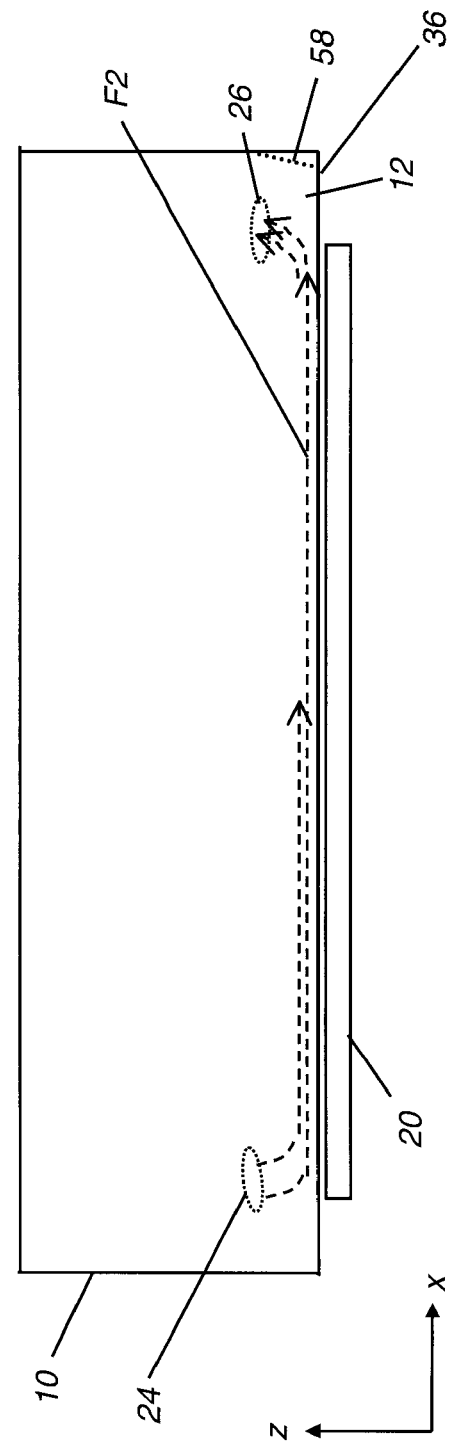

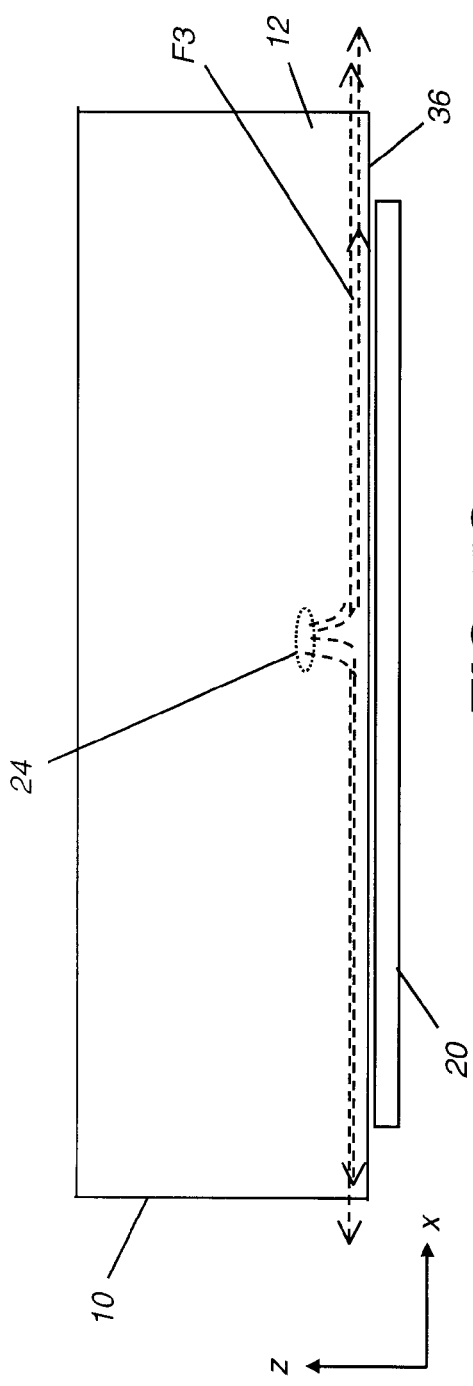
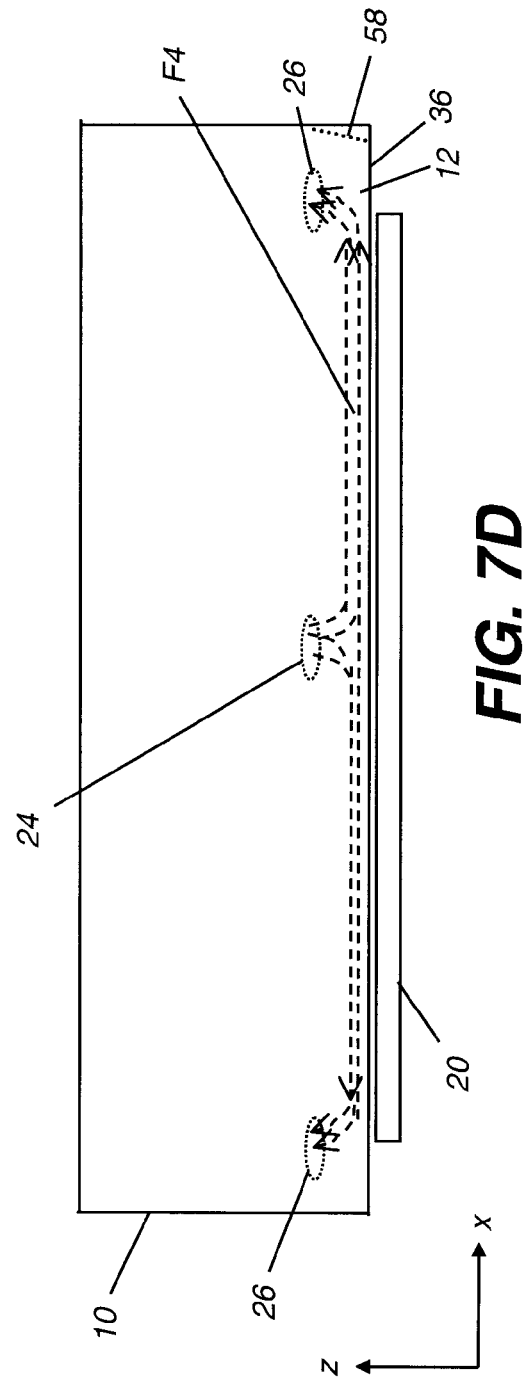

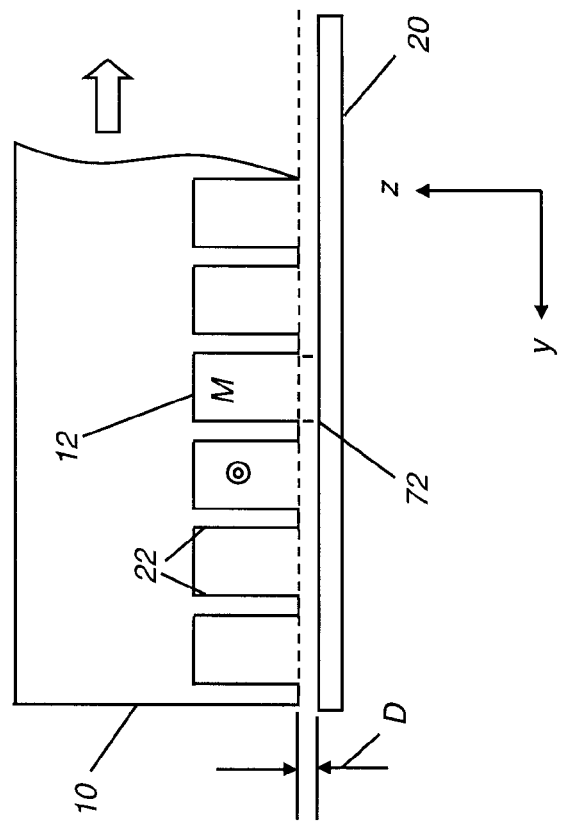
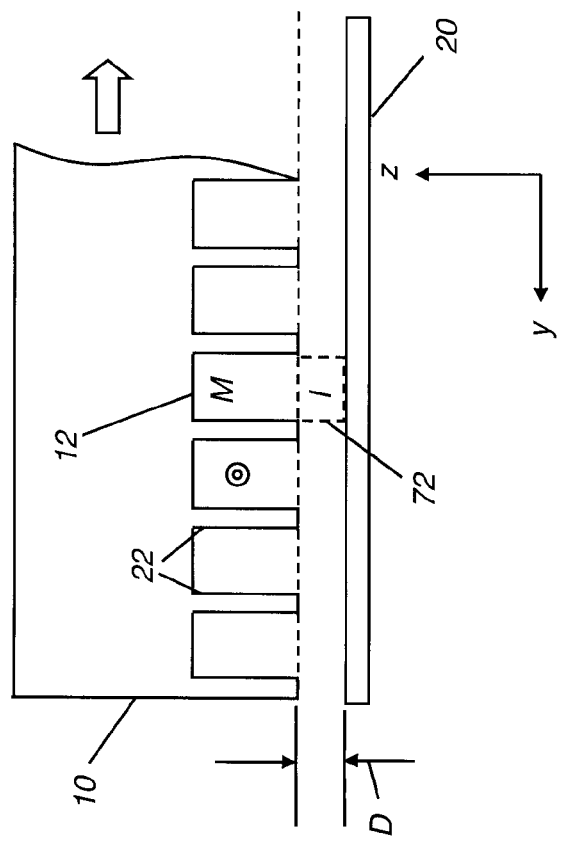

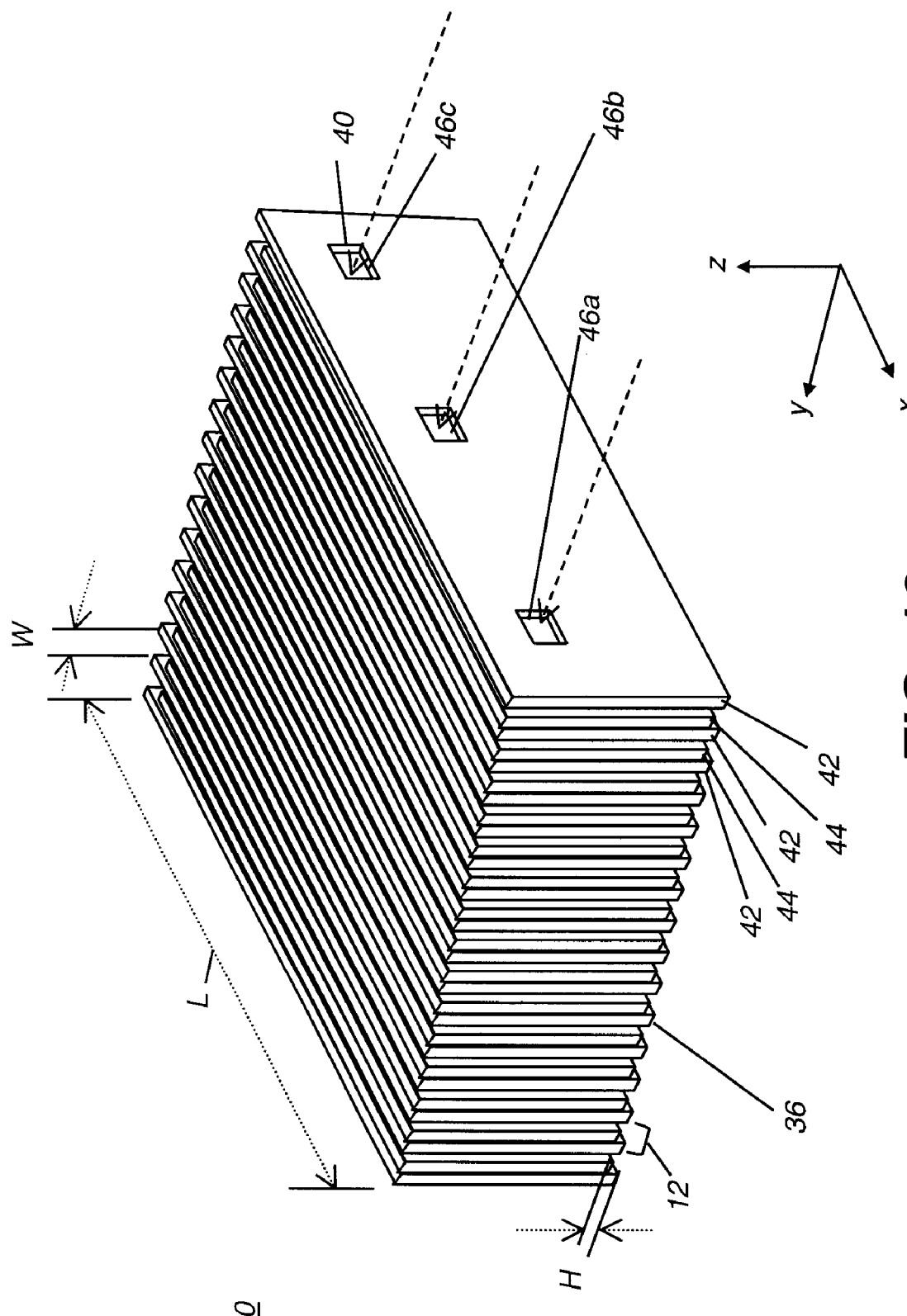

PROCESS FOR ATOMIC LAYER DEPOSITION

FIELD OF THE INVENTION

This invention generally relates to the deposition of thin-film materials and, more particularly, to a process for atomic layer deposition onto a substrate using a deposition device. In particular, the present invention relates to a process of making a film of a zinc-oxide-based semiconductor material for thin film transistors, which can be used in electronic devices, particularly in displays, the making of which at low temperature and near atmospheric pressure is advantageous.

BACKGROUND OF THE INVENTION

Thin film transistors (TFTs) are widely used as switching elements in electronics, for example, in active-matrix liquid-crystal displays, smart cards, and a variety of other electronic devices and components thereof. The thin film transistor (TFT) is an example of a field effect transistor (FET). The best-known example of an FET is the MOSFET (Metal-Oxide-Semiconductor-FET), today's conventional switching element for high-speed applications. For applications in which a transistor needs to be applied to a substrate, a thin film transistor is typically used. A critical step in fabricating the thin film transistor involves the deposition of a semiconductor onto the substrate. Presently, most thin film devices are made using vacuum deposited amorphous silicon as the semiconductor.

Amorphous silicon as a semiconductor for use in TFTs still has its drawbacks. The deposition of amorphous silicon, during the manufacture of transistors, requires relatively difficult or complicated processes such as plasma enhanced chemical vapor deposition and high temperatures (typically about 360° C.) to achieve the electrical characteristics sufficient for display applications. Such high processing temperatures disallow deposition on substrates made of certain plastics that might otherwise be desirable for use in applications such as flexible displays.

There is a growing interest in depositing thin film semiconductors on plastic or flexible substrates, particularly because these supports would be more mechanically robust, lighter weight, and potentially lead to cheaper manufacturing by allowing roll-to-roll processing. A useful example of a flexible substrate is polyethylene terephthalate. Such plastics, however, limit device processing to below 200° C.

There is also interest in utilizing processes for deposition that do not involve the expense associated with vacuum processing. In typical vacuum processing, a large metal chamber and sophisticated vacuum pumping systems are required in order to provide the necessary environment. These items increase the capital cost of systems and preclude the easy use of continuous web bases systems.

In the past decade, various materials have received attention as a potential alternative to amorphous silicon for use in semiconductor channels of thin film transistors. Semiconductor materials are desirable that are simpler to process, especially those that are capable of being applied to large areas by relatively simple processes. Semiconductor materials that can be deposited at lower temperatures would open up a wider range of substrate materials, including plastics, for flexible electronic devices.

Thus, thin film transistors made of easily deposited semiconductor materials can be viewed as a potential key technology for circuitry in various electronic devices or components such as display backplanes, portable computers, pagers, memory elements in transaction cards, and identification tags, where ease of fabrication, mechanical flexibility, and/or moderate operating temperatures are important considerations.

The discovery of practical inorganic semiconductors as a replacement for current silicon-based technologies has also been the subject of considerable research efforts. For example, metal oxide semiconductors are known that constitute zinc oxide, indium oxide, gallium indium zinc oxide, tin oxide, or cadmium oxide deposited with or without additional doping elements including metals such as aluminum. Such semiconductor materials, which are transparent, can have an additional advantage for certain applications, as discussed below.

A semiconductor material useful in a TFT must display several characteristics. In typical applications of a thin film transistor, the desire is for a switch that can control the flow of current through the device. As such, it is desired that when the switch is turned on a high current can flow through the device. The extent of current flow is related to the semiconductor charge carrier mobility. When the device is turned off, it is desired that the current flow be very small. This is related to the native charge carrier concentration. Furthermore, it is desired that the device be weakly or not at all influenced by visible light to avoid a light-protection layer. In order for this to be true, the semiconductor band gap must be sufficiently large (>3 eV) so that exposure to visible light does not cause an inter-band transition. Zinc oxide based materials are capable of delivering these features. Furthermore, in a real high volume web based atmospheric manufacturing scheme, it is highly desirable that the chemistries used in the process be both cheap and of low toxicity, which can be satisfied also by the use of ZnO-based materials and the majority of its precursors.

The semiconductor films made according to the present method exhibit a field effect electron mobility that is greater than $0.01$ $cm^2/Vs$, preferably at least $0.1$ $cm^2/Vs$, more preferably greater than $1.0$ $cm^2/Vs$. In addition, n-channel semiconductor films made according to the present invention are capable of providing on/off ratios of at least $10^4$, advantageously at least $10^6$. The on/off ratio is measured by the ratio of the on current, defined as the drain current at a gate voltage of 10 V in excess of the threshold voltage, to the off current, defined as the drain current at a gate voltage for which the transistor is in an off state.

High on/off ratios result when the device in its off state has very low current flow, often referred to as current leakage. There are many applications in which low leakage is essential. In display applications, low leakage is required for the pixel select transistor. This select transistor is a switch that allows a charge to enter in and be stored in the pixel. In a perfect transistor without leakage, once the charge is stored in the pixel the transistor is switched to its off state and this charge cannot diminish by leakage through the select transistor. Too high of an off current in a transistor will cause a decay in stored charge in the pixel which results in poor display performance.

Another transistor characteristic that is relevant for useful operation is the steepness of the transistor turn on, represented by the subthreshold slope. As the gate voltage of a transistor is varied, the transistor will start in an off state, characterized by low current flow, and transition to an on state, characterized by high current flow. When the gate voltage reaches a point at which the transistor begins to turn on, there is a substantial increase in drain current with increasing gate voltage. This increase, called the subthreshold slope, is measured in volts of gate voltage per decade of drain current.

This expression therefore represents the number of volts of gate voltage required to produce a 10 fold increase in drain current. Lower values of the subthreshold slope indicate faster device turn or and are desirable.

Various processes for making zinc oxide films have been disclosed, both high temperature and low temperature processes, including radio frequency magnetron sputtering or modified reactive planar magnetron sputtering.

Ohya et al (Japanese Journal of Applied Physics, Part 1, January 2001, vol. 40, no. 1, pages 297-8) disclose a thin film transistor of ZnO fabricated by chemical solution deposition.

Transparent conducting oxides are reviewed in the August 2000 issue of the Materials Research Bulletin, Volume 25 (8) 2000, devoted to materials and properties of transparent conducting oxide compounds.

One low temperature process for deposition of such oxide semiconductors are disclosed in US 2004/0127038 A1 to Carcia et al. This patent discloses a semiconductor deposition process that uses magnetron sputtering of a metal oxide (ZnO, $In_2O_3$, $SnO_2$, CdO) or metal (Zn, In, Sn, Cd) target in an atmosphere with a controlled partial pressure of oxygen in an inert gas. This is a low temperature process that is compatible with temperature sensitive substrates and components, for example, drive circuits for displays on flexible, polymer substrates. The field effect transistors of Carcia et al. are based on a nominally undoped metal oxide semiconductor that must be deposited using physical vapor deposition or chemical vapor deposition, preferably rf (radio frequency) magnetron sputtering.

Japanese Kokai JP2004349583 A1 discloses a method of producing a thin film transistor in which a dispersion of zinc-oxide nanoparticles is ink-jetted to form the semiconducting channel. No actual examples, however, are described relating to the preparation of the dispersion.

US 2004/0127038 discloses a method to produce high quality zinc-oxide thin film transistors using sputtering as a vacuum deposition method.

Steven K. Volkman et al., in "A novel transparent air-stable printable n-type semiconductor technology using ZnO nanoparticles," 2004 IEEE International Electron Device meeting Technical Digest, pp. 769, 2004, disclose a method for producing thin film transistors using organically stabilized zinc-oxide nanoparticles. The disclosed process involves an exposure to a temperature of 400° C.

Although successful zinc oxide based devices have been made with sputtering techniques, it is clear that very precise control over the reactive gas composition (such as oxygen content) is required to produce good quality devices. Chemical vapor deposition (CVD) techniques, in which two reactive gasses ale mixed to form the desired film material, can be useful routes to achieving high quality film growth. Atomic layer deposition ("ALD") is yet an alternative film deposition technology that can provide improved thickness resolution and conformal capabilities, compared to its CVD predecessor. The ALD process segments the conventional thin-film deposition process of conventional CVD into single atomic-layer deposition steps.

ALD can be used as a fabrication step for forming a number of types of thin-film electronic devices, including semiconductor devices and supporting electronic components such as resistors and capacitors, insulators, bus lines and other conductive structures. ALD is particularly suited for forming thin layers of metal oxides in the components of electronic devices. General classes of functional materials that can be deposited with ALD include conductors, dielectrics or insulators, and semiconductors.

Examples of useful semiconducting materials are compound semiconductors such as gallium arsenide, gallium nitride, cadmium sulfide, zinc oxide, and zinc sulfide.

A number of device structures can be made with the functional layers described above. A capacitor results from placing a dielectric between two conductors. A diode results from placing two semiconductors of complementary carrier type between two conducting electrodes. There may also be disposed between the semiconductors of complementary carrier type a semiconductor region that is intrinsic, indicating that that region has low numbers of free charge carriers. A diode may also be constructed by placing a single semiconductor between two conductors, where one of the conductor/semiconductors interfaces produces a Schottky barrier that impedes current flow strongly in one direction. A transistor results from placing upon a conductor (the gate) an insulating layer followed by a semiconducting layer. If two or more additional conductor electrodes (source and drain) are placed spaced apart in contact with the top semiconductor layer, a transistor can be formed. Any of the above devices can be created in various configurations as long as the critical interfaces are created.

Advantageously, ALD steps are self-terminating and can deposit precisely one atomic layer when conducted up to or beyond self-termination exposure times. An atomic layer typically ranges from about 0.1 to about 0.5 molecular monolayers, with typical dimensions on the order of no more than a few Angstroms. In ALD, deposition of an atomic layer is the outcome of a chemical reaction between a reactive molecular precursor and the substrate. In each separate ALD reaction-deposition step, the net reaction deposits the desired atomic layer and substantially eliminates "extra" atoms originally included in the molecular precursor. In its most pure form, ALD involves the adsorption and reaction of each of the precursors in the complete absence of the other precursor or precursors of the reaction. In practice in any process it is difficult to avoid some direct reaction of the different precursors leading to a small amount of chemical vapor deposition reaction. The goal of any process claiming to perform ALD is to obtain device performance and attributes commensurate with an ALD process while recognizing that a small amount of CVD reaction can be tolerated.

In ALD applications, typically two molecular precursors are introduced into the ALD reactor in separate stages. For example, a metal precursor molecule, $ML_x$, comprises a metal element, M that is bonded to an atomic or molecular ligand, L. For example, M could be, but would not be restricted to, Al, W, Ta, Si, Zn, etc. The metal precursor reacts with the substrate, when the substrate surface is prepared to react directly with the molecular precursor. For example, the substrate surface typically is prepared to include hydrogen-containing ligands, AH or the like, that are reactive with the metal precursor. Sulfur (S), oxygen (O), and Nitrogen (N) are some typical A species. The gaseous precursor molecule effectively reacts with all of the ligands on the substrate surface, resulting in deposition of a single atomic layer of the metal:

$$\text{substrate-AH} + ML_x \rightarrow \text{substrate-}AML_{x-1} + HL \quad (1)$$

where HL is a reaction by-product. During the reaction, the initial surface ligands, AH, are consumed, and the surface becomes covered with $AML_{x-1}$ ligands, which cannot further react with metal precursor $ML_x$. Therefore, the reaction self-terminates when all of the initial AH ligands on the surface are replaced with $AML_{x-1}$ species. The reaction stage is typically followed by an inert-gas purge stage that eliminates the excess metal precursor and the HL by-product species from the chamber prior to the separate introduction of the other precursor.

A second molecular precursor then is used to restore the surface reactivity of the substrate towards the metal precursor. This is done, for example, by removing the L ligands and re-depositing AH ligands. In this case, the second precursor typically comprises the desired (usually nonmetallic) element A (i.e., O, N, S), and hydrogen (i.e., $H_2O$, $NH_3$, $H_2S$). The next reaction is as follows:

$$\text{substrate-A-ML+AH}_y \rightarrow \text{substrate-A-M-AH+HL} \qquad (2)$$

This converts the surface back to its AH-covered state. (Here, for the sake of simplicity, the chemical reactions are not balanced.) The desired additional element, A, is incorporated into the film and the undesired ligands, L, are eliminated as volatile by-products. Once again, the reaction consumes the reactive sites (this time, the L terminated sites) and self-terminates when the reactive sites on the substrate are entirely depleted. The second molecular precursor then is removed from the deposition chamber by flowing inert purge-gas in a second purge stage.

In summary, then, an ALD process requires alternating in sequence the flux of chemicals to the substrate. The representative ALD process, as discussed above, is a cycle having four different operational stages:

1. $ML_x$ reaction;
2. $ML_x$ purge;
3. $AH_y$ reaction; and
4. $AH_y$ purge, and then back to stage 1.

This repeated sequence of alternating surface reactions and precursor-removal that restores the substrate surface to its initial reactive state, with intervening purge operations, is a typical ALD deposition cycle. A key feature of ALD operation is the restoration of the substrate to its initial surface chemistry condition. Using this repeated set of steps, a film can be layered onto the substrate in equal metered layers that are all identical in chemical kinetics, deposition per cycle, composition, and thickness.

Self-saturating surface reactions make ALD insensitive to transport non-uniformities, which might otherwise impair surface uniformity, due either to engineering tolerances and the limitations of the flow process or related to surface topography (that is, deposition into three dimensional, high aspect ratio structures). As a general rule, a non-uniform flux of chemicals in a reactive process generally results in different completion times at different areas. However, with ALD, each of the reactions is allowed to complete on the entire substrate surface. Thus, differences in completion kinetics impose no penalty on uniformity. This is because the areas that are first to complete the reaction self-terminate the reaction; other areas are able to continue until the full treated surface undergoes the intended reaction.

Typically, an ALD process deposits about 0.1-0.2 nm of a film in a single ALD cycle (with numbered steps 1 through 4 as listed earlier). A useful and economically feasible cycle time must be achieved in order to provide a uniform film thickness in a range of about from 3 nm to 300 nm for many or most semiconductor applications, and even thicker films for other applications. Industry throughput standards dictate that substrates be processed in 2 minutes to 3 minutes, which means that ALD cycle times must be in a range from about 0.6 seconds to about 6 seconds.

An ALD process must be able to execute this sequencing efficiently and reliably for many cycles in order to allow cost-effective coating of many substrates. In an effort to minimize the time that an ALD reaction needs to reach self-termination, at any given reaction temperature, one approach has been to maximize the flux of chemicals flowing into the ALD reactor, using a so-called "pulsing" process. In the pulsed ALD process, a substrate sits in a chamber and is exposed to the above sequence of gases by allowing a first gas to enter the chamber, followed by a pumping cycle to remove that gas, followed by the introduction of a second gas to the chamber, followed by a pumping cycle to remove the second gas. This sequence can be repeated at any frequency and variations in gas type and/or concentration. The net effect is that the entire chamber experiences a variation in gas composition with time, and thus this type of ALD can be referred to as time dependent ALD. The vast majority of existing ALD processes are time dependent ALD.

In order to maximize the flux of chemicals into the ALD reactor, it is advantageous to introduce the molecular precursors into the ALD reactor with minimum dilution of inert gas and at high pressures. However, these measures work against the need to achieve short cycle times and the rapid removal of these molecular precursors from the ALD reactor. Rapid removal in turn dictates that gas residence time in the ALD reactor be minimized.

Existing ALD approaches have been compromised with the trade-off between the need to shorten reaction times and improve chemical utilization efficiency, and on the other hand, the need to minimize purge-gas residence and chemical removal times. One approach to overcome the inherent limitations of time depended ALD systems is to provide each reactant gas continuously and to move the substrate through each gas in succession. In these systems a relatively constant gas composition exists, but is located to specific areas or spaces of the processing system. Therefore, these systems will be referred to as spatially dependent ALD systems.

For example, U.S. Pat. No. 6,821,563 entitled "GAS DISTRIBUTION SYSTEM FOR CYCLICAL LAYER DEPOSITION" to Yudovsky describes spatially dependent ALD processing system, under vacuum, having separate gas ports for precursor and purge gases, alternating with vacuum pump ports between each gas port. Each gas port directs its stream of gas vertically downward toward a substrate. The separate gas flows are separated by walls or partitions, with vacuum pumps for evacuating gas on both sides of each gas stream. A lower portion of each partition extends close to the substrate, for example, about 0.5 mm or greater from the substrate surface. In this manner, the lower portions of the partitions are separated from the substrate surface by a distance sufficient to allow the gas streams to flow around the lower portions toward the vacuum ports after the gas streams react with the substrate surface A rotary turntable or other transport device is provided for holding one or more substrate wafers. With this arrangement, the substrate is shuttled beneath the different gas streams, effecting ALD deposition thereby. In one embodiment, the substrate is moved in a linear path through a chamber, in which the substrate is passed back and forth a number of times.

Another approach using continuous gas flow spatially dependent ALD is shown in U.S. Pat. No. 4,413,022 entitled "METHOD FOR PERFORMING GROWTH OF COMPOUND THIN FILMS" to Suntola et al. A gas flow array is provided with alternating source gas openings, carrier gas openings, and vacuum exhaust openings. Reciprocating motion of the substrate over the array effects ALD deposition, again, without the need for pulsed operation. In the embodiment of FIGS. 13 and 14, in particular, sequential interactions between a substrate surface and reactive vapors are made by a reciprocating motion of the substrate over a fixed array of source openings, Diffusion barriers are formed by a carrier gas opening between exhaust openings. Suntola et al. state that operation with such an embodiment is possible even at atmospheric pressure, although little or no details of the process, or examples, are provided.

While processes such as those described in the '563 Yudovsky and '022 Suntola et al. disclosures may avoid some of the difficulties inherent to pulsed gas approaches, these processes have other drawbacks. For example, it would be very difficult to maintain a uniform vacuum at different points in an array and to maintain synchronous gas flow and vacuum at complementary pressures, thus compromising the uniformity of gas flux that is provided to the substrate surface. Neither the gas flow delivery unit of the '563 Yudovsky disclosure nor the gas flow array of the '022 Suntola et al. disclosure can be used in closer proximity to the substrate than about 0.5 mm.

U.S. patent Pub. No. 2005/0084610 to Selitser discloses an atmospheric pressure atomic layer chemical vapor deposition process. Selitser et al. state that extraordinary increases in reaction rates are obtained by changing the operating pressure to atmospheric pressure, which will involve orders of magnitude increase in the concentration of reactants, with consequent enhancement of surface reactant rates. The embodiments of Selitser et al. involve separate chambers for each stage of the process, although FIG. 10 shows an embodiment in which chamber walls are removed. A series of separated injectors are spaced around a rotating circular substrate holder track. Each injector incorporates independently operated reactant, purging, and exhaust gas manifolds and controls and acts as one complete mono-layer deposition and reactant purge cycle for each substrate as is passes thereunder in the process. Little or no specific details of the gas injectors or manifolds are described by Selitser et al., although they state that spacing of the injectors is selected so that cross-contamination from adjacent injectors is prevented by purging gas flows and exhaust manifolds incorporate in each injector.

A spatially dependent ALD process can be accomplished with other apparatus or systems described in more detail in commonly assigned U.S. application Ser. No. 11/392,007, filed Mar. 29, 2006, now U.S. Pat. No. 7,413,982 by Levy et al. and entitled, "PROCESS FOR ATOMIC LAYER DEPOSITION;" U.S. application Ser. No. 11/392,006, filed Mar. 29, 2006, now U.S. Pat. No. 7,456,429, by Levy et al. and entitled "APPARATUS FOR ATOMIC LAYER DEPOSITION;" U.S. application Ser. No. 11/620,744, filed Jan. 8, 2007, now US Publication No. 2009/0130858, by Levy and entitled "DEPOSITION SYSTEM AND METHOD USING A DELIVERY HEAD SEPARATED FROM A SUBSTRATE BY GAS PRESSURE;" and U.S. application Ser. No. 11/620, 740, filed Jan. 8, 2007, now U.S. Pat. No. 7,789,961, by Nelson et al. and entitled "DELIVERY DEVICE COMPRISING GAS DIFFUSER FOR THIN FILM DEPOSITION." All these identified applications hereby incorporated by reference in their entirety. These systems attempt to overcome one of the difficult aspects of a spatial ALD system, which is undesired intermixing of the continuously flowing mutually reactive gases. In particular, U.S. Pat. No. 7,413,982 employs a novel transverse flow pattern to prevent intermixing, while US Publication No. 2009/0130858 and U.S. Pat. No. 7,789, 961 employ a coating head partially levitated by the pressure of the reactive gases of the process to accomplish improved gas separation.

Despite the usefulness and ease of use of these spatially dependent ALD systems, they continue to be less capable than time dependent ALD systems in terms of separation of the mutually reactive gases. Thus, to render them industrially useful, chemistries must be considered that are more robust to unavoidable problems associated with gas intermixing.

A common approach to chemically modify the nature of a semiconductor is to include in the matrix of the semiconductor other atoms or molecules which vary the electrical properties of the semiconductor. These additional atoms typically operate by accepting or donating mobile charge to the system. In the case of a semiconductor like zinc oxide, acceptor dopants can be used to trap electrons, thus driving the semiconductor to have increased hole concentration and toward a p-type semiconductor. Alternatively, donor dopants can be used to release electrons, thus driving the semiconductor to have an increased electron concentration and toward a n-type semiconductor A number of atoms exist that can be used as acceptor dopants in zinc oxide, among which are nitrogen, copper, phosphorus, and arsenic. In the existing prior art, the use of acceptor dopants in zinc oxide has been done with an attempt to produce p-type zinc oxide layers. Suitable p-type materials will in fact be driven to a sufficient hole concentration so as to render the materials somewhat conductive due to hole charge carrier movement.

For example, Sugihara et al., US 2006/0244107 A1, disclose a method to prepare acceptor-doped ZnO-based layers. In their method, the films are prepared by using pulsed laser deposition, with a substrate temperature of 300° C. and using nitric oxide as the N-dopant. Interestingly, the films require an adjacent barrier layer to be effective.

C. Lee et al. (J. Vac. Sci. Technol. A 24(4) 2006) discusses N-doped ZnO-based semiconductor films grown by an ALD type process using ammonia gas to produce nitrogen doping. These films require annealing at 1000° C. to convert them to p-type ZnO. They use a time dependent ALD process. The acceptor doping is used to produce p-type materials.

Thus, there remains still a need to provide a spatially dependent ALD system to make a zinc-oxide based semiconductor film.

SUMMARY OF THE INVENTION

The present invention relates to A process of making an n-type zinc-oxide-based thin film semiconductor, for use in a transistor by depositing a thin film material on a substrate, comprising simultaneously directing a series of gas flows along elongated substantially parallel channels, and wherein the series of gas flows comprises, in order, at least a first reactive gaseous material, an inert purge gas, and a second reactive gaseous material, optionally repeated a plurality of times, wherein the first reactive gaseous material is capable of reacting with a substrate surface treated with the second reactive gaseous material to form the zinc-oxide-based thin film semiconductor, wherein the first reactive gaseous material is a volatile organo-zinc precursor compound comprising both zinc and organic groups, a volatile acceptor dopant precursor is introduced into the first reactive gaseous material, the second reactive gaseous material, in inert purge gas, or an additional gas flow of a supplemental gaseous material, and wherein the process is carried out substantially at or above atmospheric pressure and the temperature of the substrate during deposition is under 250° C. Accordingly, the acceptor dopant precursor reacts and is incorporated as an acceptor dopant in the zinc-oxide-based thin film semiconductor film.

During the process, the substrate or deposition device for the gaseous materials, or both, is capable of providing relative movement between the output face of the deposition device and the substrate while maintaining close proximity.

In a preferred embodiment, the process can be operated with continuous movement of a substrate being subjected to thin film deposition, wherein the process is capable of conveying the support on or as a web past the deposition device, preferably in an unsealed environment to ambient at substantially atmospheric pressure.

In the material produced by a spatial ALD process, defects in the materials lead to two deleterious effects. First of all, such materials tend to have too high a concentration of native charge carrier, leading to high off currents. Secondly, such materials contain defect sites that can cause bulk charging effects, leading to poor subthreshold slope. The present invention provides doping methods that permit zinc-oxide-based semiconductor material produced in a spatially dependent ALD system to not only effectively work in practice, but to perform well.

It is an advantage of the present invention that it provides an advantageous process for atomic layer deposition of a zinc-oxide-based n-type semiconductor onto a substrate, well suited to a number of different types of substrates and deposition environments.

It is yet a further advantage of the present invention that it is adaptable for deposition on a web or other moving substrate, including deposition onto a large area substrate.

It is a further advantage of the present invention that it allows operation, in preferred embodiments, under atmospheric pressure conditions.

It is still a further advantage of the present invention that it can be employed in low temperature processes at atmospheric pressures, which process may be practice in an unsealed environment, open to ambient atmosphere.

The invention is also directed to a transistor comprising a zinc-oxide-based semiconductor, preferably on a flexible substrate, made by the present process.

Semiconductor films made by the present method are capable of exhibiting, in the film form, excellent field-effect electron mobilities of greater than 0.1 $cm^2/Vs$ and on-off ratios of greater than $10^4$, in which performance properties are sufficient for use in a variety of relevant technologies, including active matrix display backplanes.

A TFT structure includes, in addition to the zinc-oxide-based semiconductor, conducting electrodes, commonly referred to as a source and a drain, for injecting a current into the zinc-oxide-based semiconductor. The n-channel semiconductor films made by the present invention can be used in thin film transistors each comprising spaced apart first and second contact means connected to an n-channel semiconductor film. A third contact means can be spaced from said semiconductor film by an insulator, and adapted for controlling, by means of a voltage applied to the third contact means, a current between the first and second contact means through said film. The first, second, and third contact means can correspond to a drain, source, and gate electrode in a field effect transistor.

The objects, features, and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

While the specification concludes with claims particularly pointing out and distinctly claiming the subject matter of the present invention, it is believed that the invention will be better understood from the following description when taken in conjunction with the accompanying drawings, wherein:

FIGS. 4A and 4B are cross-sectional side views of one embodiment of the distribution of a system of gaseous materials, schematically showing the accompanying deposition operation;

FIGS. 7A, 7B, 7C, and 7D are cross-sectional views taken orthogonally to the cross sectional views of previous FIGS. 2-4B, showing gas flow directions for output channels in various embodiments;

FIGS. 8A and 8B are cross-section views showing the impact of reduced distance from the output face, of a deposition device for providing gaseous materials, to the substrate surface;

FIG. 10 is a perspective view of one embodiment of a deposition device formed from stacked plates that can be used in the present process;

DETAILED DESCRIPTION OF THE INVENTION

Figure 1:
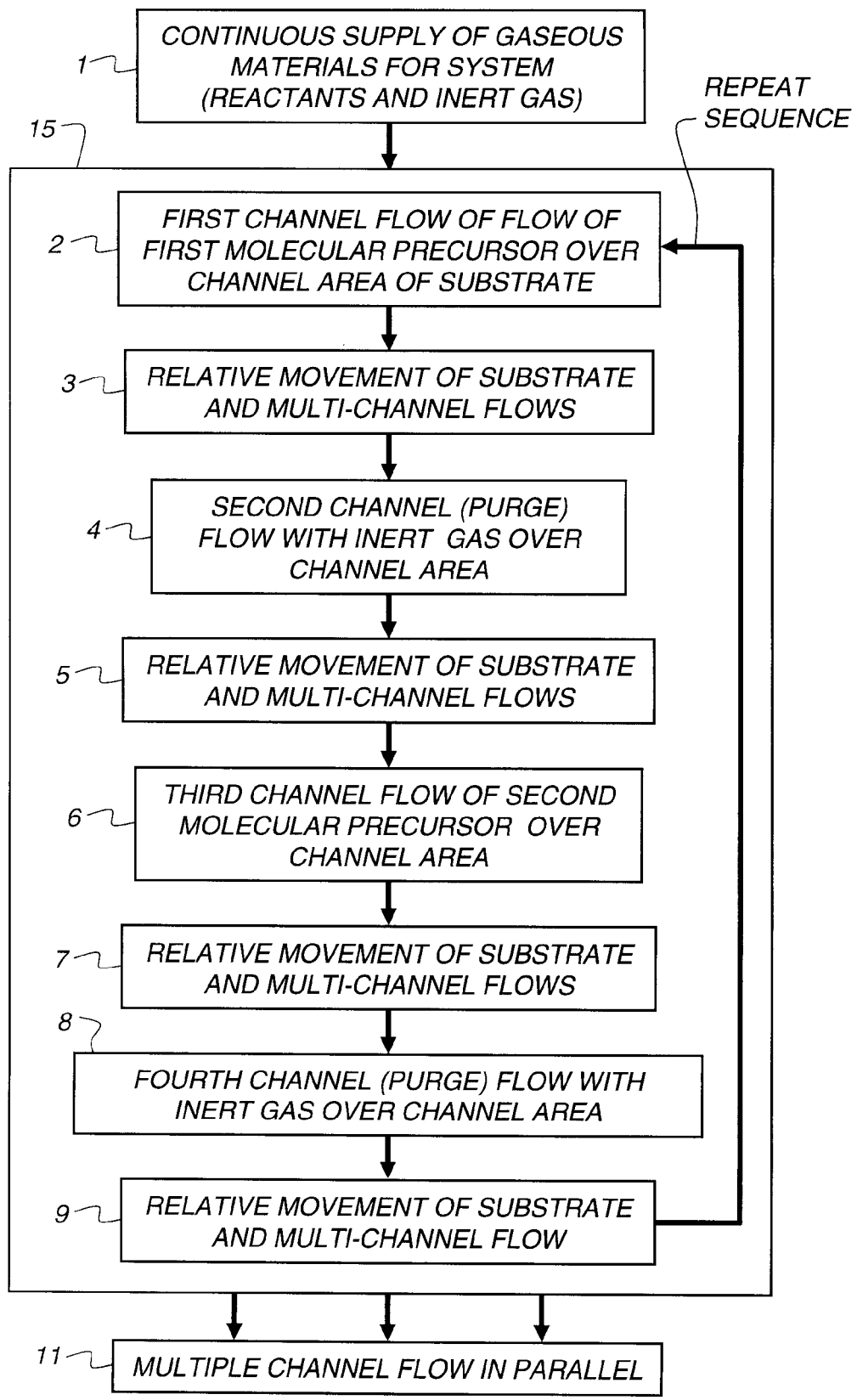
FIG. 1 is a flow chart describing the steps of the present process.

The semiconductor films made according to the present method exhibit a field effect electron mobility that is greater than 0.01 cm$^2$/Vs, preferably at least 0.1 cm$^2$/Vs, more preferably greater than 1 cm$^2$/Vs. In addition, n-channel semiconductor devices made according to the present invention are capable of providing on/off ratios of at least $10^4$, advantageously at least $10^5$ or $10^6$.

Furthermore, it is desired that the device be weakly or not at all influenced by visible light. In order for this to be true, the semiconductor band gap must be sufficiently large (>3 eV) so that exposure to visible light does not cause an inter-band transition.

Zinc-oxide based materials are capable of yielding a high mobility, low carrier concentration, and high band gap. Furthermore, in a real high volume web based atmospheric manufacturing scheme, it is highly desirable that the chemistries used in the process be both cheap and of low toxicity, which can be satisfied by the use of ZnO-based materials and the majority of its precursors.

The zinc-oxide-based semiconductor material can contain minor amounts of other metals capable of forming semiconducting oxides such as indium, tin, or cadmium, and combinations thereof. For example, Chiang, H. Q. et al., "High mobility transparent thin-film transistors with amorphous zinc tin oxide channel layer," Applied Physics Letters 86, 013503 (2005) discloses zinc tin oxide materials.

Accordingly, the term "zinc-oxide-based" refers to a composition comprising mostly zinc oxide, preferably at least 80 percent, but allowing additives or mixtures with minor amounts of other metal oxides, which semiconductor compositions are known to the skilled artisan.

Nominally undoped zinc oxide shows n-type conductivity because of the presence of shallow donors. Lattice imperfections due to a deviation from stoichiometry are thought to play a role in the creation of shallow donor states, although unintentionally incorporated hydrogen is also considered as a source of shallow donor states. See D. C. Look, J. R. Sizelove and J. W. Hemsky, Phys. Rev. Lett. 82, 2552-2555 (1999); C. G. Van de Walle, Phys. Rev. Lett. 85 1012 (2000). These shallow donors have in common that they introduce occupied energy levels that are less than 100 meV below the conduction band edge of zinc oxide. Electrons occupying these shallow donor states can be promoted into the conduction band via thermal excitation and lead to intrinsic conductivity.

In order to improve off currents, the zinc oxide based semiconductor must have low numbers of native charge carriers, leading to a high resistivity. According to the present invention, the resistivity of the ZnO is enhanced by substitutional doping with an acceptor dopant made from a volatile organic compound, for example, volatile compounds comprising an acceptor dopant such as N, P, As, Li, Na, K, Cu, Ag, or mixtures thereof. Preferably, the acceptor dopant comprises a Group V element, more preferably nitrogen, for example, using an acceptor dopant precursor comprises nitrogen in the form of NO, N$_2$O, NO$_2$, or ammonia.

Typically, the acceptor dopant has fewer valence electrons than the atom it replaces, whether a Group (V) element substituting for oxygen or a Group (I) or (IB) element substituting for zinc.

In preferred embodiments of the invention, the on-off ratio of the semiconductor without the acceptor dopant is less than $1.0 \times 10^6$. Also, the presence of the acceptor dopant provides an increase in resistivity of at least $10^2$ wherein the resistivity of the semiconductor without the acceptor dopant is less than 500 ohm*cm. In especially preferred embodiments, the presence of the acceptor dopant also provides an increase in mobility of at least 25 percent, more preferably at least 50 percent.

Volatile compounds are defined as compounds that can exist to some extent in the vapor phase at room temperature, so that they may be delivered to a reaction chamber in the form of a gas. In order for such a gas to contain sufficient volatile materials to usefully affect the deposition process, the volatile compound must have a vapor pressure at room temperature of greater than 0.1 mmHg, preferably greater than 1 mmHg. Such dopants are preferably present in the final semiconductor in the amount of 0.001% to 5%, more preferably 0.01% to 1%.

An acceptor dopant in the scope of this invention is an impurity that introduces an energy level within the band-gap of ZnO-based materials that is below the energy level of shallow donors and is able to accept an electron. Such an acceptor dopant can be an impurity atom that has fewer valence electrons than the atom it replaces. Examples for ZnO-based materials are group (V) elements substituting for oxygen, e.g., nitrogen, phosphorous or arsenic or Group (I) and (IB) elements substituting for zinc, e.g. lithium, sodium, potassium, copper or silver. See Ü. Özgür, Ya. I. Alivov, C. Liu, A. Teke, M. A. Reshchikov, S. Doan, V. Avrutin, S.-J. Cho, and H. Morkoç, J. Appl. Phys. 98 041301 (2001).

In addition, minor amounts of various optional conventional dopants known to the skilled artisan, preferably less than 10 weight percent, can also be included in the zinc-oxide-based semiconductor during or after deposition. The thickness of the channel layer may vary, and according to particular examples it can range from about 5 nm to about 500 nm, 10 nm to 50 nm.

The length and width of the channel is determined by the pixel size and the design rules of the system under construction. Typically, the channel width may vary from 10 to 1000 µm. The channel length may vary, and according to particular examples it can range from about 1 to about 100 µm.

The entire process of making the thin film transistor or electronic device of the present invention, or at least the production of the thin film semiconductor, can be carried out below a maximum support temperature of about 300° C., more preferably below 250° C., or even at temperatures around room temperature (about 25° C. to 70° C.). The temperature selection generally depends on the support and processing parameters known in the art, once one is armed with the knowledge of the present invention contained herein. These temperatures are well below traditional integrated circuit and semiconductor processing temperatures, which enables the use of any of a variety of relatively inexpensive supports, such as flexible polymeric supports. Thus, the invention enables production of relatively inexpensive circuits containing thin film transistors with significantly improved performance.

For the description that follows, the term "gas" or "gaseous material" is used in a broad sense to encompass any of a range of vaporized or gaseous elements, compounds, or materials. Other terms used herein, such as: reactant, precursor, vacuum, and inert gas, for example, all have their conventional meanings as would be well understood by those skilled in the materials deposition art. The figures provided are not drawn to scale but are intended to show overall function and the structural arrangement of some embodiments of the present invention.

The process of the present invention offers a significant departure from conventional approaches to making a film of zinc-oxide-based n-type semiconductor, employing a system for delivery of gaseous materials to a substrate surface that can be adaptable to deposition on larger and web-based substrates and capable of achieving a highly uniform thin-film deposition at improved throughput speeds. The process of the present invention employs a continuous spatially dependent ALD (as opposed to pulsed or time dependent ALD) gaseous material distribution. The process of the present invention allows operation at atmospheric or near-atmospheric pressures and is capable of operating in an unsealed or open-air environment.

FIG. 1 is a generalized step diagram of one embodiment of a process for making a film of zinc-oxide-based n-type semiconductor according to an embodiment of the present invention, in which two reactive gases are used, a first molecular precursor and a second molecular precursor. Gases are supplied from a gas source and can be delivered to the substrate, for example, via a deposition device. Metering and valving apparatus for providing gaseous materials to the a deposition device can be used.

As shown in Step 1, a continuous supply of gaseous materials for the system is provided for depositing a thin film of material on a substrate. The Steps in Sequence 15 are sequentially applied. In Step 2, with respect to a given area of the substrate (referred to as the channel area), a first molecular precursor or reactive gaseous material is directed to flow in a first channel over the channel area of the substrate and reacts therewith. In Step 3 relative movement of the substrate and the multi-channel flows in the system occurs, which sets the stage for Step 4, in which second channel (purge) flow with inert gas occurs over the given channel area. Then, in Step 5, relative movement of the substrate and the multi-channel flows sets the stage for Step 6, in which the given channel area is subjected to atomic layer deposition in which a second molecular precursor now (in this particular embodiment, transversely and substantially parallel to the surface of the substrate) over the given channel area of the substrate and reacts with the previous layer on the substrate to produce (theoretically) a monolayer of a desired material. A first molecular precursor is a zinc-containing compound in gas form, and the material deposited is a zinc-containing compound, for example, an organozinc compound such as diethylzinc. In such an embodiment, the second molecular precursor can be, for example, a non-metallic oxidizing compound. A volatile acceptor doping compound can be supplied to the system in any way in which allows it to react to sites in the growing film. Thus it can be delivered with the first or second molecular precursors, or with the purge gas. Preferably the volatile acceptor is delivered in common with the oxidizing molecular precursor.

In Step 7, relative movement of the substrate and the multi-channel flows then sets the stage for Step 8 in which again an inert gas is used, this time to sweep excess second molecular precursor from the given channel area from the previous Step 6. In Step 9, relative movement of the substrate and the multi-channels occurs again, which sets the stage for a repeat sequence, back to Step 2. The cycle is repeated as many times as is necessary to establish a desired film. In the present embodiment of the process, the steps are repeated with respect to a given channel area of the substrate, corresponding to the area covered by a flow channel. Meanwhile the various channels are being supplied with the necessary gaseous materials in Step 1. Simultaneous with the sequence of box 15 in FIG. 1, other adjacent channel areas are being processed, which results in Multiple channel flows in parallel, as indicated in overall Step 11. Parallel flow can be either substantially orthogonal or substantially parallel to the output face of the deposition device.

The primary purpose of the second molecular precursor is to condition the substrate surface back toward reactivity with the first molecular precursor. The second molecular precursor also provides material from the molecular gas to combine with metal at the surface, forming an oxide with the freshly deposited zinc-containing precursor.

This particular embodiment does not need to use a vacuum purge to remove a molecular precursor after applying it to the substrate. Purge steps are expected by most researchers to be the most significant throughput-limiting step in ALD processes.

Assuming that, for the two reactant gases in FIG. 1, AX and BY are used, for example. When the reaction gas AX flow is supplied and flowed over a given substrate area, atoms of the reaction gas AX are chemically adsorbed on a substrate, resulting in a layer of A and a surface of ligand X (associative chemisorptions) (Step 2). Then, the remaining reaction gas AX is purged with an inert gas (Step 4). Then, the flow of reaction gas BY, and a chemical reaction between AX (surface) and BY (gas) occurs, resulting in a molecular layer of AB on the substrate (dissociative chemisorptions) (Step 6). The remaining gas BY and by-products of the reaction are purged (Step 8). The thickness of the thin film can be increased by repeating the process cycle (steps 2-9) many times.

Because the film can be deposited one monolayer at a time it tends to be conformal and have uniform thickness.

Oxides that can be made using the process of the present invention include, but are not limited to: ZnO, indium oxide, tin oxide. Mixed structure oxides that can be made using the process of the present invention can include, for example, InZnO and InGaZnO. Doped materials that can be made using the process of the present invention can include, for example, ZnO:Al, GaInZnO, $Mg_xZn_{1-x}O$, and LiZnO.

It will be apparent to the skilled artisan that alloys of two, three or more metals may be deposited, compounds may be deposited with two, three or more constituents, and such things as graded films and nano-laminates may be produced as well.

These variations are simply variants using particular embodiments of the invention in alternating cycles. There are many other variations within the spirit and scope of the invention, so the invention is limited only by the claims that follow.

For various volatile zinc-containing precursors, precursor combinations, and reactants useful in ALD thin film processes, reference is made to the Handbook of *Thin Film Process Technology*, Vol. 1, edited by Glocker and Shah, institute of Physics (IOP) Publishing, Philadelphia 1995, pages B1.5:1 to B1.5:16, hereby incorporated by reference; and *Handbook of Thin Film Materials*, edited by Nalwa, Vol. 1, pages 103 to 159, hereby incorporated by reference, including Table V1.5.1 of the former reference.

Although oxide substrates provide groups for ALD deposition, plastic substrates can be used by suitable surface treatment.

Figure 2:
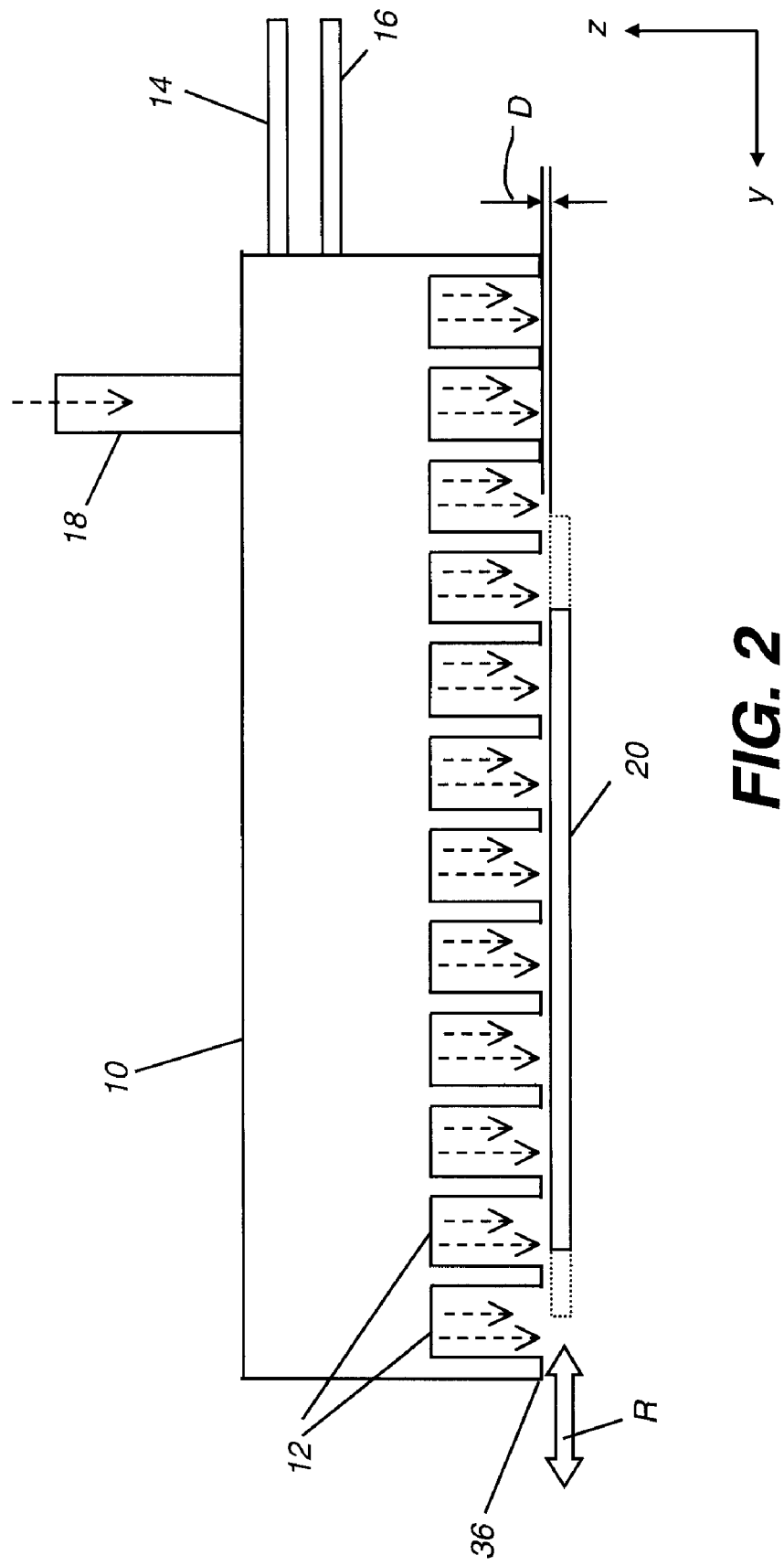
FIG. 2 is a cross-sectional side view of one embodiment of a deposition device for atomic layer deposition that can be used in the present process.

Referring now to FIG. 2, there is shown a cross-sectional side view of one embodiment of a deposition device 10 that can be used in the present process for atomic layer deposition of a zinc-oxide-based semiconductor onto a substrate 20 according to the present invention. Deposition device 10 has a gas inlet port 14 for accepting a first gaseous material, a gas inlet port 16 for accepting a second gaseous material, and a gas inlet port 18 for accepting a third gaseous material. These gases are emitted at an output face 36 via output channels 12, having a structural arrangement described subsequently. The arrows in FIG. 2 and subsequent FIGS. 3-4B refer to the diffusive transport of the gaseous material, and not the flow, received from an output channel. In this particular embodiment, the flow is substantially directed out of the page of the figure, as described further below.

In one embodiment, gas inlet ports 14 and 16 are adapted to accept first and second gases that react sequentially on the substrate surface to effect ALD deposition, and gas inlet port 18 receives a purge gas that is inert with respect to the first and second gases. Deposition device 10 is spaced a distance D from substrate 20, provided on a substrate support, as described in more detail subsequently. Reciprocating motion can be provided between substrate 20 and deposition device 10, either by movement of substrate 20, by movement of deposition device 10, or by movement of both substrate 20 and deposition device 10. In the particular embodiment shown in FIG. 2, substrate 20 is moved across output face 36 in reciprocating fashion, as indicated by the arrow R and by phantom outlines to the right and left of substrate 20 in FIG. 2. It should be noted that reciprocating motion is not always required for thin-film deposition using deposition device 10. Other types of relative motion between substrate 20 and deposition device 10 could also be provided, such as movement of either substrate 20 or deposition device 10 in one or more directions, as described in more detail subsequently.

Figure 3:
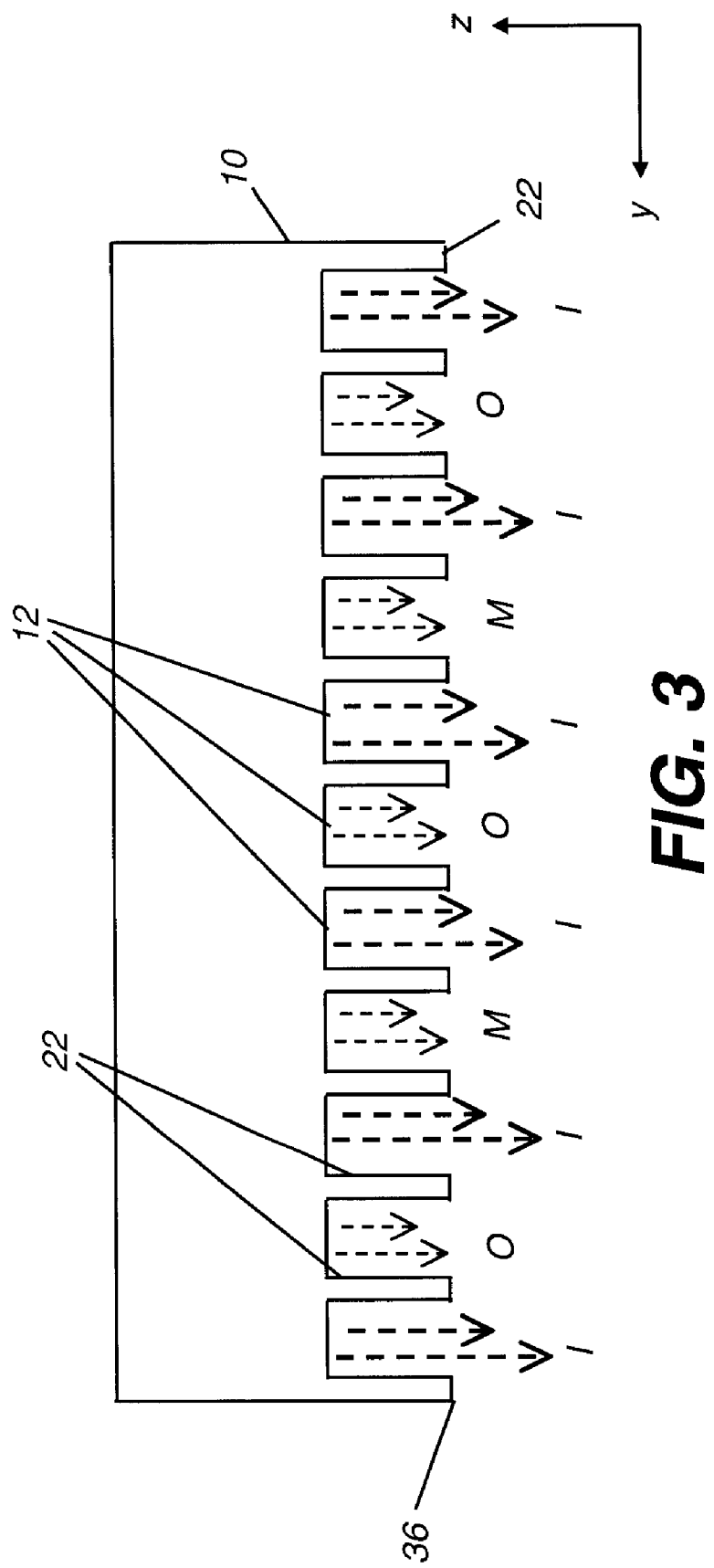
FIG. 3 is a cross-sectional side view of an embodiment, for one exemplary system of gaseous materials, of the distribution of gaseous materials to a substrate that is subject to thin film deposition.

The cross-sectional view of FIG. 3 shows gas flows emitted over a portion of output face 36 of deposition device 10. In this particular arrangement, each output channel 12, separated by partitions 22, is in gaseous flow communication with one of gas inlet ports 14, 16 or 18 seen in FIG. 2. Each output channel 12 delivers typically a first reactant gaseous material O, or a second reactant gaseous material M, or a third inert gaseous material I.

FIG. 3 shows a relatively basic or simple arrangement of gases. It is envisioned that a plurality of non-metal deposition precursors (like material O) or a plurality of metal-containing precursor materials, including at least a zinc-containing precursor (like material M) may be delivered sequentially at various ports in a thin-film single deposition. Alternately, a mixture of reactant gases, for example, a mixture of metal precursor materials or a mixture of metal and non-metal precursors may be applied at a single output channel when making complex thin film materials, for example, having alternate layers of metals or having lesser amounts of dopants admixed in a metal oxide material. The inter-stream labeled I separates any reactant channels in which the gases are likely to react with each other. First and second reactant gaseous materials O and M react with each other to effect ALD deposition, but neither reactant gaseous material O nor M reacts with inert gaseous material I. The nomenclature used in FIG. 3 and following suggests some typical types of reactant gases. For example, first reactant gaseous material O could be an oxidizing gaseous material; second reactant gaseous material M would be a metallic zinc-containing compound. Inert gaseous material I could be nitrogen, argon, helium, or other gases commonly used as purge gases in ALD processes. Inert gaseous material I is inert with respect to first or second reactant gaseous materials O and M. Reaction between first and second reactant gaseous materials would form a metal oxide or other binary compound, such as zinc oxide ZnO, in one embodiment. Reactions between more than two reactant gaseous materials could form other zinc-oxide based materials such as a ternary compound, for example, ZnAlO.

The cross-sectional views of FIGS. 4A and 4B show, in simplified schematic form, the ALD coating operation performed as substrate 20 passes along output face 36 of deposition device 10 when delivering reactant gaseous materials O and M. In FIG. 4A, the surface of substrate 20 first receives an oxidizing material from output channels 12 designated as delivering first reactant gaseous material O. The surface of the substrate now contains a partially reacted form of material O, which is susceptible to reaction with material M. Then, as substrate 20 passes into the path of the metal compound of second reactant gaseous material M, the reaction with M takes place, forming a metallic oxide or some other thin film material that can be formed from two reactant gaseous materials.

As FIGS. 4A and 4B show, inert gaseous material I is provided in every alternate output channel 12, between the flows of first and second reactant gaseous materials O and M. Sequential output channels 12 are adjacent, that is, share a common boundary, formed by partitions 22 in the embodiments shown. Here, output channels 12 are defined and separated from each other by partitions 22 that extend at a perpendicular to the surface of substrate 20.

As mentioned above, in this particular embodiment, there are no vacuum channels interspersed between the output channels 12, that is, no vacuum channels on either side of a channel delivering gaseous materials to drawn the gaseous materials around the partitions. This advantageous, compact arrangement is possible because of the innovative gas flow that is used. Unlike gas delivery arrays of earlier processes that apply substantially vertical (that is, perpendicular) gas flows against the substrate and must then draw off spent gases in the opposite vertical direction, deposition device 10 directs a gas flow (preferably substantially laminar in one embodiment) along the surface for each reactant and inert gas and handles spent gases and reaction by-products in a different manner, as described subsequently. The gas flow used in the present invention is directed along and generally parallel to the plane of the substrate surface. In other words, the flow of gases is substantially transverse to the plane of a substrate rather than perpendicular to the substrate being treated.

Figure 5:
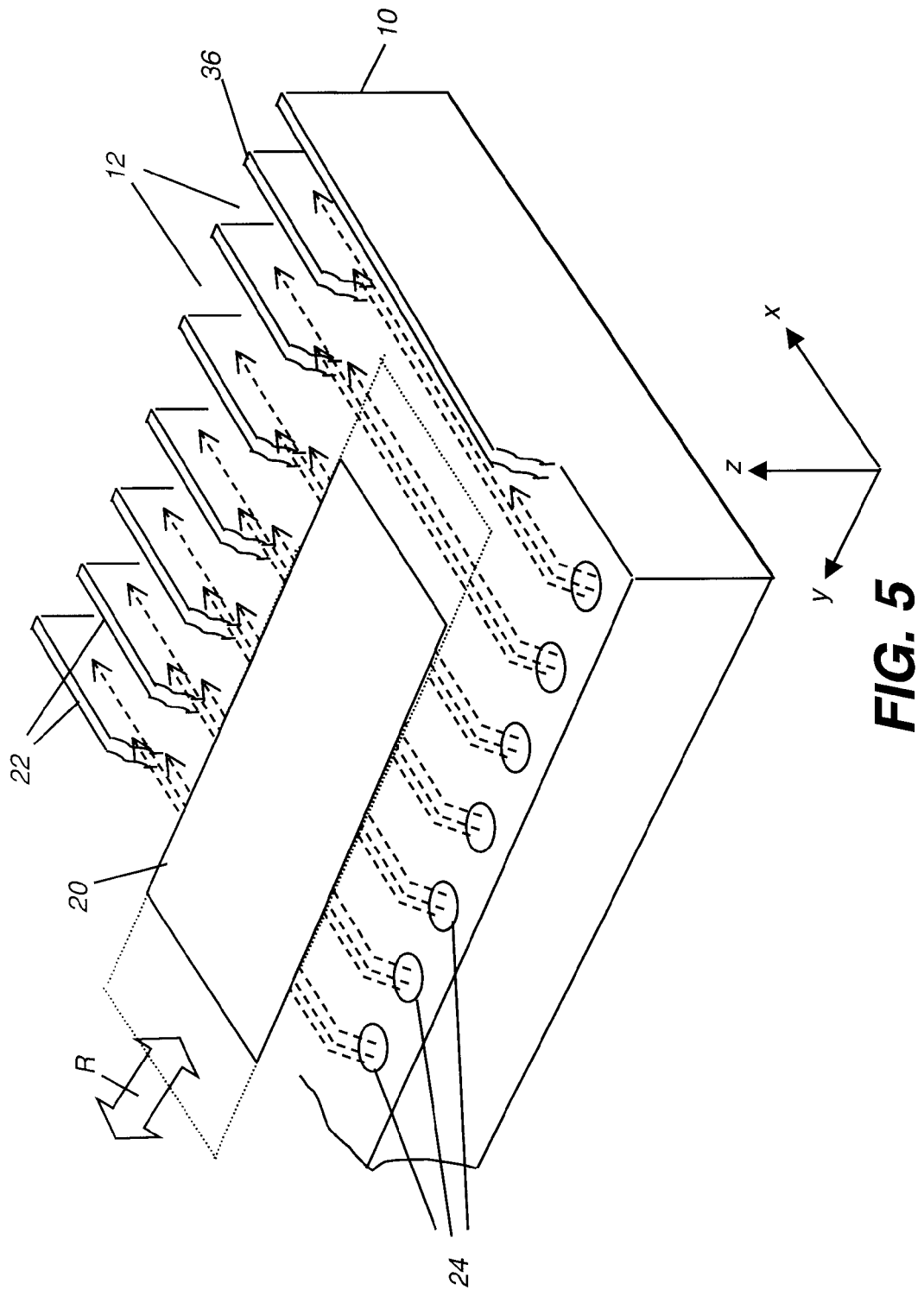
FIG. 5 is a perspective view, from the output face side, of a portion of one embodiment of a deposition device, showing the orientation of output channels relative to the substrate and reciprocating motion, that can be used for deposition on the substrate.
Figure 6:
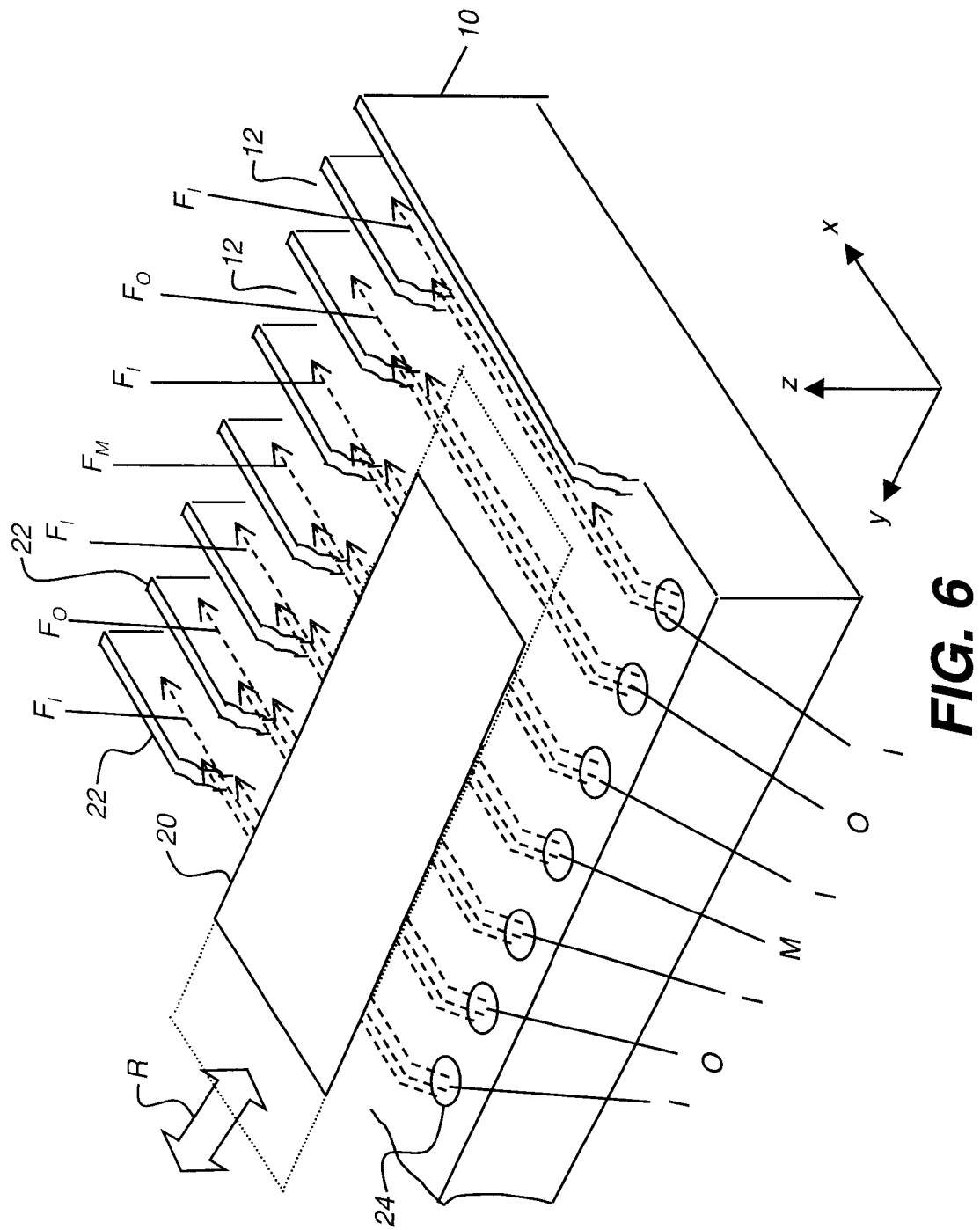
FIG. 6 is a perspective view as in FIG. 5, showing one exemplary arrangement of gas flow in the deposition device.

FIGS. 5 and 6 show perspective views of one embodiment of a deposition device 10 that can be used in the present process, from the output face 36 (that is, from the underside with respect to FIGS. 2-4B). Partitions 22 that define and separate the adjacent output channels 12 in this embodiment are represented as partially cut away, to allow better visibility for the gas flows flowing from gas outlet ports 24. FIGS. 5 and 6 also show reference x,y,z coordinate axis assignments used in the figures of this disclosure. Output channels 12 are substantially in parallel and extend in a length direction that corresponds to the x coordinate axis. Reciprocating motion of substrate 20, or motion relative to substrate 20, is in the y coordinate direction, using this coordinate assignment.

FIG. 6 shows the gas flows $F_I$, $F_O$, and $F_M$ for the various gaseous materials delivered from deposition device 10 with this embodiment. Gas flows $F_I$, $F_O$, and $F_M$ are in the x-direction, that is, along the length of elongated output channels 12.

The cross-sectional views of FIGS. 7A, 7B, 7C, and 7D are taken orthogonally to the cross-sections of FIGS. 2-4B and show gas flows in one direction from this view. Within each output channel 12, the corresponding gaseous material flows from a gas output port 24, shown in phantom in the views of FIGS. 7A, 7B, 7C, and 7D. In the embodiment of FIG. 7A, gas flow F1 directs the gaseous material along the length of output channel 12 and across substrate 20, as was described with reference to FIGS. 5 and 6. Flow F1 continues past the edge of deposition device 10 in this arrangement, flowing outward into the environment or, if desirable, to a gas collection manifold (not shown). FIG. 7B shows an alternative embodiment for gas flow F2 in which output channel 12 also provides an exhaust port 26 for redirection or drawing off of the gas flow. FIG. 7C shows an alternative embodiment for gas flow F3, in which gas output port 24 is centrally located within output channel 12 and directs gaseous material in gas flows along the channel in both directions. FIG. 7D shows an alternate embodiment for gas flow F4, in which gas output port 24 is also centrally positioned, with multiple exhaust ports 26 suitably placed near the extreme ends of output channel 12. Although unidirectional flows are preferred, some degree of mixing can occur and even may be beneficial to some extent, depending on the flow rates and other circumstances involved in a particular application.

A particular deposition device 10 may use output channels 12 configured using any one of the gas flow configurations or combinations thereof, either the F1 flow of FIG. 7A, the F2 flow of FIG. 7B, the F3 flow of FIG. 7C, the F4 flow of FIG. 7D, or some other variation in which gaseous material is directed to flow across substrate 20 along output channel 12, preferably in a substantially laminar or smooth fashion with controlled mixing. In one embodiment, one or more exhaust ports 26 are provided for each output channel 12 that delivers a reactant gaseous material. For example, referring to FIG. 6, output channels 12 for first and second reactant gaseous materials, labeled O and M, are configured with exhaust ports 26 to vent or draw off the reactant substances, following the pattern of flow F2 (FIG. 7B). This allows some recycle of materials and prevents undesirable mixing and reaction near the end of the manifold. Output channels 12 for inert gaseous material, labeled I, do not use exhaust ports 26 and thus follow the pattern of flow F1 (FIG. 7A). Although laminar flows are preferred in some embodiments, some degree of mixing can occur and even may be beneficial to some extent, depending on the flow rates and other circumstances involved in a particular application.

Exhaust port 26 is not a vacuum port, in the conventional sense, but is simply provided to draw off the gaseous flow in its corresponding output channel 12, thus facilitating a uniform gas flow pattern within the channel. A negative draw, just slightly less than the opposite of the gas pressure at gas output port 24, can help to facilitate an orderly gas flow. The negative draw can, for example, operate at a pressure of between 0.9 and 1.0 atmosphere, whereas a typical vacuum is, for example, below 0.1 atmosphere. An optional baffle 58, as shown in dotted outline in FIGS. 7B and 7D may be provided to redirect the flow pattern into exhaust port 26.

Because no gas flow around partition 22 to a vacuum exhaust is needed, output face 36 can be positioned very closely, to within about 1 mil (approximately 0.025 mm) of the substrate surface. By comparison, an earlier approach such as that described in the U.S. Pat. No. 6,821,563 to Yudovsky, cited earlier, required gas flow around the edges of channel sidewalls and was thus limited to 0.5 mm or greater distance to the substrate surface. Positioning the deposition device 10 closer to the substrate surface is preferred in the present invention. In a preferred embodiment, distance D from the surface of the substrate can be 0.4 mm or less, preferably within 0.3 mm, more preferably within 0.25 mm of the output face of the deposition device or the bottom of the guide walls that provide the flow channels.

The cross-sectional views of FIGS. 8A and 8B show why it is desirable that the distance D is relatively small, consistent with the operation of the invention. In these figures, deposition device 10 is moving over substrate 20 from left to right, as the arrow indicates. As output channel 12 carrying a reactive gaseous material M moves to the right over an area, it encounters a diffusion layer 72 from the next adjacent (previous-in-time) output channel that is primarily inert gaseous material I. In order to react on the surface of substrate 20, reactive gaseous material M must diffuse through diffusion layer 72, which has a thickness proportional to distance D. By comparison, FIG. 8B shows what happens when distance D is reduced: diffusion layer 72 is reduced proportionately. Diffusion through diffusion layer 72 happens more quickly and more efficiently, allowing less waste and reducing the overall amount of time needed for reaction on the surface of substrate 20. The lower partition walls 22 also prevent less gas to remain from the previous-in time output channel gas. It should be noted that the flow of the gases in the channels are perpendicular to the page of the FIGS. 8A and 8B, as shown by the back of the arrow, which flow maintains a concentration gradient that aids the diffusion through the thin diffusion layer 72 to the surface of the substrate. The surface is exposed to the gas flow of M for sufficient time for diffusion and any mixing to replace the previous-in-time output channel gas. In this particular embodiment, the flow of gas is across the surface rather than directly into the surface it limits the undesirable mixing of reactant gases between outlet channels, which might otherwise be exacerbated by relative oscillation of the manifold and/or substrate.

In order to provide smooth flow along the length of output channel 12, gas output port 24 may be inclined at an angle away from normal, as indicated in FIGS. 7A and 7B. Optionally, some type of gas flow redirecting structure may also be employed to redirect a downward flow from gas output port 24 so that it forms a gas flow that runs substantially in parallel to output face 36.

Figure 9:
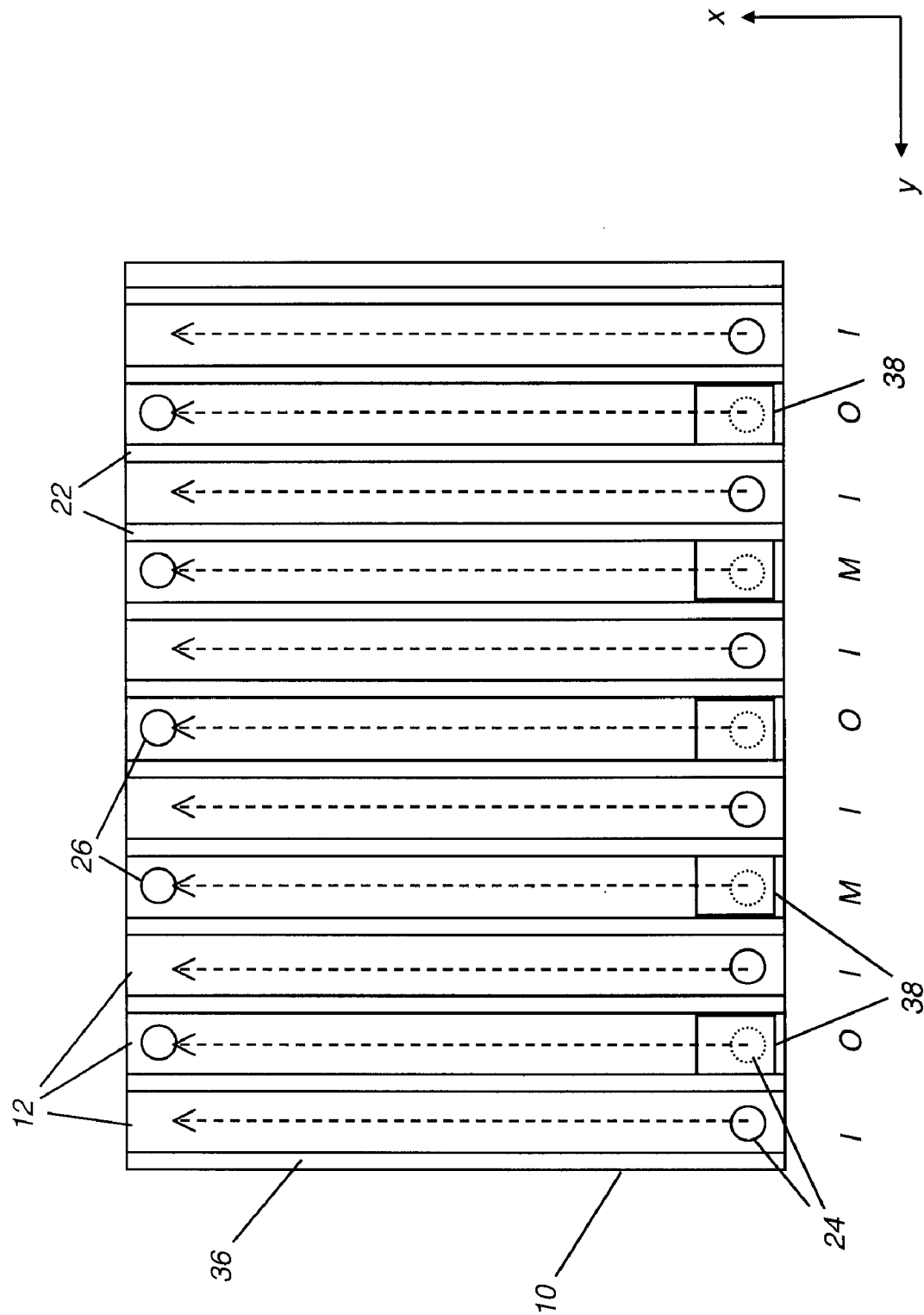
FIG. 9 is a plan view of the output face of a deposition device such as shown in FIG. 3 that can be used in the present process, showing movement of gaseous materials through an arrangement of output channels according to one embodiment of the invention.

The plan view of FIG. 9 shows output face 36 of a portion of a deposition device 10 that can be used in one embodiment. For optimizing directional gas flow in this particular embodiment, redirecting plates 38 may be positioned in each of the output channels 12 for directing reactant gaseous materials. In the embodiment shown, only output channels 12 that deliver reactant gaseous materials are provided with redirecting plates 38 and exhaust ports 26. This particular arrangement may be advantageous in some applications, where it is advantageous to surround deposition device 10 with inert gas, such as to reduce unwanted intake of ambient gases. However, redirecting plates 38 could be used on all output channels 12. Also, exhaust ports 26 could be used on some or all output channels 12. In another possible embodiment, redirecting plates can be used on all channels, but the outlet edge of the redirecting plate may be at a different x-axis position depending upon which channel is considered. In particular, it may be desirable to have the outlet edge position of the baffles for the inert flows to be at lower x-axis positions than those of the reactant gases so that the inert purge flows can serve as mentioned above to isolate the various channels.

FIG. 9 also shows the pattern of output channels in one embodiment. Here, it has been found to be particularly advantageous to provide inert gas channels I as the outermost channels of deposition device 10. Oxidation channels with first reactant gaseous material O are next to the outermost channels, since these condition the surface for ALD reaction with the metallic component of second reactant gaseous material M.

Figure 11A:
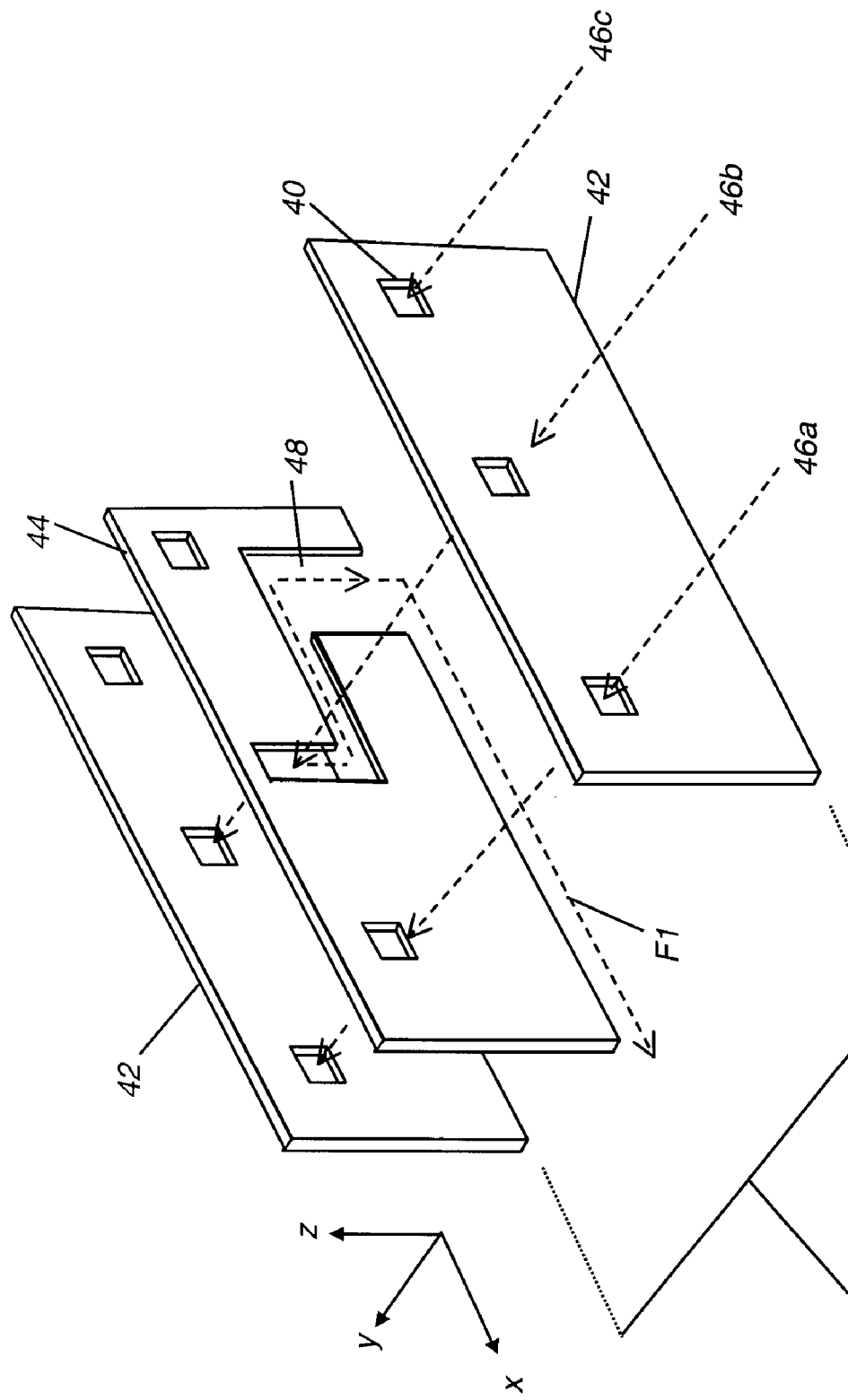
FIGS. 11A and 11B are exploded views of the construction of a deposition device that employs the stacked-plate structure shown in FIG. 10, the exploded views showing two different output channels for different gases used in the process.
Figure 11B:
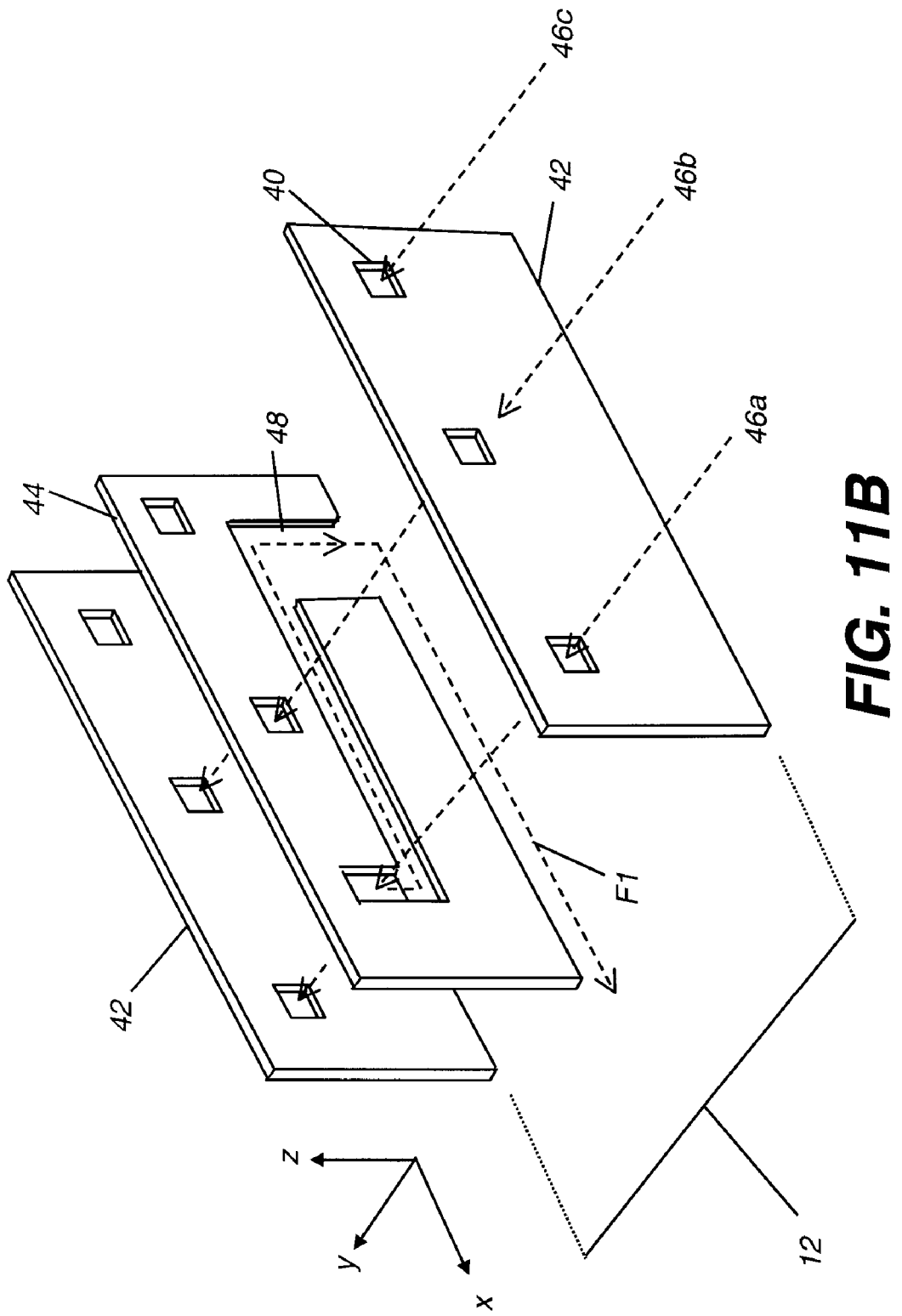

FIG. 10 shows one embodiment of a deposition device 10 that can be used in the present process in which the channels of width W, length L, and height H are formed from stacked metal plates 42 and 44 having apertures 40 forming ducts 46a,b,c. FIG. 11A shows an exploded view of a single output channel 12 section of deposition device 10 formed in this way, showing an arrangement of apertures 40 in alternating partition plates 42 and delivery plates 44. FIG. 11B shows a similar exploded view for an adjacent output channel 12. Ducts 46a, 46b, and 46c, formed by alignment of apertures 40, extend through deposition device 10 and provide input conduits for gaseous flow communication, accepting the different reactant and inert gaseous materials from external sources and providing the redirecting structures that provide gas flows along output face 36 described earlier. Baffles and other redirecting structures are not shown in these figures, but could be provided using stacked plates suitably structured, or applied after the device is assembled.

The exploded views of FIGS. 11A and 11B each show a single output channel 12 formed from stacked plates 42 and 44. In the example of FIG. 11A, output channel 12 shown provides gaseous material provided from duct 46b. Ducts 46a and 46c conduct other gases past this channel in the embodiment shown in FIG. 11A. Delivery plate 44, dimensioned and apertured differently than the partition plates 42 that bound output channel 12, contains a redirecting chamber 48 that redirects a portion of the gas in duct 46b into gas flow F1. In the example of FIG. 11B, output channel 12 shown provides gaseous material provided from duct 46a. Ducts 46b and 46c conduct other gases past this channel in the embodiment shown in FIG. 11B. Plates 42 and 44 should be of a suitable metal for conducting the reactive gaseous materials, such as stainless steel or other metal for example.

It is desirable that when a large number of plates are assembled for such an embodiment, the gas flow delivered to the substrate is uniform across all of the channels delivering a particle flow (I, M, or O). This can be accomplished by proper design of the plates, such as having restrictions in some part of the flow pattern for each plate which are accurately machined to provide a reproducible pressure drop for each channel.

Although the method of stacking plates is a particularly useful way of constructing a deposition device for use in this invention, there are a number of other methods to build such structures and may be useful in alternate embodiments of deposition devices that can be used in the present process. For example, the deposition device for use in the present process may be constructed by direct machining of a metal block, or of several metal blocks adhered together. Furthermore, molding techniques involving internal mold features can be employed, as will be understood by the skilled artisan. A deposition device can also be constructed using any of a number stereolithography techniques.

As can be seen from the example embodiment of FIGS. 10, 11A, and 11B, deposition device 10 can be constructed of very small size, with each output channel 12 having the width of a sheet of metal plating. For example, in one embodiment using the arrangement of FIGS. 10, 11A, and 11B, output channel 12 is about 0.034 inches (0.86 mm) in width W. Output channels 12 for different materials could be fabricated at different thicknesses to obtain width W ranges, preferably from about 0.01 inches (0.25 mm) to about 0.1 inches (2.5 mm) for a compact arrangement. The length L of output channel 12 can vary, depending on the needed uniformity and desired gas pressure. In one embodiment, output channel length L is about 3 inches (75 mm). The height H of output channels 12 formed from extending portions of stacked plates 42 is about 0.1 inches in one embodiment.

Figure 12:
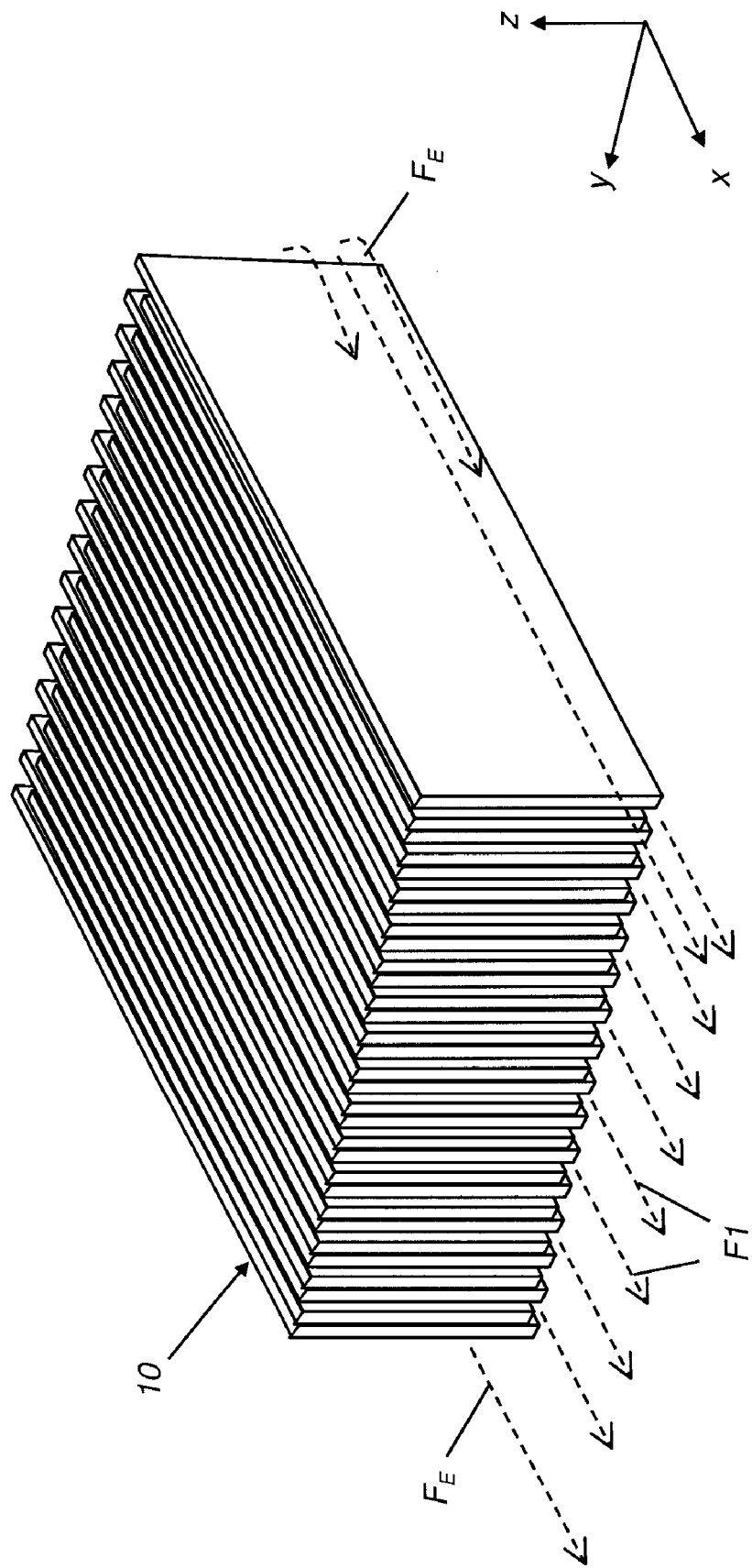
FIG. 12 is a perspective view showing an embodiment using an enveloping shroud of inert gas directed along the perimeter of the deposition device.

Because gas flow can inadvertently draw ambient gases, due to low-pressure zones that are created, it may be useful to provide additional protection barrier from an inert layer. Referring to FIG. 12, there is shown an envelopment gas flow $F_E$ by which an additional flow of inert gas is used on one or more sides of deposition device 10 to prevent ambient gases from contaminating the process gases.

As was particularly described with reference to FIGS. 4A and 4B, deposition device 10 requires movement relative to the surface of substrate 20 in order to perform its deposition function. This relative movement can be obtained in a number of ways, including movement of either or both deposition device 10 and substrate 20, such as by movement of a process that provides a substrate support. Movement can be oscillating or reciprocating or could be continuous movement, depending on how many deposition cycles are needed. Rotation of a substrate can also be used, particularly in a batch process, although continuous processes are preferred.

Typically, ALD requires multiple deposition cycles, building up a controlled film depth with each cycle. Using the nomenclature for types of gaseous materials given earlier, a single cycle can, for example in a simple design, provide one application of first reactant gaseous material O and one application of second reactant gaseous material M.

The distance between output channels for O and M reactant gaseous materials determines the needed distance for reciprocating movement to complete each cycle. For the example deposition device 10 of FIG. 9, having a nominal channel width of 0.034 inches in width W for each output channel 12, reciprocating motion (along the y axis as used herein) of at least 0.20 inches would be required. For this example, an area of substrate 20 would be exposed to both first reactant gaseous material O and second reactant gaseous material M with movement over this distance. In some cases, consideration for uniformity may require a measure of randomness to the amount of reciprocating motion in each cycle, such as to reduce edge effects or build-up along the extremes of reciprocation travel.

A deposition device 10 may have only enough output channels 12 to provide a single cycle. Alternately, deposition device 10 may have an arrangement of multiple cycles, enabling it to cover a larger deposition area or enabling its reciprocating motion over a distance that allows two or more deposition cycles in one traversal of the reciprocating motion distance.

In one embodiment, a given area of the substrate is exposed to a gas flow in a channel for less than 500 milliseconds, preferably less than 100 milliseconds. The relative movement of the substrate to a channel during oscillation is at a speed at least 0.1 cm/sec, and the gas flow in the channels is at least 1 cm/sec. Preferably, the temperature of the substrate during deposition is under 300° C., more preferably under 250° C.

For example, in one particular application, it was found that each O-M cycle formed a layer of one atomic diameter over about ¼ of the treated surface. Thus, four cycles, in this case, are needed to form a uniform layer of 1 atomic diameter over the treated surface. Similarly, to form a uniform layer of 10 atomic diameters in this case, then, 40 cycles would be required.

Figure 13:
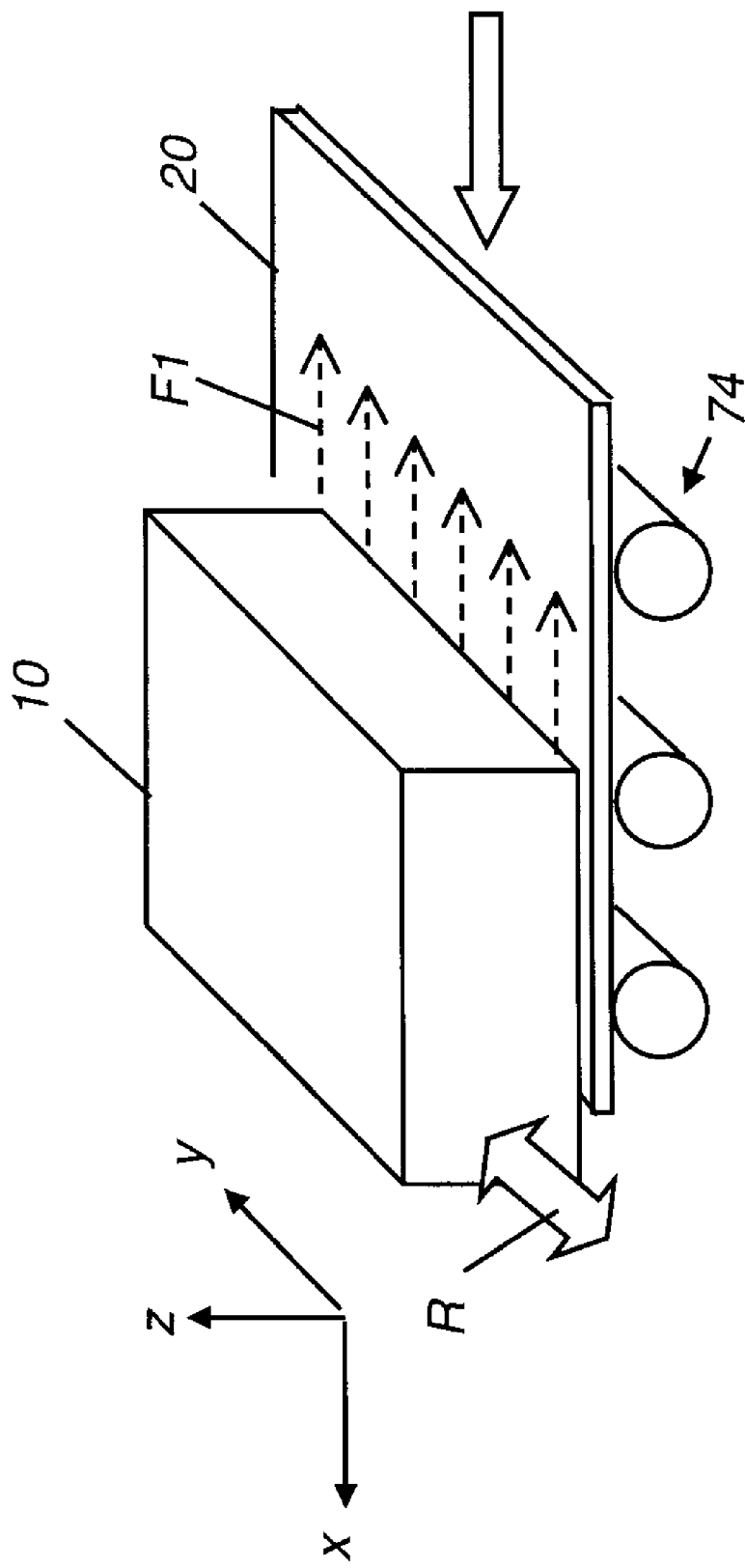
FIG. 13 is a schematic diagram showing an alternative motion pattern for reciprocating and orthogonal movement.

An advantage of the reciprocating motion used for a deposition device 10 used in one embodiment of the present process is that it allows deposition onto a substrate 20 whose area exceeds the area of output face 36. FIG. 13 shows schematically how this broader area coverage can be effected, using reciprocating motion along the y axis as shown by arrow R and also movement orthogonal or transverse to the reciprocating motion, relative to the x axis. Again, it must be emphasized that motion in either the x or y direction, as shown in FIG. 13, can be effected either by movement of deposition device 10, or by movement of substrate 20 provided with a substrate support 74 that provides movement, or by movement of both deposition device 10 and substrate 20.

In FIG. 13 the relative motion of the depositor and the substrate are perpendicular to each other. It is also possible to have this relative motion in parallel. In this case, the relative motion needs to have a nonzero frequency component that represents the oscillation and a zero frequency component that represents the displacement of the substrate. This combination can be achieved by: an oscillation combined with displacement of the deposition device over a fixed substrate; an oscillation combined with displacement of the substrate relative to a fixed substrate deposition device; or any combinations wherein the oscillation and fixed motion are provided by movements of both substrates.

In a preferred embodiment, ALD can be performed at or near atmospheric pressure and over a broad range of ambient and substrate temperatures, preferably at a temperature of under 300° C. Preferably, a relatively clean environment is needed to minimize the likelihood of contamination; however, full "clean room" conditions or an inert gas-filled enclosure would not be required for obtaining good performance when using preferred embodiments of the process of the present invention.

Figure 14:
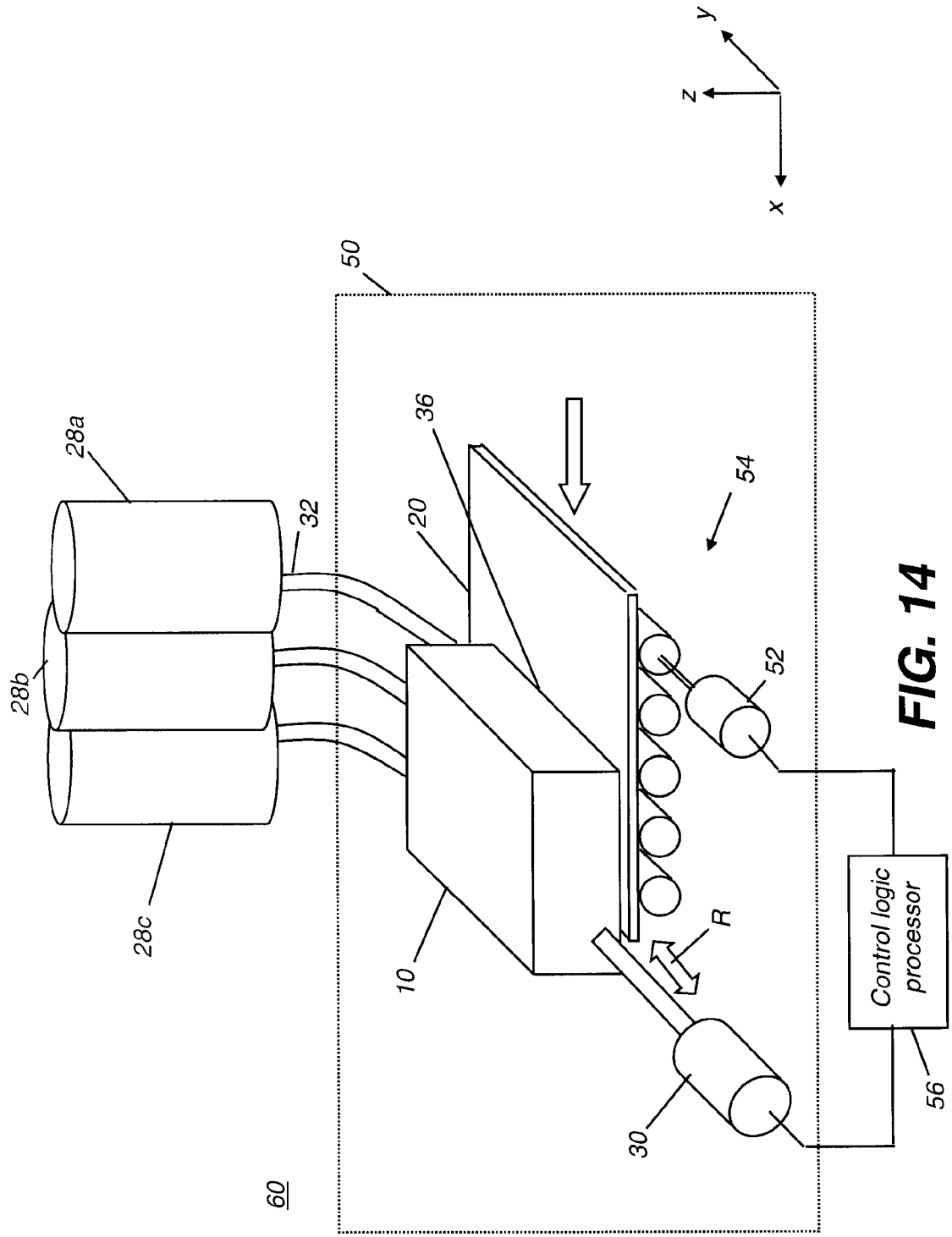
FIG. 14 is a block diagram of one embodiment of a deposition system that uses the process according to the present invention.

FIG. 14 shows an Atomic Layer Deposition (ALD) 60 process, for making a zinc-oxide-based semiconductor, having a chamber 50 for providing a relatively well-controlled and contaminant-free environment. Gas supplies 28a, 28b, and 28c provide the first, second, and third gaseous materials to deposition device 10 through supply lines 32. The optional use of flexible supply lines 32 facilitates ease of movement of deposition device 10. For simplicity, an optional vacuum vapor recovery process and other support components are not shown in FIG. 13 but could also be used. A transport subsystem 54 provides a substrate support that conveys substrate 20 along output face 36 of deposition device 10, providing movement in the x direction, using the coordinate axis system employed in the present disclosure. Motion control, as well as overall control of valves and other supporting components, can be provided by a control logic processor 56, such as a computer or dedicated microprocessor assembly, for example. In the arrangement of FIG. 14, control logic processor 56 controls an actuator 30 for providing reciprocating motion to deposition device 10 and also controls a transport motor 52 of transport subsystem 54.

Figure 15:
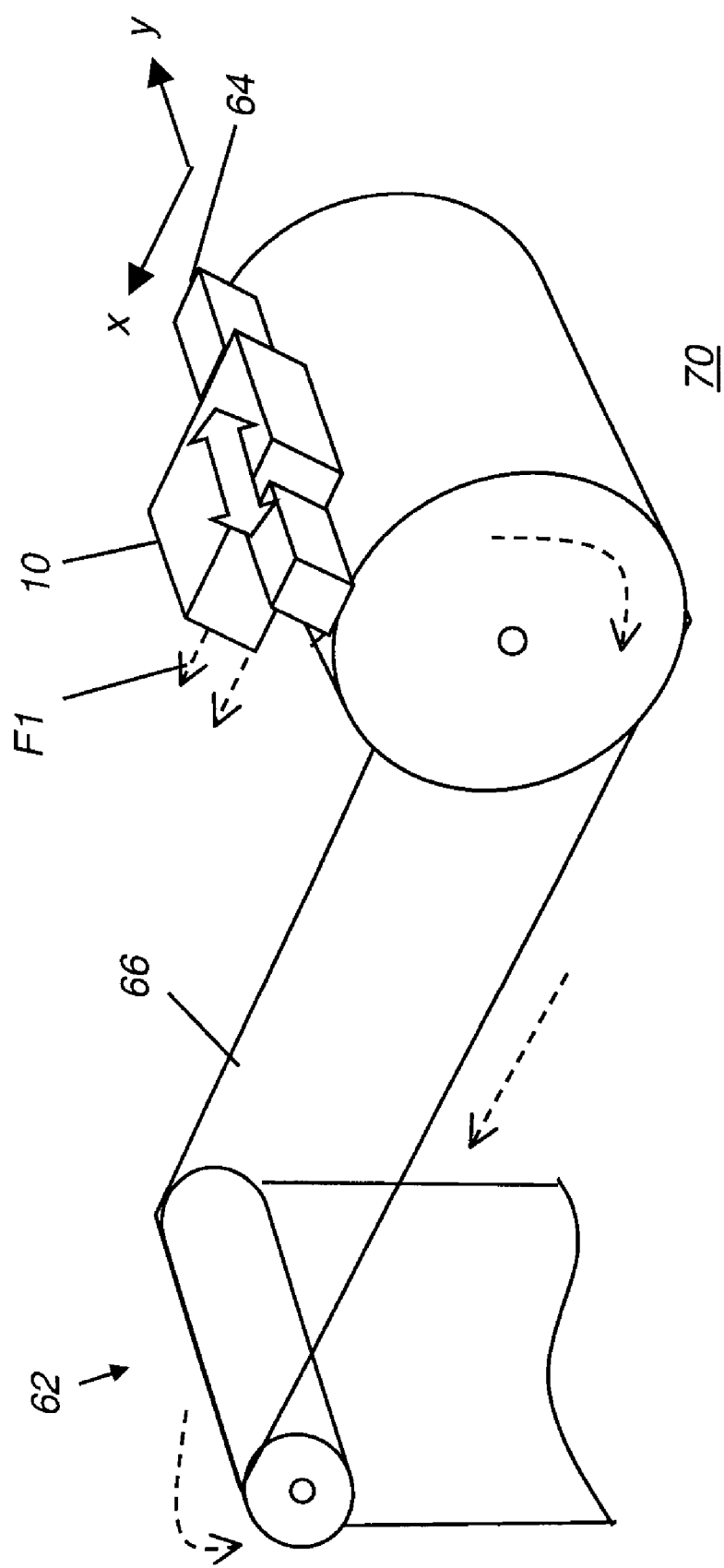
FIG. 15 is a block diagram showing one embodiment of a deposition system applied to a moving web in accordance with the present process.

FIG. 15 shows an alternate embodiment of an Atomic Layer Deposition (ALD) system 70 for thin film deposition of zinc-oxide-based semiconductor onto a web substrate 66 that is conveyed past deposition device 10 along a web conveyor 62 that acts as a substrate support. A deposition device transport 64 conveys deposition device 10 across the surface of web substrate 66 in a direction transverse to the web travel direction. In one embodiment, deposition device transport 64 uses a lead screw that traverses the width of web substrate 66.

In another embodiment, multiple deposition devices 10 are used, at suitable positions along web 62.

Figure 16:
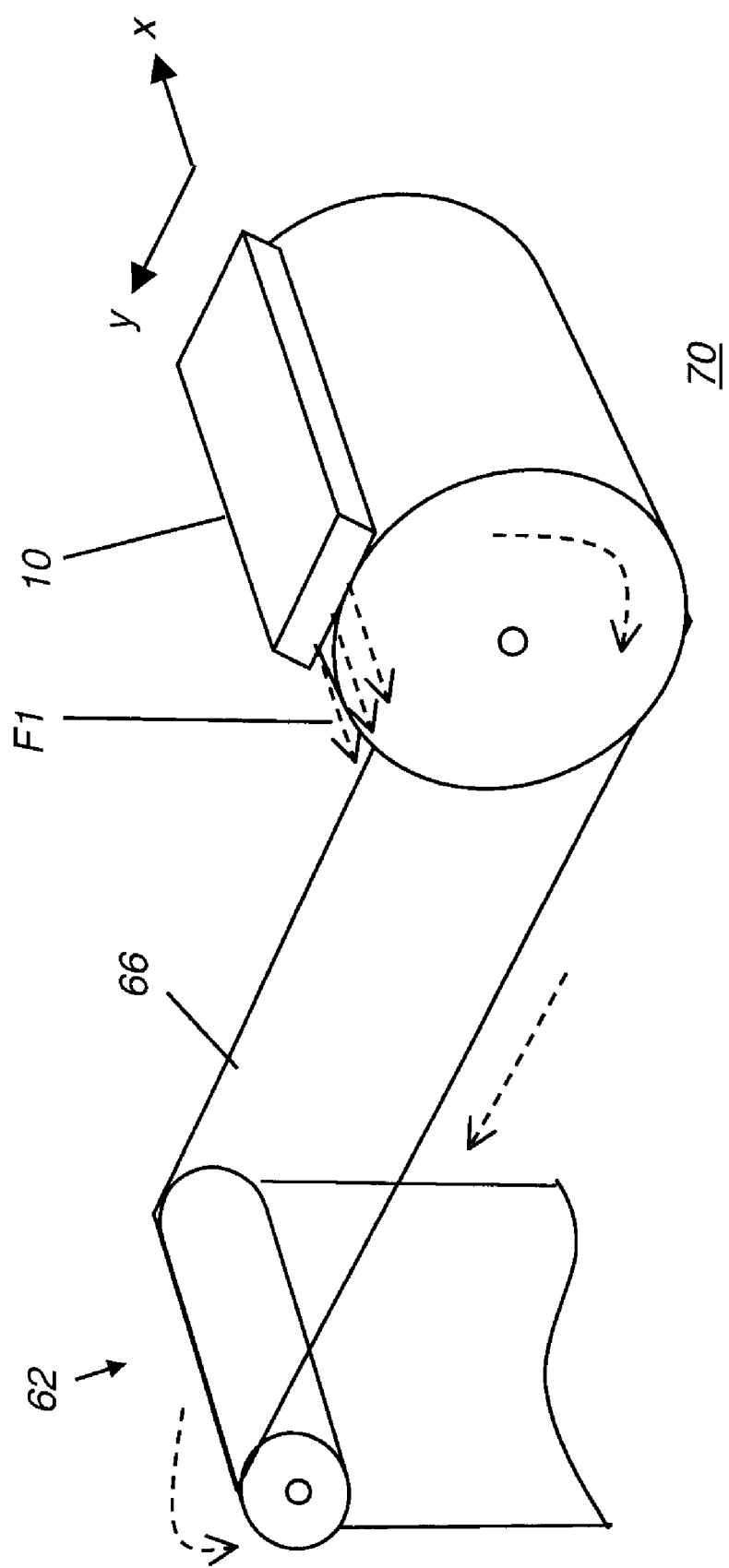
FIG. 16 is a block diagram showing another embodiment of deposition system applied to a moving web in accordance with the present process, with the deposition device stationary.
Figure 17:
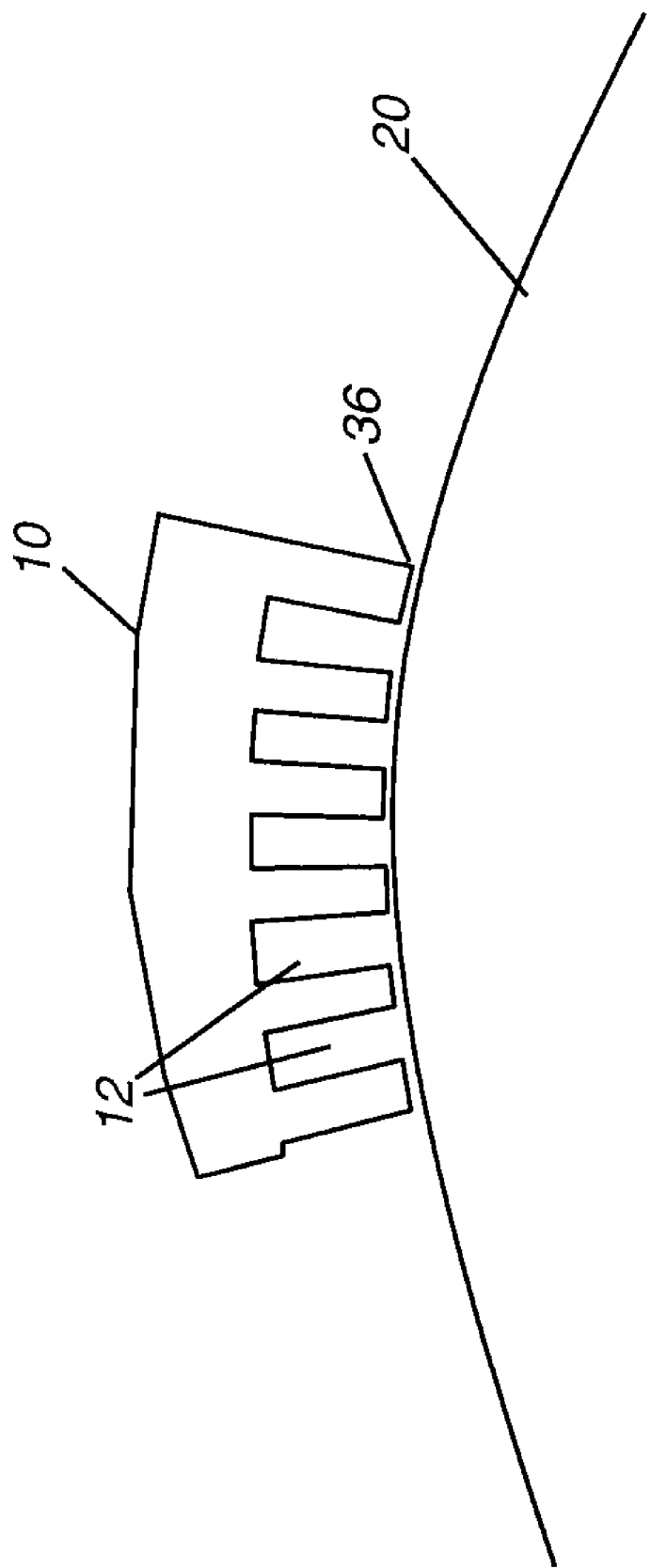
FIG. 17 is a cross-sectional side view of one embodiment of a deposition device with an output face having curvature that can be used in the present process.

FIG. 16 shows another Atomic Layer Deposition (ALD) system 70 for depositing a zinc-oxide-based semiconductor in a web arrangement, using a stationary deposition device 10 in which the flow patterns are oriented orthogonally to the configuration of FIG. 14. In this arrangement, motion of web conveyor 62 itself provides the movement needed for ALD deposition. Reciprocating motion could also be used in this environment, such as by repeatedly reversing the direction of rotation of a web roller to move substrate 66 forward and backwards relative to deposition device 10. Reciprocation motion can also be obtained by allowing a reciprocating motion of the deposition device across an arc whose axis coincides with the roller axis, while the web is moved in a constant motion. Referring to FIG. 17, an embodiment of a portion of deposition device 10 is shown in which output face 36 has an amount of curvature, which might be advantageous for some web coating applications. Convex or concave curvature could be provided.

Optionally, the present process can be accomplished with other apparatus or systems described in more detail in commonly assigned U.S. application Ser. No. 11/392,007, filed Mar. 29, 2006, now U.S. Pat. No. 7,413,982, by Levy et al. and entitled, "PROCESS FOR ATOMIC LAYER DEPOSITION;" U.S. application Ser. No. 11/392,006, filed Mar. 29, 2006, now U.S. Pat. No. 7,456,429, by Levy et al. and entitled "APPARATUS FOR ATOMIC LAYER DEPOSITION;" U.S. application Ser. No. 11/620,744, filed Jan. 8, 2007, now US Publication No. 2009/0130858, by Levy and entitled "DEPOSITION SYSTEM AND METHOD USING A DELIVERY HEAD SEPARATED FROM A SUBSTRATE BY GAS PRESSURE;" and U.S. application Ser. No. 11/620, 740, filed Jan. 8, 2007, now U.S. Pat. No. 7,789,961, by Nelson et al. and entitled "DELIVERY DEVICE COMPRISING GAS DIFFUSER FOR THIN FILM DEPOSITION." All above-identified applications incorporated by reference in their entirety.

In the embodiments in the latter three applications, a delivery device having an output face for providing gaseous materials for thin-film material deposition onto a substrate comprises elongated emissive channels in at least one group of elongated emissive channels, of the three groups of elongated emissive channels (namely, at least one group of: (i) one or more first elongated emissive channels, (i) one or more second elongated channels, and (iii) a plurality of third elongated channels) that is capable of directing a flow, respectively, of at least one of the first gaseous material, second gaseous material, and the third gaseous material substantially orthogonally with respect to the output face of the delivery device, which flow of gaseous material is capable of being provided, either directly or indirectly from each of the elongated emissive channels in the at least one group, substantially orthogonally to the surface of the substrate.

In one embodiment, apertured plates are disposed substantially in parallel to the output face, and apertures on at least one of the apertured plates form the first, second, and third elongated emissive channels. In an alternative embodiment, the apertured plates are substantially perpendicularly disposed with respect to the output face.

In one such embodiment, the deposition device comprises exhaust channels, for example, a delivery device for thin-film material deposition of a zinc-oxide-based semiconductor onto a substrate comprising: (a) a plurality of inlet ports comprising at least a first inlet port, a second inlet port, and a third inlet port capable of receiving a common supply for a first reactive gaseous material, a second reactive gaseous material, and a third (inert purge) gaseous material, respectively; (b) at least one exhaust port capable of receiving exhaust gas from thin-film material deposition and at least two elongated exhaust channels, each of the elongated exhaust channels capable of gaseous fluid communication with the at least one exhaust port; (c) at least three pluralities of elongated output channels, (i) a first plurality of first elongated output channels, (ii) a second plurality of second elongated output channels, and (iii) a third plurality of third elongated output channels, each of the first, second, and third elongated output channels capable of gaseous fluid communication, respectively, with one of the corresponding first inlet port, second inlet port, and third inlet port; wherein each of the first, second, and third elongated output channels and each of the elongated exhaust channels extend in a length direction substantially in parallel; wherein each first elongated output channel is separated on at least one elongated side thereof from a nearest second elongated output channel by a relatively nearer elongated exhaust channel and a relatively less near third elongated output channel; and wherein each first elongated emissive channel and each second elongated emissive channel is situated between relatively nearer elongated exhaust channels and between relatively less nearer elongated emissive channels.

Further embodiments can comprise a gas diffuser associated with at least one group of the three groups of elongated emissive channels such that at least one of the first, second, and third gaseous material, respectively, is capable of passing through the gas diffuser prior to delivery from the delivery device to the substrate, during thin-film material deposition onto the substrate, and wherein the gas diffuser maintains flow isolation of the at least one of first, second, and third gaseous material downstream from each of the elongated emissive channels in the at least one group of elongated emissive channels.

In one embodiment such a gas diffuser is capable of providing a friction factor for gaseous material passing therethrough that is greater than $1 \times 10^2$, thereby providing back pressure and promoting equalization of pressure where the flow of the at least one first, second and third gaseous material exits the delivery device. In one embodiment of the invention, the gas diffuser comprises a porous material through which the at least one of the first, second, and third gaseous material passes. In a second embodiment of the invention, the gas diffuser comprises a mechanically formed assembly comprising at least two elements comprising interconnected passages, for example, in which nozzles are connected to a flow path provided by a thin space between parallel surface areas in the two elements.

In one embodiment, the one or more of the gas flows from the deposition devices provides a pressure that at least contributes to the separation of the surface of the substrate from the face of the delivery head, thereby providing a "floating head" or "air bearing" type deposition head, which can help to stabilize the gas flows and limit intermixing of the gas flows.

The process of the present invention is advantaged in its capability to perform deposition onto a substrate over a broad range of temperatures, including room or near-room temperature in some embodiments. The process of the present invention can operate in a vacuum environment, but is particularly well suited for operation at or near atmospheric pressure.

The production of thin film transistors and electronic devices from the ALD deposited semiconductor materials can be accomplished by conventional techniques known to the skilled artisan. In one embodiment, a substrate is provided, a film or layer of the semiconductor material as described above can be applied to the substrate, and electrical contacts made to the layer. The exact process sequence is determined by the structure of the desired semiconductor component. Thus, in the production of a field effect transistor, for example, a gate electrode can be first deposited on a substrate, for example a vacuum or solution deposited metal or organic conductor. The gate electrode can then be insulated with a dielectric and then source and drain electrodes and a layer of the n-channel semiconductor material can be applied on top. The structure of such a transistor and hence the sequence of its production can be varied in the customary manner known to a person skilled in the art. Thus, alternatively, a gate electrode can be deposited first, followed by a gate dielectric, then the semiconductor can be applied, and finally the contacts for the source electrode and drain electrode deposited on the semiconductor layer. A third structure could have the source and drain electrodes deposited first, then the semiconductor, with dielectric and gate electrode deposited on top.

The skilled artisan will recognize other structures can be constructed and/or intermediate surface modifying layers can be interposed between the above-described components of the thin film transistor. In most embodiments, a field effect transistor comprises an insulating layer, a gate electrode, a semiconductor layer comprising a ZnO material as described herein, a source electrode, and a drain electrode, wherein the insulating layer, the gate electrode, the semiconductor layer, the source electrode, and the drain electrode are in any sequence as long as the gate electrode and the semiconductor layer contact opposite sides of the insulating layer, and the source electrode and the drain electrode both contact the semiconductor layer.

Techniques for fabricating these structures include selective deposition, sequential masking, photolithography, laser, and/or other means known to the skilled artisan.

A thin film transistor (TFT) is an active device, which is the building block for electronic circuits that switch and amplify electronic signals. Attractive TFT device characteristics include a high ratio of the on current to the off current, and a steep subthreshold slope. In the operation of such a TFT device, a voltage applied between the source and drain electrodes establishes a substantial current flow only when the control gate electrode is energized. That is, the flow of current between the source and drain electrodes is modulated or controlled by the bias voltage applied to the gate electrode. The relationship between material and device parameters of the zinc-oxide-based semiconductor TFT can be expressed by the approximate equation (see Sze in *Semiconductor Devices—Physics and Technology*, John Wiley & Sons (1981)):

$$I_d = \frac{W}{2L} \mu \, C_{ox} (V_g - V_{th})^2$$

where $I_d$ is the saturation source-drain current, C is the geometric gate capacitance, associated with the insulating layer, W and L are physical device dimensions, µ is the carrier (hole or electron) mobility in the zinc-oxide-based semiconductor, and $V_g$ is the applied gate voltage, and $V_{th}$ is the threshold voltage. Ideally, the TFT allows passage of current only when a gate voltage of appropriate polarity is applied. However, with zero gate voltage, the "off" current between source and drain will depend on the intrinsic conductivity σ of the zinc-oxide-based semiconductor, $$\sigma = nq\mu$$

where n is the charge carrier density and q is the charge, so that $$(I_{sd})=\sigma(WT/L)V_{sd}@Vg=0$$

wherein t is the zinc-oxide-based semiconductor layer thickness and $V_{sd}$ is the voltage applied between source and drain. Therefore, for the TFT to operate as a good electronic switch, e.g. in a display, with a high on/off current ratio, the semiconductor needs to have high carrier mobility but very small intrinsic conductivity, or equivalently, a low charge carrier density. On/off ratios >$10^4$ are desirable for practical devices.

The TFT structure described herein includes a transparent zinc-oxide-based semiconductor with conducting electrodes, commonly referred to as a source and a drain, for injecting a current into the zinc-oxide-based semiconductor and a capacitance charge injection scheme for controlling and/or modulating the source-drain current. One particularly attractive application of zinc-oxide-based semiconductor TFT's is in the drive circuits for displays on flexible, polymer substrates. Zinc oxide semiconductor transistors and/or transistor arrays are useful in applications including, but not limited to, flat panel displays such as active matrix imagers, sensors, rf price labels, electronic paper systems, rf identification tags and rf inventory tags.

The present invention is preferably used for making an "enhancement-mode transistor" which means a transistor in which there is negligible off-current flow, relative to on-current flow, between a source and a drain at zero gate voltage. In other words, the transistor device is "normally off." (In contrast, a depletion-mode transistor is "normally on" meaning that more than a substantially negligible current flows between a source and a drain at zero gate voltage. Enhancement-mode devices are typically preferred.)

Turning now to FIGS. 20 to 25, with reference to these particular Figures, the terms "over," "above," "under," and the like, with respect to layers in the thin film transistor, refer to the order of the layers, wherein the thin film semiconductor layer is above the gate electrode, but do not necessarily indicate that the layers are immediately adjacent or that there are no intermediate layers. Also the descriptors "top" and "bottom" refer to the disposition of the contact with respect to the semiconductor, with bottom representing closer to the substrate and top representing further from the substrate. "Vertical" means substantially perpendicular to the surface of a substrate.

Described in the embodiments of FIGS. 20 to 25 are enhancement-mode, field effect transistors wherein at least a portion of the transistor structure may be substantially transparent. Accordingly, an optional characteristic of a transistor structure made using the present invention is that selected embodiments of the construct, or a subset thereof that include the semiconductor channel layer and the gate insulator layer, may exhibit an optical transmission of at least about 90%, more particularly at least about 95%, across the visible portion (and/or infrared portion in certain variants) of the electromagnetic spectrum. Each of the additional components of the structure (i.e., substrate, gate electrode, source/drain terminals) may be optionally opaque or substantially transparent depending upon the desired end use of the transistor. In certain embodiments, the transistor structure as a whole (and/or individual components of the transistor) may exhibit an optical transmission of at least about 50%, more particularly at least about 70%, and most particularly at least about 90%, across the visible portion (and/or infrared portion in certain variants) of the electromagnetic spectrum. Because of the optional transparency, transistors made according to the present invention may be advantageously included in optoelectronic display devices as switches coupled to at least one display element, as described in greater detail below.

Figure 20:
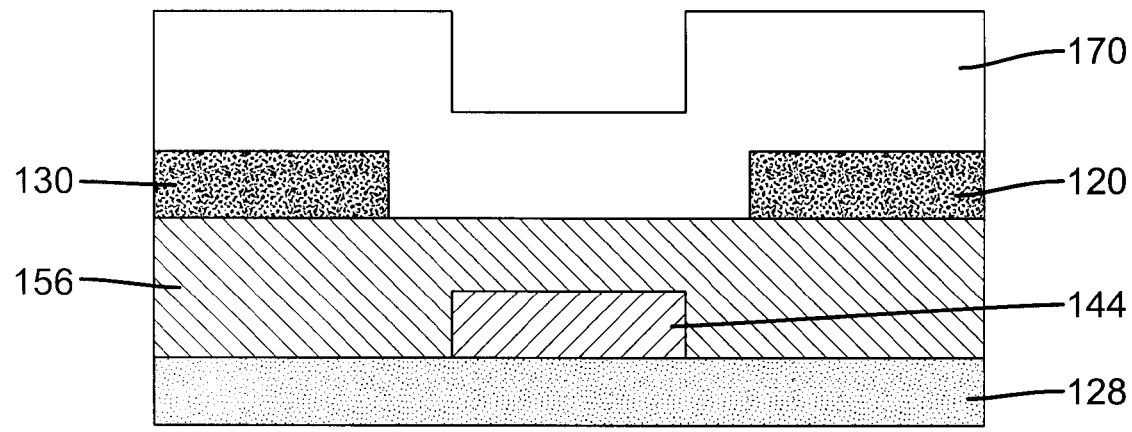
FIG. 20 illustrates a cross-sectional view of a typical thin film transistor having a bottom-gate/bottom-contact configuration.
Figure 21:
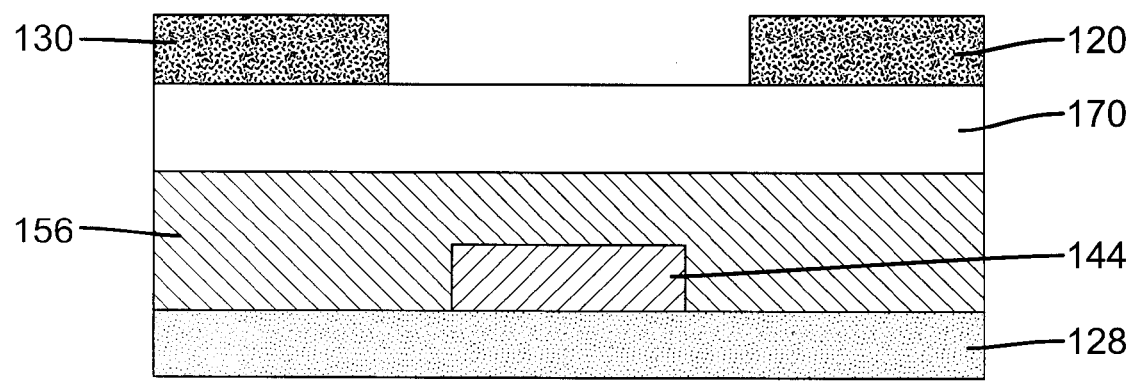
FIG. 21 illustrates a cross-sectional view of a typical thin film transistor having a bottom-gate/top-contact configuration.

Cross-sectional views of typical deposited thin film transistor are shown in FIGS. 20-25. For example, FIG. 20 illustrates a typical bottom contact configuration, and FIG. 21 illustrates a typical top contact configuration.

Each thin film transistor (TFT) in the embodiments of FIGS. 20 and 21 contains a source electrode 120, a drain electrode 130, a gate electrode 144, a gate dielectric 156, a substrate 128, and the semiconductor 170 of the invention in the form of a film connecting the source electrode 120 to drain electrode 130. When the TFT operates in an enhancement-mode, the charges injected from the source electrode into the semiconductor are mobile and a current flows from source to drain, mainly in a thin channel region within about 100 Angstroms of the semiconductor-dielectric interface. See A. Dodabalapur, L. Torsi H. E. Katz, *Science* 1995, 268, 270, hereby incorporated by reference. In the configuration of FIG. 20, the charge need only be injected laterally from the source electrode 120 to form the channel. In the absence of a gate field the channel ideally has few charge carriers; as a result there is ideally no source-drain conduction when the device is in off mode.

The off current is defined as the current flowing between the source electrode 120 and the drain electrode 130 when charge has not been intentionally injected into the channel by the application of a gate voltage. This occurs for a gate-source voltage more negative, assuming an n-channel, than a certain voltage known as the threshold voltage. See Sze in *Semiconductor Devices—Physics and Technology*, John Wiley & Sons (1981), pages 438-443. The on current is defined as the current flowing between the source electrode 120 and the drain electrode 130 when charge carriers have been accumulated intentionally in the channel by application of an appropriate voltage to the gate electrode 144, and the channel is conducting. For an n-channel accumulation-mode TFT, this occurs at gate-source voltage more positive than the threshold voltage. It is desirable for this threshold voltage to be zero, or slightly positive, for n-channel operation. Switching between on and off is accomplished by the application and removal of an electric field from the gate electrode 144 across the gate dielectric 156 to the semiconductor-dielectric interface, effectively charging a capacitor.

Figure 22:
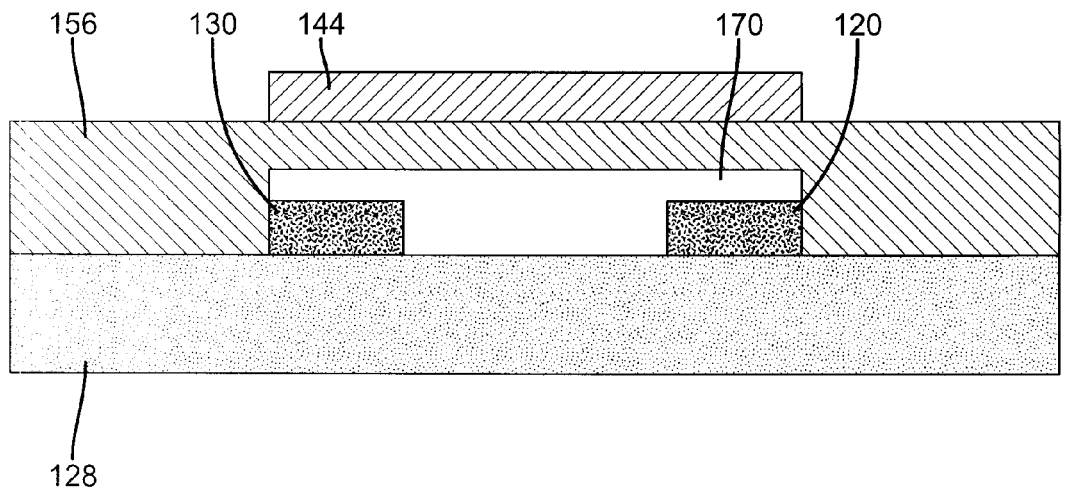
FIG. 22 illustrates a cross-sectional view of a typical thin film transistor having a top-gate/bottom-contact structure.

The specific examples of transistor configurations described herein are for illustrative purposes and should not be considered as limiting the scope of the appended claims. For example, a further (third) specific transistor structure is shown in FIG. 22, in which a third variation of a TFT structure includes an insulating substrate 128 upon which is disposed a source electrode 120 and a drain electrode 130. A semiconductor film 170 is provided such that contact between the source and drain electrodes is made. A gate electrode 144 is disposed on the top surface (from a vertical perspective) of the gate dielectric 156. In other words, the gate electrode 144 and the semiconductor film 170 are provided on opposing surfaces of the gate dielectric 156.

The TFT structure of FIG. 22 may be fabricated, for example, by depositing and patterning a film that defines the source electrode 120 and the drain electrode 130. For instance, a 500 Angstrom ITO source/drain electrode film may be sputtered onto the glass substrate 128. The source and drain patterning may be accomplished via shadow masking or photolithography. The source/drain electrode film could optionally be annealed. The semiconductor film 170 may then be deposited and patterned over the source electrode 120, the drain electrode 130, and the substrate 128. For example, a ZnO-based film may be deposited, and then patterned via photolithography or patterning during deposition.

Subsequently, the gate dielectric 156 may then be deposited and patterned over the semiconductor film 170. For example, a 2000-Angstrom $Al_2O_3$ film may be sputter deposited, and then patterned via shadow masking or photolithography. Vias (not shown) may be formed through the gate dielectric 156 to electrically connect to the source electrode 120 and the drain electrode 130. The $Al_2O_3$ film could optionally be annealed. The gate electrode 144 may then be deposited and patterned over the gate dielectric 156. For example, a 2000 Angstrom ITO film may be sputter deposited, and then patterned via shadow masking or photolithography. The ITO film could optionally be annealed.

Figure 23:
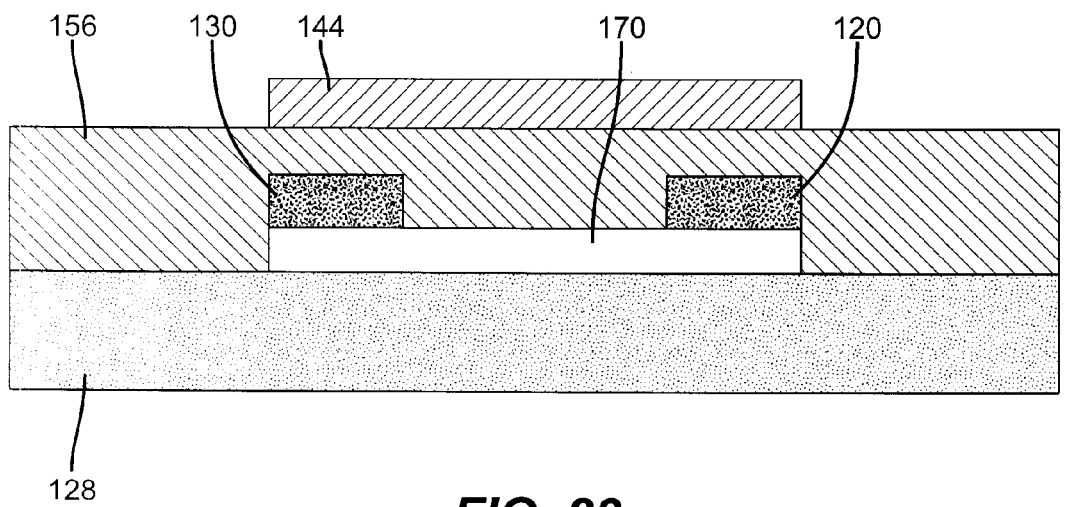
FIG. 23 illustrates a cross-sectional view of a typical thin film transistor having a top-gate/top-contact structure.

Yet a fourth variation of a TFT structure is shown in FIG. 23. This TFT structure includes a substrate 128 upon which is disposed a semiconductor channel layer 170. A source electrode 120 and a drain electrode 130 are provided on a surface of the semiconductor channel layer 170 opposing the surface that is adjacent to the glass substrate 128. A gate dielectric 156 is disposed over the semiconductor channel layer 170, the source electrode 120, and the drain electrode 130. A gate electrode 144 is disposed on the top surface (from a vertical perspective) of the gate dielectric 156. In other words, the gate electrode 144 and the semiconductor channel layer 170 are provided on opposing surfaces of the gate dielectric 156.

The TFT structure of FIG. 23 may be fabricated, for example, by the deposition and patterning of a film that defines the semiconductor channel layer 170. For instance, a 500-Angstrom ZnO-based film may be deposited, and patterned via photolithography. The source electrode 120 and the drain electrode 130 may then be deposited and patterned. For example, a 500-Angstrom Aluminum or Silver, or other metal source/drain electrode film may be deposited in the desired pattern. Subsequently, the gate dielectric 156 may then be deposited and patterned over the semiconductor channel layer 170, the source electrode 120, and the drain electrode 130. For example, a 2000 Ångstrom dielectric may be deposited and patterned or selectively deposited. Vias (not shown) may be formed through the gate dielectric 156 to electrically connect to the source electrode 120 and the drain electrode 130. The gate electrode 144 may then be deposited and patterned over the gate dielectric 156. For example, a 2000 Ångstrom ITO or metal film may be deposited and/or patterned Alternatively, the contacts in the above configuration of FIG. 23 may be made by selectively doping the ends of the semiconductor channel layer with In, Al, Ga, or any other suitable n-type dopant.

A support for supporting the TFT during manufacturing, testing, and/or use can include organic or inorganic materials. For example, the support may comprise inorganic glasses, ceramic foils, polymeric materials, filled polymeric materials, coated metallic foils, acrylics, epoxies, polyamides, polycarbonates, polyimides, polyketones, poly(oxy-1,4-phenyleneoxy-1,4-phenylenecarbonyl-1,4-phenylene) (sometimes referred to as poly(ether ether ketone) or PEEK), polynorbornenes, polyphenyleneoxides, poly(ethylene naphthalenedicarboxylate) (PEN), poly(ethylene terephthalate) (PET), poly(ether sulfone) (PES), poly(phenylene sulfide) (PPS), and fiber-reinforced plastics (FRP). Flexible substrates can also be thin metal foils such as stainless steel provided they are coated with an insulating layer to electrically isolate the thin film transistor. A flexible support, in some embodiments of the present invention, allows for roll processing, which may be continuous, providing economy of scale and economy of manufacturing over flat and/or rigid supports. The flexible support chosen preferably is capable of wrapping around the circumference of a cylinder of less than about 50 cm diameter, more preferably 25 cm diameter, most preferably 10 cm diameter, without distorting or breaking, using low force as by unaided hands. The preferred flexible support may be rolled upon itself. However, if flexibility is not a concern, then the substrate may be a wafer or sheet made of materials including glass and silicon. The thickness of the substrate may vary, and according to particular examples it can range from about 100 µM to about 1 cm.

In some embodiments of the invention, the support may be optional. For example, in a top construction as in FIG. 21, when the gate electrode and/or gate dielectric provides sufficient support for the intended use of the resultant TFT, the support is not required. In addition, the support may be combined with a temporary support. In such an embodiment, a support may be detachably adhered or mechanically affixed to the support, such as when the support is desired for a temporary purpose, e.g., manufacturing, transport, testing, and/or storage. For example, a flexible polymeric support may be adhered to a rigid glass support, from which support could be removed.

The gate electrode can be any useful conductive material. A variety of gate materials known in the art, are also suitable, including metals, degenerately doped semiconductors, conducting polymers, and printable materials such as carbon ink, silver-epoxy, or sinterable metal nanoparticle suspensions. For example, the gate electrode may comprise doped silicon, or a metal, such as aluminum, chromium, gold, silver, nickel, copper, tungsten, palladium, platinum, tantalum, and titanium. Gate electrode materials can also include transparent conductors such as indium-tin oxide (ITO), ZnO, $SnO_2$, or $In_2O_3$. Conductive polymers also can be used, for example polyaniline, poly(3,4-ethylenedioxythiophene)/poly(styrene sulfonate) (PEDOT:PSS). In addition, alloys, combinations, and multilayers of these materials may be useful.

The thickness of the gate electrode may vary, and according to particular examples it can range from about 50 to about 1000 nm. The gate electrode may be introduced into the structure by chemical vapor deposition, sputtering, evaporation and/or doping, or solution processing.

The same material can provide the gate electrode function and also provide the support function of the support. For example, doped silicon can function as the gate electrode and support the TFT.

The gate dielectric is provided in contact with the gate electrode. This gate dielectric electrically insulates the gate electrode from the balance of the TFT device. Thus, the gate dielectric comprises an electrically insulating material. The gate dielectric should have a suitable dielectric constant that can vary widely depending on the particular device and circumstance of use. For example, a dielectric constant from about 2 to 100 or even higher is known for a gate dielectric. Useful materials for the gate dielectric may comprise, for example, an inorganic electrically insulating material. The gate dielectric may comprise a polymeric material, such as polyvinylidenedifluoride (PVDF), cyanocelluloses, polyimides, etc. The gate electric may comprise a plurality of layers of different materials having different dielectric constants.

Specific examples of materials useful for the gate dielectric include strontiates, tantalates, titanates, zirconates, aluminum oxides, silicon oxides, tantalum oxides, titanium oxides, silicon nitrides, barium titanate, barium strontium titanate, barium zirconate titanate, zinc selenide, and zinc sulfide. In addition, alloys, combinations, and multilayers of these examples can be used for the gate dielectric. Of these materials, aluminum oxides, silicon oxides, and zinc selenide are preferred. In addition, polymeric materials such as polyimides, polyvinyl alcohol, poly(4-vinylphenol), polyimide, and poly(vinylidene fluoride), polystyrene and substituted derivatives thereof, poly(vinyl naphthalene) and substituted derivatives, and poly(methyl methacrylate) and other insulators having a suitable dielectric constant.

The gate dielectric can be provided in the TFT as a separate layer, or formed on the gate such as by oxidizing the gate material to form the gate dielectric. The dielectric layer may comprise two or more layers having different dielectric constants. Such insulators are discussed in U.S. Pat. No. 5,981, 970 hereby incorporated by reference and copending U.S. application Ser. No. 11/088,645, hereby incorporated by reference. Gate insulator materials typically exhibit a band-gap of greater than about 5 eV.

The thickness of the gate insulator layer may vary, and according to particular examples it can range from about 10 to about 300 nm. The gate dielectric layer may be introduced into the structure by techniques such as chemical vapor deposition, sputtering, atomic layer deposition, or evaporation, solution.

Source/drain terminals refer to the terminals of a TFT, between which conduction occurs under the influence of an electric field. Designers often designate a particular source/drain terminal to be a "source" or a "drain" on the basis of the voltage to be applied to that terminal when the TFT is operated in a circuit.

The source electrode and drain electrode are separated from the gate electrode by at least the gate dielectric, while the zinc-oxide-based semiconductor layer can be over or under the source electrode and drain electrode. The source and drain electrodes can be any useful conductive material. Useful materials include most of those materials described above for the gate electrode, for example, aluminum, barium, calcium, chromium, gold, silver, nickel, palladium, platinum, titanium, copper, tungsten, polyaniline, PEDOT:PSS, other conducting polymers, alloys thereof, combinations thereof, and multilayers thereof. Other illustrative materials include transparent, n-type conductors such as indium-tin oxide (ITO), ZnO, $SnO_2$, or $In_2O_3$. Preferred electrodes are silver, gold, PEDOT:PSS, or aluminum.

The source electrode and drain electrode can be provided by any useful means such as chemical or physical vapor deposition (e.g., thermal evaporation, sputtering), evaporation, ink jet printing, or doping of the semiconductor channel layer material via diffusion or ion implantation and solution deposition. The patterning of these electrodes can be accomplished by known methods such as shadow masking, additive photolithography, subtractive photolithography, printing, microcontact printing, and pattern coating. The source and drain terminals may be fabricated such that they are geometrically symmetrical or non-symmetrical.

Electrical contact to the gate electrode, source, drain and substrate may be provided in any manner. For example, metal lines, traces, wires, interconnects, conductors, signal paths and signaling mediums may be used for providing the desired electrical connections. The related terms listed above, are generally interchangeable, and appear in order from specific to general. Metal lines, generally aluminum (Al), copper (Cu) or an alloy of Al and Cu, are typical conductors that provide signal paths for coupling or interconnecting, electrical circuitry. Conductors other than metal may also be utilized.

In cases where another layer covers the electrical contact of interest, connection to the electrical contact can be made by creating a "via" that penetrates to the contact. Such vias can be made by convenient patterning operations such as lithography, etching, or laser based processes.

An illustrative n-channel operation of the transistor involves applying a positive voltage to the gate electrode, grounding the source, and applying a positive voltage to the drain. For example, a voltage of about 5 to about 40 V may be applied to the gate electrode and the drain during operation. The threshold voltage may range from about -minus 10 to about 20 V, although devices can operate with larger ranges. Electrons flow from the source, along the semiconductor thin film, and out of the transistor through the drain. The effective mobility of the electrons may vary depending upon the specific structure, but typically should be greater than 0.01 $cm^2V^{-1}s^{-1}$ for useful practical applications. Simply by removing the positive voltage applied to the gate electrode turns the transistor off when the transistor is an enhancement-mode transistor.

Electronic devices in which TFTs and other devices are useful include, for example, more complex circuits, e.g., shift registers, integrated circuits, logic circuits, smart cards, memory devices, radio-frequency identification tags, backplanes for active matrix displays, active-matrix displays (e.g. liquid crystal or OLED), solar cells, ring oscillators, and complementary circuits, such as inverter circuits, for example, in combination with other transistors made using available p-type organic semiconductor materials such as pentacene. In an active matrix display, a transistor according to the present invention can be used as part of voltage hold circuitry of a pixel of the display. In devices containing the TFTs, such TFTs are operatively connected by means known in the art.

One example of a microelectronic device is an active-matrix liquid-crystal display (AMLCD). One such device is an optoelectronic display that includes elements having electrodes and an electro-optical material disposed between the electrodes. A connection electrode of the transparent transistor may be connected to an electrode of the display element, while the switching element and the display element overlap one another at least partly. An optoelectronic display element is here understood to be a display element whose optical properties change under the influence of an electrical quantity such as current or voltage such as, for example, an element usually referred to as liquid crystal display (LCD). The presently detailed transistor has sufficient current carrying capacity for switching the display element at such a high frequency that the use of the transistor as a switching element in a liquid crystal display is possible. The display element acts in electrical terms as a capacitor that is charged or discharged by the accompanying transistor. The optoelectronic display device may include many display elements each with its own transistor, for example, arranged in a matrix. Certain active matrix pixel designs, especially those supplying a display effect that is current driven, may require several transistors and other electrical components in the pixel circuit.

Figure 24:
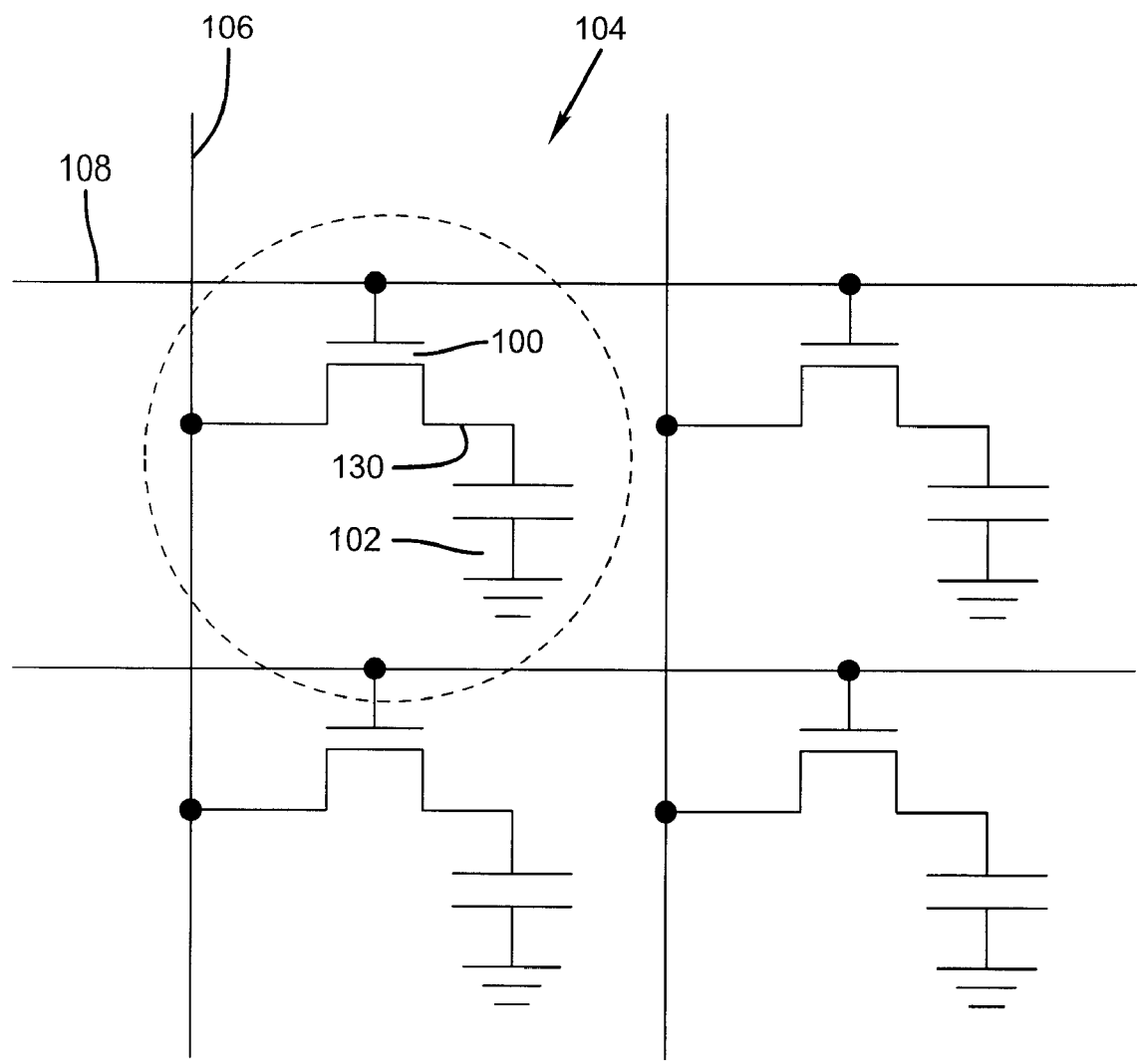
FIG. 24 illustrates a typical active matrix pixel design comprising a select transistor and capacitor representing the capacitance due to display design.

One specific example of a basic AMLCD cell circuit is depicted in FIG. 24. The AMLCD cell circuit includes a transistor 100 as presently described, and a LCD pixel 102 electrically coupled thereto. The transistor 100 and the LCD pixel 102 together form a transistor/pixel cell 104. In the arrangement shown, the transistor 100 is electrically coupled to the LCD pixel 102 via the drain electrode 130. The gate electrode of the transistor 100 is electrically coupled to a row or control line 108 (also referred to as a select or gate line) that receives on/off input for the transistor 100. The source electrode of the transistor 100 is electrically coupled to a column or data line 106 that receives a signal for controlling the LCD pixel 102. Each LCD pixel 102 can also be viewed as a capacitor representing the capacitance according to display design.

Figure 25:
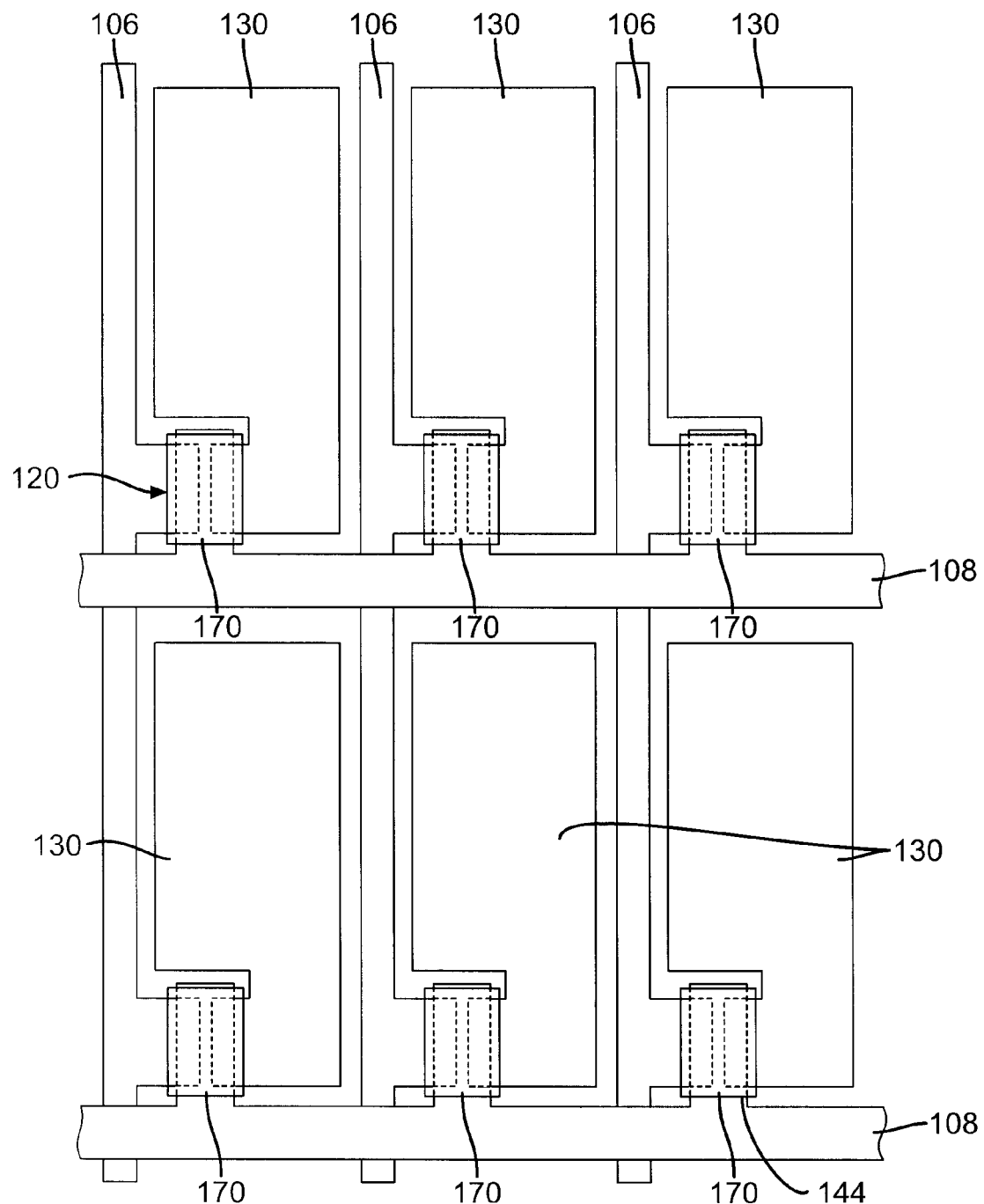
FIG. 25 illustrates a typical pixel layout comprising data lines, control lines, thin film transistors, and pixel conductor pads.

FIG. 25 shows a typical pixel layout in which data lines 106 lead to individual source electrodes 120, control lines 108 lead to individual gate electrodes 144, semiconductors 170, and drain electrodes 130 each forming a pixel conductor pad.

EXAMPLES

Description of the Coating Apparatus

Figure 18:
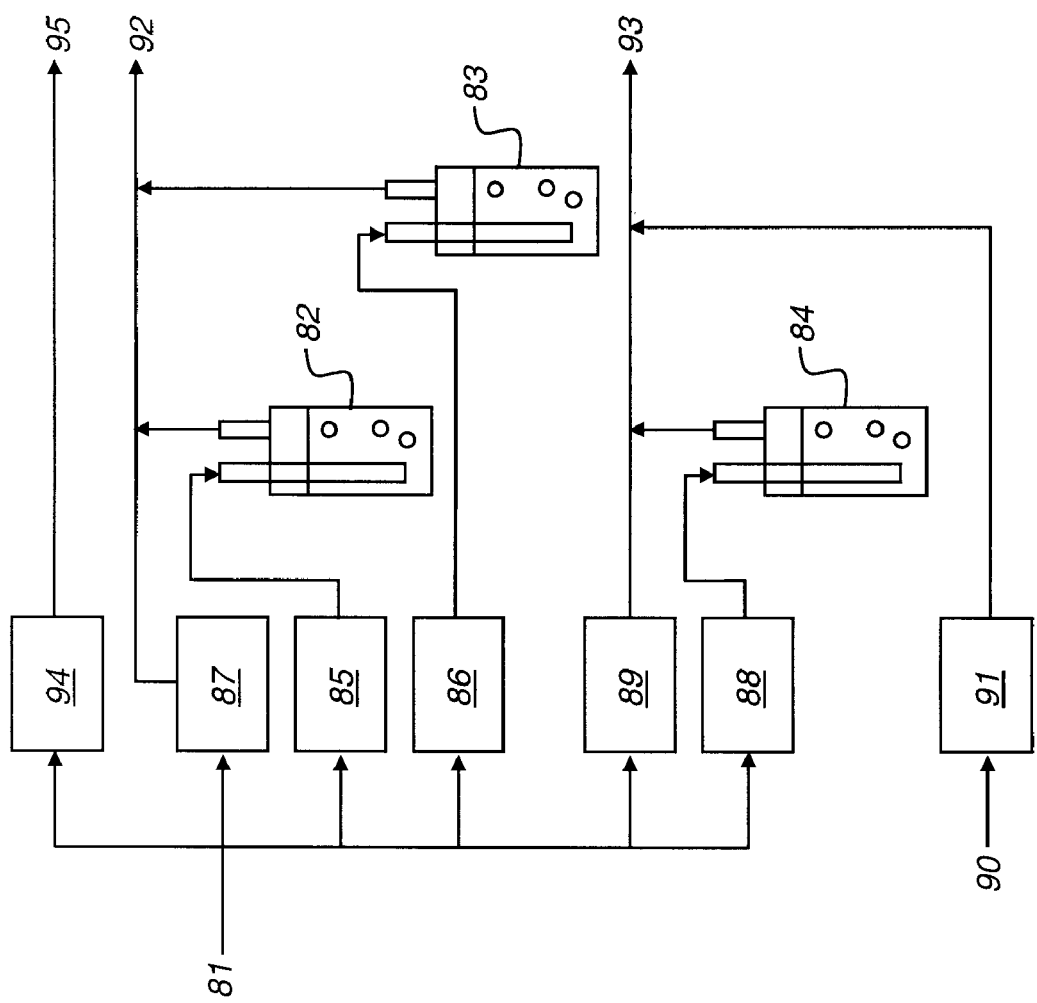
FIG. 18 is a block diagram of the source materials for a thin film deposition process according to the Examples.

All of the following thin film examples employ a flow setup as indicated in FIG. 18. The flow setup is supplied with nitrogen gas flow 81 that has been purified to remove oxygen and water contamination to below 1 ppm. The gas is diverted by a manifold to several flow meters which control flows of purge gases and of gases diverted through bubblers to select the reactive precursors. In addition to the nitrogen supply, air flow 90 is also delivered to the apparatus. The air is pretreated to remove moisture.

The following flows are delivered to the ALD coating apparatus: metal (zinc) precursor flow 92 containing metal precursors diluted in nitrogen gas; oxidizer-containing flow 93 containing non-metal precursors or oxidizers diluted in nitrogen gas; nitrogen purge flow 95 composed only of the inert gas. The composition and flows of these streams are controlled as described below.

Gas bubbler 82 contains diethylzinc. Gas bubbler 83 contains trimethylaluminum. Both bubblers are kept at room temperature. Flow meters 85 and 86 deliver flows of pure nitrogen to the diethylzinc bubbler 82 and trimethylaluminum bubbler 83, respectively. The output of the bubblers now contain nitrogen gas saturated with the respective precursor solutions. These output flows are mixed with a nitrogen gas dilution flow delivered from flow meter 87 to yield the overall flow of metal precursor flow 92. In the following examples, the flows will be as follows:

Flow meter 85: To Diethylzinc Bubbler Flow
Flow meter 86: To Trimethylaluminum Bubbler Flow
Flow meter 87: To Metal Precursor Dilution Flow Gas bubbler 84 contains pure water for the control (or ammonia in water for the inventive example) at room temperature. Flow meter 88 delivers a flow of pure nitrogen gas to gas bubbler 84, the output of which represents a stream of saturated water vapor. An airflow is controlled by flow meter 91. The water bubbler output and air streams are mixed with dilution stream from flow meter 89 to produce the overall flow of oxidizer-containing flow 93 which has a variable water composition, ammonia composition, oxygen composition, and total flow. In the following examples, the flows will be as follows:

Flow meter 88: To Water Bubbler
Flow meter 89: To Oxidizer Dilution Flow
Flow meter 91: To Air Flow
Flow meter 94 controls the flow of pure nitrogen that is to be delivered to the coating apparatus.

Figure 19:
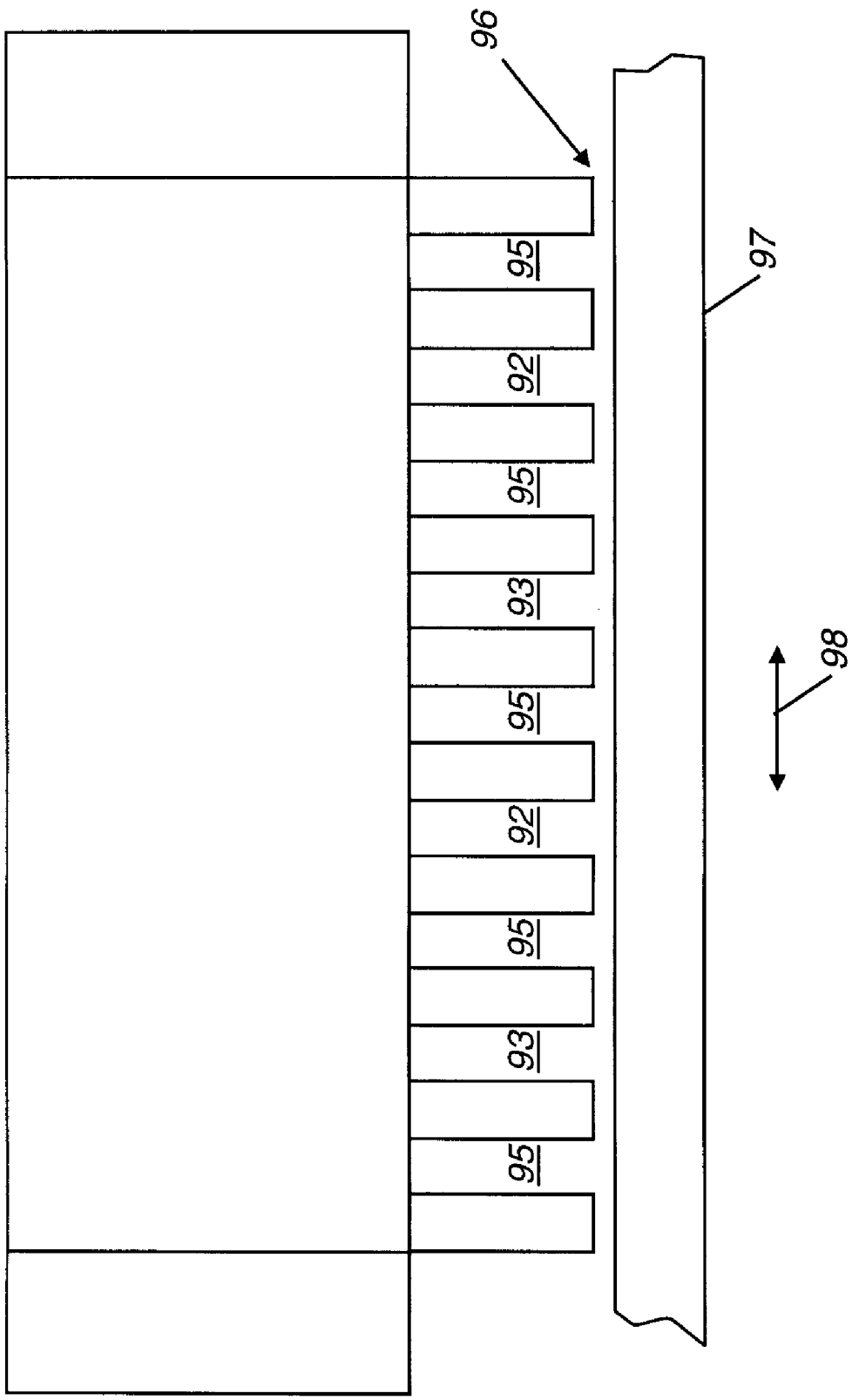
FIG. 19 is a cross-sectional side view of the a deposition device used in the present process, showing the arrangement of gaseous materials provided to a substrate that is subject to thin film deposition process of the Examples.

Streams or Flows 92, 93, and 95 are then delivered to an atmospheric pressure coating head where they are directed out of the channels or microchamber slots as indicated in FIG. 19. A gap 96 of approximately 0.15 mm exists between the elongated channels and the substrate 97. The microchambers are approximately 2.5 mm tall, 0.86 mm wide, and run the length of the coating head which is 76 mm. The reactant materials in this configuration are delivered to the middle of the slot and flow out of the front and back.

In order to perform a deposition, the coating head is positioned over a portion of the substrate and then moved in a reciprocating fashion over the substrate, as represented by the arrow 98. The length of the reciprocation cycle was 32 mm. The rate of motion of the reciprocation cycle is 30 mm/sec.

The following characterization is used:

Description of Transistor Measurement and Analysis

Transistor characterization of the fabricated devices fabricated using the present invention was performed with a Hewlett Packard HP 4156 parameter analyzer. Device testing was done in air in a dark enclosure.

The results were typically averaged from several devices. For each device, the drain current (Id) was measured as a function of source-drain voltage (Vd) for various values of gate voltage (Vg). Furthermore, for each device the drain current was measured as a function of gate voltage for various values of source-drain voltage. For most devices, Vg was swept from −10 V to 30 V for each of the drain voltages measured, typically 10 V, 20 V, and 30 V. Mobility measurements were taken from the 30 V sweep.

Parameters extracted from the data include field-effect mobility (μ), threshold voltage (Vth), and the ratio of Ion/Ioff for the measured drain current. These measurements can be taken without any protective film on the semiconductor thin film, yielding substantially the same results with or without the protective film. The field-effect mobility was extracted in the saturation region, where Vd>Vg−Vth. In this region, the drain current is given by the equation (see Sze in *Semiconductor Devices—Physics and Technology*, John Wiley & Sons (1981)):

$$I_d = \frac{W}{2L} \mu\, C_{ox} (V_g - V_{th})^2$$

where, W and L are the channel width and length, respectively, and $C_{ox}$ is the capacitance of the dielectric layer, which is a function of dielectric thickness and dielectric constant of the material. Given this equation, the saturation field-effect mobility was extracted from a straight-line fit to the linear portion of the $\sqrt{I_d}$ versus Vg curve. The threshold voltage, $V_{th}$, is the x-intercept of this straight-line fit.

The log of the drain current as a function of gate voltage was plotted. Parameters extracted from the log $I_d$ plot include the $I_{on}/I_{off}$ ratio. The $I_{on}/I_{off}$ ratio is simply the ratio of the maximum to minimum drain current. For the purpose of the claimed invention, the on/off ratio is measured by the ratio of the on current, defined as the drain current at a gate voltage of 10 V in excess of the threshold voltage, to the off current, defined as the drain current at a gate voltage for which the transistor is in an off state. The measurements in the present examples were taken in excess of 10V which would result in minor changes to the measurement.

Materials Used:

(1) Conductive ITO substrate (100 nm thick on soda lime glass, commercially available from MBC, product #255.

(2) Me$_3$Al (commercially available from Aldrich Chemical Co.).

(3) Et$_2$Zn (commercially available from Aldrich Chemical Co.).

(4) Ammonium Hydroxide [aqueous ammonia], (reagent grade, ~29 weight % ammonia, commercially available from J. T. Baker Chemical Co.).

Comparative Example 1

Preparation of Undoped ZnO Semiconductor Layer Using Atmospheric Pressure ALD Process This example describes the preparation of a thin film transistor device (TFT) that is comprised of a glass substrate, an ITO gate electrode, a 1100 Å thick Al2O3 dielectric layer, a 200 Å thick, undoped ZnO layer having evaporated Al metal source/drain contacts. The device used to prepare the $Al_2O_3$ and ZnO layers has been described in detail in FIGS. 5 to 12 herein. A 2.5×2.5 inch square (62.5 mm square) piece of ITO coated glass was positioned on the platen of this device, held in place by a vacuum assist and heated to 200° C. The platen with the glass substrate was positioned under the coating head that directs the flow of the active precursor gasses. The spacing between the ITO substrate and the coating head was adjusted using a micrometer to 30 microns.

The coating head has isolated channels through which flow: (1) inert nitrogen gas; (2) a mixture of nitrogen, air and water vapor; (3) a mixture of active metal alkyl vapor ($Me_3Al$ or $Et_2Zn$) in nitrogen. The flow rate of the active metal alkyl vapor was controlled by bubbling nitrogen through the pure liquid ($Me_3Al$ or $Et_2Zn$) contained in an airtight bubbler by means of individual mass flow control meters. The flow of water vapor was controlled by adjusting the bubbling rate of nitrogen passed through pure water in a bubbler. The temperature of the coating head was maintained at 40° C. Adjusting the flow rates of the individual gasses to the settings shown in Table 1, example 1 below, the coating process was initiated by oscillating the coating head across the substrate for the number of cycles specified. For examples 1, 2 and 3, a common layer of $Al_2O_3$ dielectric was deposited on the ITO substrate using the process parameters for layer A in Table 1 below.

Example 2

Preparation of Nitrogen-Doped ZnO Semiconductor Layer Using Atmospheric Pressure ALD Process The preparation of the nitrogen-doped ZnO layer in this example is identical to that in Example 1 except that the pure water in the bubbler in that example is replaced by a solution of ammonia in water, at the concentration specified in Table 1 below.

TABLE 1

| Sample | Layer | $Me_3Al$* | $Et_2Zn$* | Water | Ammonia/Water** | Air* | $N_2$ with Metal Alkyl | $N_2$ with Air | $N_2$ Inert Purge | Cycles |
|---|---|---|---|---|---|---|---|---|---|---|
| A | $Al_2O_3$ | 8 | 0 | 8 | 0 | 4.8 | 620 | 1100 | 1500 | 300 |
| 1 | ZnO 200 Å | 0 | 6 | 8 | 0 | 4.8 | 620 | 1100 | 1500 | 160 |
| 2 | N-Doped ZnO 200 Å | 0 | 6 | 0 | 8 | 4.8 | 620 | 1100 | 1500 | 160 |

*Flow values in sccm (standard cubic centimeters/min)
**15% $NH_3$ by weight in water Aluminum source and drain contacts were evaporated on the resulting multilayer device through a shadow mask, yielding thin film transistors with a channel length of 50, 100 or 150 μm and a channel width of 500 μm. A photolithographic process was used to isolate devices on the substrate, producing islands of ZnO. Electrical test results for the above devices are shown below in Table 2:

TABLE 2

| Sample | Average Mobility ($cm^2/Vs$) | Average $I_{On}/I_{Off}$ |
|---|---|---|
| 1 | 7.54 | $1.7 \times 10^4$ |
| 2 | 15.52 | $3.6 \times 10^8$ |

The experiment showed that the N-doping of the ZnO semiconductor layer provides a substantial increase in both the average mobility and the average $I_{on}/I_{off}$ ratio.

Example 3

This example describes the preparation of devices made using a range of $NH_3$ concentrations in water. This experiment is similar to that described in example 1 except that the concentration of ammonia in the water bubbler solution was varied from 0 to 29 weight percent. The ammonia concentration used varied as in Table 3.

TABLE 3

| Sample | Ammonia Concentration weight % in water |
|---|---|
| 3A | 0 |
| 3B | 0.73 |
| 3C | 3.6 |
| 3D | 29 |

TABLE 4

| Sample | Average Mobility | Subthreshold Slope | Average Ion/Ioff |
|---|---|---|---|
| 3A | 5.43 | 3.14 | $1.9 \times 10^6$ |
| 3B | 6.47 | 1.35 | $8.1 \times 10^7$ |
| 3C | 7.42 | 1.41 | $5.3 \times 10^7$ |
| 3D | 4.17 | 1.03 | $2.3 \times 10^8$ |

The data in Table 4 above show that the higher levels of ammonia during the ZnO deposition have a substantial improvement in on/off ratio. The experiment also showed that the higher levels of ammonia during the ZnO deposition have a substantial improvement in subthreshold slope and mobility as the concentration of ammonia was increased up to a point and then it appeared to drop (for mobility only) at the highest ammonia concentration.

Example 4

The purpose of this example is to demonstrate that by using N-doping in ZnO layers that it is possible to prepare TFTs that have a broad range of useful electrical properties. The samples were prepared in a fashion identical to that in Example 2, Sample 2 except that the number of cycles that the coating head made (hence the thickness of the ZnO layer) was varied from 50 to 200 (63 to 250 Angstroms thick. All samples in this example were prepared with 14.5 weight % ammonia in the water bubbler), see Table 5 below.

TABLE 5

| Sample | Cycles | ZnO Layer Thickness, Å | Mobility cm$^2$/V * s | $I_{on}/I_{off}$ |
|---|---|---|---|---|
| 4A | 50 | 63 | 5.05 | $1.0 \times 10^8$ |
| 4B | 80 | 100 | 4.57 | $4.6 \times 10^7$ |
| 4C | 125 | 156 | 11.8 | $5.8 \times 10^8$ |
| 4D | 160 | 200 | 15.5 | $3.6 \times 10^8$ |
| 4E | 200 | 250 | 12.7 | $1.3 \times 10^9$ |

Example 5

The purpose of this example is to demonstrate the incorporation of the neutral nitrogen acceptor into a ZnO thin film and the effect of the dopant on the electronic properties of the ZnO film.

Two 1500 Å films of ZnO, one (Sample 5A) undoped according to Example 1, and one (Sample 5B) Nitrogen-doped according to Example 2, were deposited on a fused silica substrate (GM electronics 63×63-040p). Electron Paramagnetic Resonance (EPR) spectroscopic measurements were made on a 4 mm wide strip cut from the center of the samples using a standard X-band Homodyne EPR spectrometer (Bruker ESP300E) operating at 9.30 GHz and standard cryogenic and auxiliary equipment, such as that described in *Electron Spin Resonance, 2nd Ed., A Comprehensive Treatise on Experimental Techniques*, C. P. Poole, Jr., John Wiley & Sons, New York (1983).

EPR spectra of both samples were collected at 5 K. The Nitrogen-doped sample exhibited an EPR signal that was not present in the undoped sample. This signal had a powder pattern line-shape best modeled using the spin-Hamiltonian of a spin=½ system with an axially symmetric g-matrix and an axially symmetric hyperfine interaction matrix A with a single nucleus with a nuclear spin I=1. A definition of this spin-Hamiltonian can be found, e.g., in J.-M. Spaeth, J. R. Niklas and R. H. Bartram, Structural Analysis of Point Defects in Solids, Springer-Verlag, (1992). The $^{14}$N isotope of nitrogen (99.635% abundance) has a nuclear spin of I=1.

The experimental parameters are $g_{\parallel}=1.994$, $g_{\perp}=1.959$, $A_{\parallel}=81.4$ MHz. The splitting due to $A_{\perp}$ cannot be resolved within the experimental line-width of the EPR spectrum at $g_{\perp}$. If we assume an isotropic EPR line-width, $A_{\perp}$ can be estimated to be smaller than 11 MHz. These spin-Hamiltonian parameters are very close to the ones of the EPR-active defect identified as the neutral nitrogen acceptor in ZnO single crystals ($g_{\parallel}=1.9948$, $g_{\perp}=1.963$, $A_{\parallel}=81.3$ MHz, $A_{\perp}=9.5$ MHz). W. E. Carlos, E. R. Glaser, and D. C. Look, *Physica* B 308-310, 976 (2001); N. Y. Garces, N. C. Giles, L. E. Halliburton, G. Cantwell, D. B. Eason, D. C. Reynolds and D. C. Look, *Appl. Phys. Lett.* 80, 1334 (2002).

Figure 26:
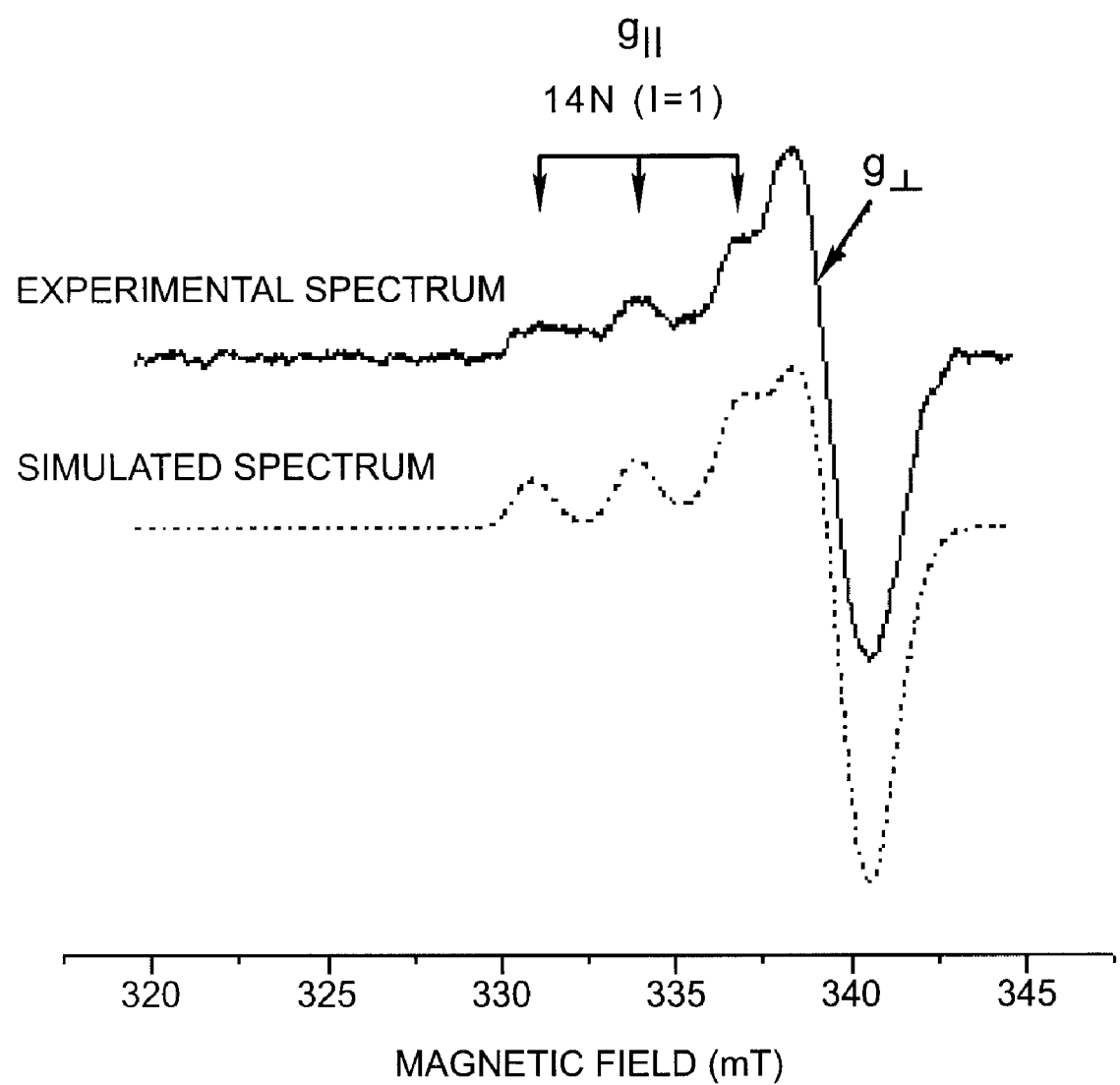
FIG. 26 shows, for Example 5 below, a typical EPR spectrum of the doped sample (solid line) and a calculated EPR line-shape using the given parameters of the spin-Hamiltonian.

FIG. 26 shows a typical EPR spectrum of the doped sample (solid line) and a calculated EPR line-shape (dotted line) using the program WINEPR (Bruker) and the aforementioned parameters of the spin-Hamiltonian.

The spectral line-shape of the EPR spectrum of the nitrogen acceptor is dependent on the orientation of the sample with respect to the magnetic field axis. The 3-line feature at $g_{\parallel}$ disappears when the magnetic field is perpendicular to the sample plane. This is evidence that the ZnO film grows with a preferred crystalline orientation that is perpendicular to the c-axis of the ZnO wurtzite lattice. X-ray diffraction measurements confirm a ZnO film with a predominant (100) orientation.

The EPR measurements provided detailed structural information about the microscopic environment of the dopant ion, and, in the example of the 1500 Å thin film, showed an incorporation of about $4\times10^{18}$/cm$^3$ of nitrogen acceptors. The effect of the dopant on the electronic properties of the ZnO films can be probed by monitoring the EPR signal of the shallow donors states (CESR). See R. J. Kokes, J. Phys. Chem. 66, 99 (1962); Ü. Özgür, Ya. I. Alivov, C. Liu, A. Teke, M. A. Reshchikov, S. Doan, V. Avrutin, S.-J. Cho, and H. Morkoç, J. Appl. Phys. 98 041301 (2001). These shallow donors states are thought to be due to intrinsic defects or impurities. They give rise to an EPR signal at g=1.96 (independent of the chemical nature of the donor) and are responsible for the n-conductivity of nominally undoped ZnO.

Figure 27:
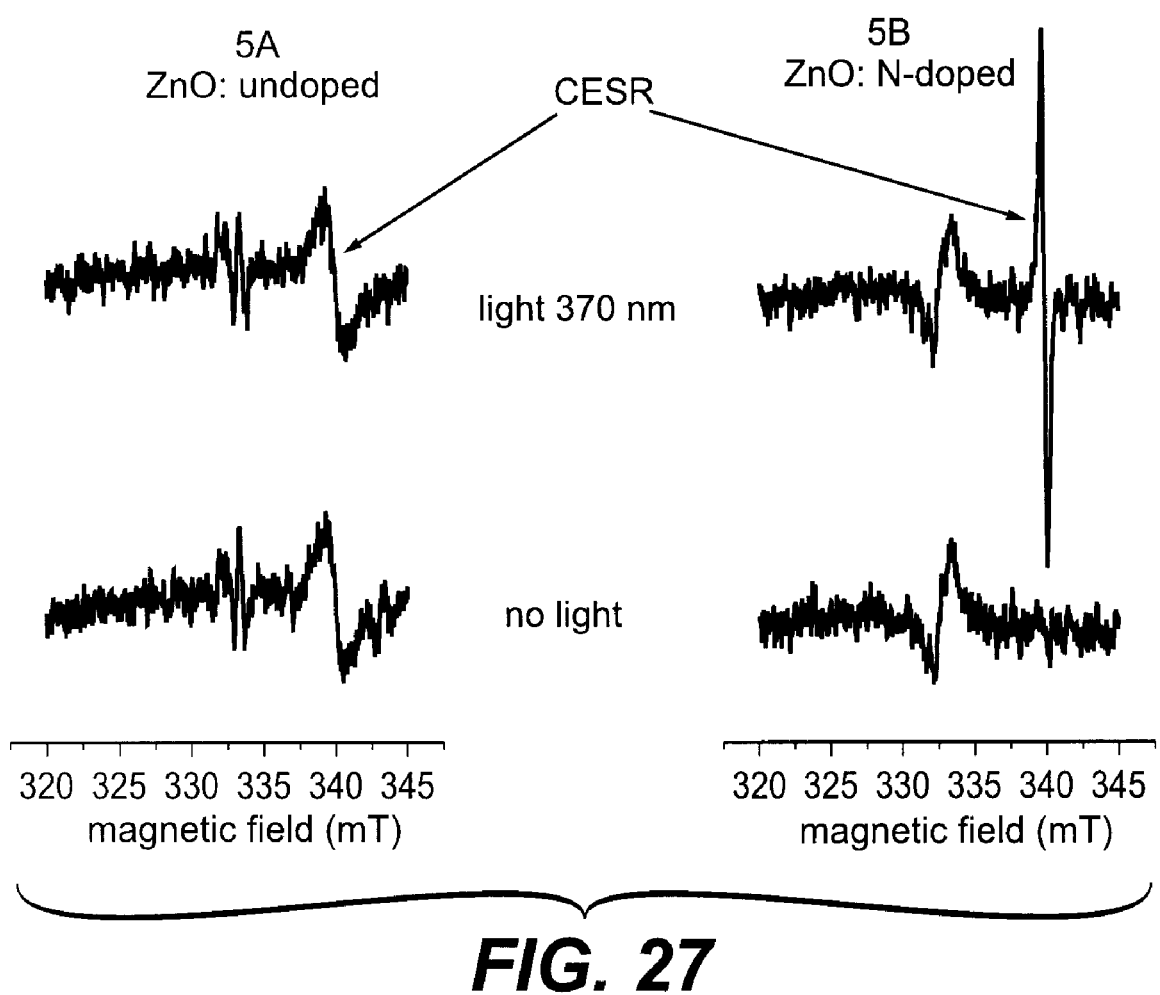
FIG. 27 shows, for Example 5, a comparison of EPR spectra of an undoped and nitrogen-doped thin film of ZnO.

FIG. 27 shows EPR spectra of an undoped (5A) and nitrogen-doped (5B) thin film of ZnO at T=77 K.

The feature marked CESR is due to intrinsic shallow donors in the ZnO thin film. In the absence of illumination this signal is present only in the undoped ZnO sample. In the nitrogen-doped sample it appears only under band-gap excitation with light of sufficiently short wavelength. These observations are consistent with the function of the dopant as a compensating acceptor that de-populates the shallow acceptor states. In the doped sample, these empty states can be transiently populated at 77 K by band-gap illumination. Since it is these states that lead to intrinsic conduction of ZnO thin films, we can also observe the effect of the dopant as an increase in the resistivity of the doped ZnO film.

Resistivity measurements were carried out on a Lucas SIG-NATONE QuadPro 4-point probe station. Measured resistivity values for the undoped sample and for the Nitrogen-doped sample, both having 1500 Å thickness, are 1.2 ohm*cm and 60000 ohm*cm, respectively.

PARTS LIST 1 continuous supply of gaseous materials for system
2 first channel flow of first molecular precursor over channel are of substrate
3 relative movement of substrate and multi-channel flows
4 second channel flow with inert gas over channel area
5 relative movement of substrate and multi-channel flows
6 third channel flow of second molecular precursor over channel area
7 relative movement of substrate and multi-channel flows
8 fourth channel flow with inert gas over channel area
9 relative movement of substrate and multi-channel flow
10 deposition device
11 multiple channel flow in parallel
12 output channel
14, 16, 18 gas inlet port
15 sequence
20 substrate
22 partition
24 gas output port
26 exhaust port
28a, 28b, 28c gas supply
30 actuator
32 supply line
36 output face
38 redirecting plate
40 aperture
42 partition plate
44 delivery plate
46a, 46b, 46c duct
48 redirecting chamber
50 chamber
52 transport motor
Parts List-continued 54 transport subsystem
56 control logic processor
58 baffle
60 Atomic Layer Deposition (ALD) process
62 web conveyor
64 deposition device transport
66 web substrate
70 Atomic Layer Deposition (ALD) process
72 diffusion layer
74 substrate support
81 nitrogen gas flow
82, 83, 84 gas bubblers
85, 86, 87, 88, 89, 91, 94 flow meters
90 air flow
92 metal precursor flow
93 oxidizer-containing flow
95 nitrogen purge flow
96 gap
97 example substrate
98 arrow
100 transistor
102 LCD pixel
104 transistor/pixel cell
106 column or data line
108 row or control line
120 source electrode
128 substrate
130 drain electrode
144 gate electrode
156 gate dielectric
170 semiconductor
D distance
F1, F2, F3, F4, $F_I$, $F_O$, $F_M$, $F_E$ gas flow
H height
I inert gaseous material
L channel length
M second reactant gaseous material
O first reactant gaseous material
R arrow
W channel width

The invention claimed is:

1. A process of making an n-type zinc-oxide-based thin film semiconductor, for use in a transistor by depositing a thin film material on a substrate, comprising:
   simultaneously directing a series of gas flows along elongated substantially parallel channels, and wherein the series of gas flows comprises, in order, a first reactive gaseous material, an inert purge gas, and a second reactive gaseous material, optionally repeated a plurality of times, wherein the first reactive gaseous material is capable of reacting with a substrate surface treated with the second reactive gaseous material to form the n-type zinc-oxide-based thin film semiconductor, wherein the first reactive gaseous material is a volatile organo-zinc precursor compound comprising both zinc and organic groups;
   introducing a volatile acceptor dopant precursor into the first reactive gaseous material, the second reactive gaseous material, the inert purge gas, or an additional gas flow of a supplemental gaseous material;
   wherein the process is carried out substantially at or above atmospheric pressure, and wherein the temperature of the substrate during deposition is under 250° C., whereby the volatile acceptor dopant precursor reacts and is incorporated as an acceptor dopant in the n-type zinc-oxide-based thin film semiconductor; and
   supplying the one or more of the first and second reactive gaseous materials and the inert purge gas, to the substrate surface by a deposition device having a face, in order to provide a pressure that creates a gas bearing delivery head in the deposition device, thereby maintaining a separation of the substrate surface from the face of the deposition device of 0.3 mm or less.

2. The process of claim 1 wherein the incorporated acceptor dopant provides an increase in on-off ratio of by a factor of at least 10.

3. The process of claim 2 wherein the on-off ratio of the n-type zinc-oxide-based thin film semiconductor without the incorporated acceptor dopant is less than $1.0 \times 10^6$.

4. The process of claim 2 wherein the presence of the incorporated acceptor dopant also provides an increase in mobility of at least 50 percent.

5. The process of claim 1 wherein the incorporated acceptor dopant introduces an energy level within the band-gap of the n-type zinc-oxide-based thin film semiconductor that is below the energy level of shallow donors and is able to accept an electron.

6. The process of claim 1 wherein the incorporated acceptor dopant has fewer valence electrons than the atom it replaces, whether a Group (V) element substituting for oxygen or a Group (I) or (IB) element substituting for zinc.

7. The process of claim 1 wherein the presence of the incorporated acceptor dopant provides an increase in resistivity of at least $10^2$.

8. The process of claim 6 wherein the resistivity of the n-type zinc-oxide-based thin film semiconductor without the incorporated acceptor dopant is less than 500 ohm*cm.

9. The process of claim 1 wherein a given area of the substrate is exposed to a gas flow in a channel for less than 100 milliseconds.

10. The process of claim 1 wherein relative movement of the substrate to a deposition device is at a speed at least 0.1 cm/sec.

11. The process of claim 1 wherein the series of gas flows are at least1 cm/sec.

12. The process of claim 1 wherein the temperature of the substrate during deposition is under 200° C.

13. The process of claim 1 wherein the second reactive gaseous material is a non-metallic compound.

14. The process of claim 1 wherein the volatile organo-zinc precursor compound can be vaporized at a temperature under 300° C. at atmospheric pressure.

15. The process of claim 1 wherein the volatile acceptor dopant precursor comprises an element selected from the group consisting of N, P, As, Li, Na, K, Cu, Ag, or mixtures thereof.

16. The process of claim 1 wherein the volatile acceptor dopant precursor comprises a Group V element.

17. The process of claim 1 wherein the volatile acceptor dopant precursor comprises nitrogen.

18. The process of claim 1 wherein the volatile acceptor dopant precursor comprises nitrogen in the form of NO, $N_2O$, $NO_2$, or ammonia.

19. The process of claim 1 wherein the substrate or a support for the substrate comprises a moving web.

20. The process of claim 1 wherein the process is in unsealed relationship to ambient atmosphere.

21. A process of making an n-type zinc-oxide-based thin film semiconductor, for use in a transistor by depositing a thin film material on a substrate, comprising:
   simultaneously directing a series of gas flows along elongated substantially parallel channels, and wherein the series of gas flows comprises, in order, a first reactive gaseous material, an inert purge gas, and a second reactive gaseous material, optionally repeated a plurality of times, wherein the first reactive gaseous material is capable of reacting with a substrate surface treated with the second reactive gaseous material to form the n-type zinc-oxide-based thin film semiconductor, wherein the first reactive gaseous materials is a volatile organo-zinc precursor compound comprising both zinc and organic groups;

introducing a nitrogen-containing volatile acceptor dopant precursor that reacts with the volatile organo-zinc precursor compound into the second reactive gaseous material or into an additional gas flow of a supplemental gaseous material, which additional gas flow is separate from the first reactive gaseous material and separate from the inert purge gas; and wherein the process is carried out substantially at or above atmospheric pressure, and wherein temperature of the substrate during deposition is under 250° C., whereby the nitrogen-containing volatile acceptor dopant precursor reacts and nitrogen dopant is incorporated as an acceptor dopant in the n-type zinc-oxide-based thin film semiconductor; and supplying the one or more of the first and second reactive gaseous materials and the inert purge gas, to the substrate surface by a deposition device having a face, in order to provide a pressure that creates a gas to create an air bearing delivery head in the deposition device, thereby maintaining a separation of the substrate surface from the face of the deposition device of 0.3 mm or less.

22. The process of claim 21 wherein presence of the incorporated nitrogen dopant provides an increase in on-off ratio of by a factor of at least 10 and provides an increase in mobility of at least 50 percent.

* * * * *